(12) United States Patent
Ohuchi et al.

(10) Patent No.: US 9,112,154 B2
(45) Date of Patent: Aug. 18, 2015

(54) METAPHENYLENE POLYMER COMPOUND AND LIGHT EMITTING DEVICE USING THE SAME

(75) Inventors: Kazuei Ohuchi, Tsukuba (JP); Masayuki Soga, Kita-ku (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 338 days.

(21) Appl. No.: 13/145,037

(22) PCT Filed: Jan. 19, 2010

(86) PCT No.: PCT/JP2010/050865
§ 371 (c)(1),
(2), (4) Date: Jul. 18, 2011

(87) PCT Pub. No.: WO2010/084977
PCT Pub. Date: Jul. 29, 2010

(65) Prior Publication Data
US 2011/0272686 A1 Nov. 10, 2011

(30) Foreign Application Priority Data
Jan. 20, 2009 (JP) ................................. 2009-009606

(51) Int. Cl.
| | |
|---|---|
| H01L 51/54 | (2006.01) |
| C07C 211/54 | (2006.01) |
| C08G 61/10 | (2006.01) |
| C08G 73/06 | (2006.01) |
| C08L 79/02 | (2006.01) |
| C09K 11/06 | (2006.01) |
| C08L 65/02 | (2006.01) |
| C08L 79/04 | (2006.01) |
| C07C 15/14 | (2006.01) |
| H01L 51/00 | (2006.01) |
| C08G 61/12 | (2006.01) |
| H05B 33/14 | (2006.01) |
| H01L 51/50 | (2006.01) |

(52) U.S. Cl.
CPC ............ *H01L 51/0035* (2013.01); *C08G 61/10* (2013.01); *C08G 61/12* (2013.01); *C09K 11/06* (2013.01); *H01L 51/0043* (2013.01); *H05B 33/14* (2013.01); *C08G 2261/312* (2013.01); *C08G 2261/3142* (2013.01); *C08G 2261/3162* (2013.01); *C08G 2261/3221* (2013.01); *C09K 2211/1007* (2013.01); *C09K 2211/1037* (2013.01); *H01L 51/0039* (2013.01); *H01L 51/5016* (2013.01)

(58) Field of Classification Search
None
See application file for complete search history.

(56) References Cited

U.S. PATENT DOCUMENTS

| | | | |
|---|---|---|---|
| 5,886,130 A | 3/1999 | Trimmer et al. | |
| 5,980,781 A | 11/1999 | Doi et al. | |
| 7,166,689 B2 * | 1/2007 | Sagisaka et al. | ............... 528/422 |
| 2002/0001734 A1 | 1/2002 | Yoshikawa et al. | |
| 2003/0094595 A1 * | 5/2003 | Son et al. | ................. 252/301.16 |
| 2003/0170490 A1 * | 9/2003 | Hu et al. | ......................... 428/690 |
| 2006/0063026 A1 * | 3/2006 | Holmes et al. | ................ 428/690 |
| 2008/0169756 A1 | 7/2008 | Son et al. | |
| 2008/0211391 A1 * | 9/2008 | Burn et al. | ..................... 313/504 |
| 2008/0254320 A1 * | 10/2008 | Akino et al. | ................... 428/704 |
| 2009/0153021 A1 | 6/2009 | Jen et al. | |
| 2010/0033086 A1 * | 2/2010 | Mikami et al. | ................. 313/504 |

FOREIGN PATENT DOCUMENTS

| | | |
|---|---|---|
| EP | 1935943 A1 | 6/2008 |
| GB | 2382080 A | 5/2003 |
| JP | H07278276 A | 10/1995 |
| JP | 09-309945 A | 12/1997 |
| JP | 10-316738 A | 12/1998 |
| JP | 11-515040 A | 12/1999 |
| JP | 2002-170683 A | 6/2002 |
| JP | 2003-183363 A | 7/2003 |
| JP | 2003-212977 A | 7/2003 |
| JP | 2004-031210 A | 1/2004 |
| JP | 2007-154202 A | 6/2007 |
| JP | 2008-195930 A | 8/2008 |
| JP | 2012-131993 A | 7/2012 |
| WO | 97/11099 A2 | 3/1997 |
| WO | 2007/133632 A2 | 11/2007 |
| WO | WO 2007133632 A2 * | 11/2007 |
| WO | WO 2008111658 A1 * | 9/2008 |

OTHER PUBLICATIONS

Dippy, J. F. J. "The Rhythmic Crystallization of Melts" J. Phys. Chem. 1932, 36, 2354-2361. Date of publication: Jan. 1931.*

(Continued)

*Primary Examiner* — Andrew K Bohaty
(74) *Attorney, Agent, or Firm* — Sughrue Mion, PLLC

(57) ABSTRACT

A polymer compound comprising a constitutional unit represented by the following formula (2) and a constitutional unit represented by the following formula (1),

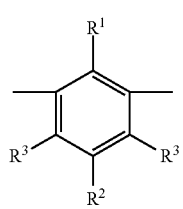

(1)

wherein $R^1$ represents an alkyl group or the like, and $R^2$ and $R^3$ each independently represent a hydrogen atom or the like, —$Ar^1$— (2)

wherein $Ar^1$ represents an arylene group or the like. A hydrogen atom in the group represented by $Ar^1$ may be substituted by an alkyl group, aryl group or the like.

24 Claims, No Drawings

(56) References Cited

OTHER PUBLICATIONS

Shijie Ren, et al., "Synthesis and Optical and Electrochemical Properties of New n-Conjugated 1,3,5-Triazine-Containing Polymers", Journal of polymer Science, Part A: Polymer Chemistry, 2005, vol. 43, No. 24, pp. 6554-6561.
Supplementary European Search Report issued Jan. 2, 2013 in European Patent Application No. 10733583.8 to Sumitomo Chemical Co., Ltd.
First Office Action issued Sep. 29, 2012 in Chinese Patent Application No. 201080004785.X with partial English translation.
Second Office Action issued Jun. 25, 2013 in Chinese Patent Application 201080004785.X with partial English translation.
Notice of Reasons for Rejection issued Jul. 2, 2013 in Japanese Patent Application No. 2010-007952 with English translation.
John Frederick James Dippy, "The Rhythmic Crystallisation of Melts", J. Phys. Chem., 1932, 36, pp. 2354-2361.
International Preliminary Report on Patentability and Written Opinion mailed Aug. 18, 2011 in International Application No. PCT/JP2010/050865.
Notification of Reasons for Rejection issued May 27, 2014 in Japanese Patent Application No. 2010-007952 with translation.
Examination Report issued Sep. 24, 2013 in European Patent Application No. 10 733 583.8.
Office Action issued Mar. 28, 2014 in Taiwanese Patent Application No. 099101323 with English translation.

* cited by examiner

METAPHENYLENE POLYMER COMPOUND AND LIGHT EMITTING DEVICE USING THE SAME

TECHNICAL FIELD

The present invention relates to a metaphenylene polymer compound and a light emitting device using the same.

BACKGROUND ART

As a light emitting material to be used in a light emitting layer of a light emitting device, a composition is known obtained by allowing a host material to be doped with a phosphorescence emitting compound showing light emission from the triplet excited state as a dopant.

As a basic property of a host material, it is important that the lowest triplet excitation energy (hereinafter, referred to as "T1 energy") of the host material is high. As a host material having a relatively high T1 energy for a red phosphorescence emitting compound, there is suggested a copolymer (polymer compound) composed of a fluorene-2,7-diyl group and a 1,3-phenylene group having a specific substituent only at 5-position (International Publication WO 2007/133632).

DISCLOSURE OF THE INVENTION

When the above-described polymer compound is used as a host material for a phosphorescence emitting compound showing an emission color of a shorter wavelength than red, however, the maximum light emission efficiency of the resultant light emitting device is not sufficient.

The present invention has an object of providing a polymer compound which is useful for fabrication of a light emitting device showing excellent maximum light emission efficiency.

The present invention provides, in a first aspect, a polymer compound comprising at least one constitutional unit selected from the group consisting of a constitutional unit represented by the following formula (2) and a constitutional unit represented by the following formula (3), and a constitutional unit represented by the following formula (1):

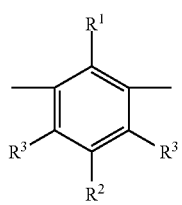

(1)

wherein $R^1$ represents an alkyl group, an aryl group, a monovalent aromatic heterocyclic group, an aralkyl group or a substituted amino group, $R^2$ and $R^3$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; two $R^3$s may be the same or different, $$—Ar^1—\quad(2)$$

wherein $Ar^1$ represents an arylene group, a divalent aromatic heterocyclic group, or a divalent group formed by direct bonding of the same or different two or more groups selected from the group consisting of arylene groups and divalent aromatic heterocyclic groups, provided that $Ar^1$ is not a group represented by the formula (1); any hydrogen atom in the group represented by $Ar^1$ may be substituted by an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group,

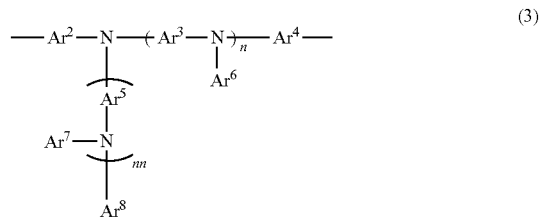

(3)

wherein $Ar^2$, $Ar^3$, $Ar^4$ and $Ar^5$ each independently represent an arylene group, a divalent aromatic heterocyclic group, or a divalent group formed by direct bonding of the same or different two or more groups selected from the group consisting of arylene groups and divalent aromatic heterocyclic groups; $Ar^6$, $Ar^7$ and $Ar^8$ each independently represent an aryl group or a monovalent aromatic heterocyclic group; any hydrogen atom in each of the groups represented by $Ar^2$, $Ar^3$, $Ar^4$, $Ar^5$, $Ar^6$, $Ar^7$ and $Ar^8$ may be substituted by an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; the groups represented by $Ar^5$, $Ar^6$, $Ar^7$ and $Ar^8$ may be bonded directly or bonded via —O—, —S—, —C(=O)—, —C(=O)—O—, —N($R^4$)—, —C(=O)—N($R^4$)— or —C($R^4$)$_2$— to the groups represented by $Ar^2$, $Ar^3$, $Ar^4$, $Ar^5$, $Ar^7$ and $Ar^8$ linked to nitrogen atoms to which $Ar^5$, $Ar^6$, $Ar^7$ and $Ar^8$ are linked, respectively, to form 5- to 7-membered rings; n and nn are each independently 0 or 1. $R^4$ represents an alkyl group, an aryl group, a monovalent aromatic heterocyclic group or an aralkyl group.

The present invention provides, in a second aspect, a composition comprising the above-described polymer compound and at least one material selected from the group consisting of a hole transporting material, an electron transporting material and a light emitting material.

The present invention provides, in a third aspect, a solution comprising the above-described polymer compound and a solvent.

The present invention provides, in a fourth aspect, a film comprising the above-described polymer compound.

The present invention provides, in a fifth aspect, a light emitting device having electrodes consisting of an anode and a cathode, and an organic layer containing the above-described polymer compound disposed between the electrodes.

The present invention provides, in a sixth aspect, a planar light source and a display each comprising the above-described light emitting device.

The present invention provides, in a seventh aspect, a compound represented by the following formula (1a):

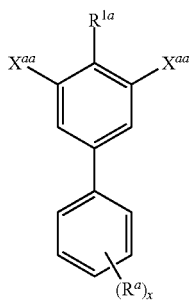

(1a)

wherein $R^{1a}$ represents an alkyl group; $R^a$ represents an alkyl group, an optionally substituted aryl group, an optionally substituted monovalent aromatic heterocyclic group, a substituted amino group, a substituted carbonyl group, a substituted carboxyl group or a cyano group; x represents an integer of 0 to 5; when there are a plurality of $R^a$s, these may be the same or different; $X^{aa}$ represents a bromine atom, an iodine atom, a chlorine atom, —O—S(=O)$_2$R$^{20}$, —B(OR$^{21}$)$_2$, —BF$_4^-$Q$^1$, —Sn(R$^{22}$)$_3$, —MgY$^1$ or ZnY$^1$; two $X^{aa}$s may be the same or different; $R^{20}$ represents an alkyl group, or an aryl group optionally substituted by an alkyl group, an alkoxy group, a nitro group, a fluorine atom or a cyano group; $R^{21}$ and $R^{22}$ each independently represent a hydrogen atom or an alkyl group; two $R^{21}$s may be the same or different and may together form a ring; three $R^{22}$s may be the same or different and may together form a ring; $Q^1$ represents a monovalent cation of lithium, sodium, potassium, rubidium or cesium; $Y^1$ represents a bromine atom, an iodine atom or a chlorine atom.

The present invention provides, in an eighth aspect, a compound represented by the following formula (1c):

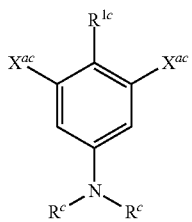

(1c)

wherein $R^{1c}$ represents an alkyl group; $R^c$ represents an optionally substituted aryl group or an optionally substituted monovalent aromatic heterocyclic group; two $R^c$s may be the same or different and may together form a ring; $X^{ac}$ represents a bromine atom, an iodine atom, a chlorine atom, —O—S(=O)$_2$R$^{20}$, —B(OR$^{21}$)$_2$. —BF$_4^-$Q$^1$, —Sn(R$^{22}$)$_3$, —MgY$^1$ or —ZnY$^1$; two $X^{ac}$s may be the same or different; $R^{20}$, $R^{21}$, $R^{22}$, $Q^1$ and $Y^1$ have the same meaning as described above.

MODES FOR CARRYING OUT THE INVENTION

The present invention will be illustrated in detail below.

In the present specification, "constitutional unit" denotes one or more units present in a polymer compound, and preferably is present as "repeating unit" in a polymer compound (namely, two or more units present in a polymer compound). "n-valent aromatic heterocyclic group" (n is 1 or 2) means an atomic group obtained by removing n hydrogen atoms from a heterocyclic group showing an aromatic property and includes also groups having a condensed ring. "Heterocyclic compound" includes organic compounds having a cyclic structure in which atoms constituting the ring include not only a carbon atom but also a hetero atom such as an oxygen atom, a sulfur atom, a nitrogen atom, a phosphorus atom, a boron atom, a silicon atom and the like. "Aromatic heterocyclic compound" includes heterocyclic compounds containing a hetero atom such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzosilole, dibenzophosphole and the like, the heterocycle itself showing an aromatic property; and compounds of which heterocycle itself containing a hetero atom shows no aromatic property but to which heterocycle an aromatic ring is condensed, such as phenoxazine, phenothiazine, dibenzoborole, dibenzosilole, benzopyran and the like.

In the present specification, Me represents a methyl group, Et represents an ethyl group, i-Pr represents an isopropyl group, n-Bu represents a n-butyl group, and tBu and t-Bu represent a tert-butyl group.

<Polymer Compound>
—Constitutional Unit Represented by the Formula (1)—

The polymer compound of the present invention comprises a constitutional unit represented by the formula (1)

Explanation of Substituent

The alkyl group represented by $R^1$, $R^2$ and $R^3$ in the formula (1) is linear, branched or cyclic and has a carbon atom number of usually 1 to 20. The alkyl group includes a methyl group, an ethyl group, a propyl group, an isopropyl group, a butyl group, a sec-butyl group, an isobutyl group, a t-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a dodecyl group, a trifluoromethyl group, a pentafluoroethyl group, a perfluorobutyl group, a perfluorohexyl group, a perfluorooctyl group and the like.

The aryl group represented by $R^1$, $R^2$ and $R^3$ in the formula (1) is an atomic group obtained by removing one hydrogen atom from an aromatic hydrocarbon, and includes those having a condensed ring. The aryl group has a carbon atom number of usually 6 to 60, preferably 6 to 48, more preferably 6 to 20, further preferably 6 to 14. This carbon atom number does not include the carbon atom number of the substituent. A hydrogen atom in the aryl group may be substituted by an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group.

The aryl group is preferably a substituted or unsubstituted phenyl group. The substituent carried on the phenyl group is preferably an alkyl group, an aryl group, a monovalent aromatic heterocyclic group, an alkoxy group, an aryloxy group, an aralkyl group or a substituted amino group, further preferably an alkyl group, an aryl group or a monovalent aromatic heterocyclic group.

The monovalent aromatic heterocyclic group represented by $R^1$, $R^2$ and $R^3$ in the formula (1) has a carbon atom number of usually 3 to 60, preferably 3 to 20. This carbon atom number does not include the carbon atom number of the substituent. The monovalent aromatic heterocyclic group includes a 2-oxadiazole group, a 2-thiadiazole group, a 2-thiazole group, a 2-oxazole group, a 2-thienyl group, a 2-pyrrolyl group, a 2-furyl group, a 2-pyridyl group, a 3-pyridyl group, a 4-pyridyl group, a 2-pyrazyl group, a 2-pyrimidyl group, a 2-triazyl group, a 3-pyridazyl group, a 3-carbazolyl group, a 2-phenoxazinyl group, a 3-phenoxazinyl group, a 2-phenothiazinyl group, a 3-phenothiazinyl group and the like. A hydrogen atom in the monovalent aromatic heterocyclic group may be substituted by an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group.

The monovalent aromatic heterocyclic group is preferably a substituted or unsubstituted 2-pyridyl group, a substituted or unsubstituted 3-pyridyl group, a substituted or unsubstituted 4-pyridyl group, a substituted or unsubstituted 2-pyrazyl group, a substituted or unsubstituted 2-pyrimidyl group, a substituted or unsubstituted 2-triazyl group, or a substituted or unsubstituted 3-pyridazyl group. The substituent on the monovalent aromatic heterocyclic group is preferably an alkyl group, an aryl group, or a monovalent aromatic heterocyclic group.

The alkoxy group represented by $R^2$ and $R^3$ in the formula (1) is linear, branched or cyclic and has a carbon atom number of usually 1 to 20. The above-described alkoxy group includes a methoxy group, an ethoxy group, a propyloxy group, an isopropyloxy group, a butoxy group, a sec-butoxy group, an isobutoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a trifluoromethoxy group, a pentafluoroethoxy group, a perfluorobutoxy group, a perfluorohexyloxy group, a perfluorooctyloxy group, a methoxymethyloxy group, a 2-methoxyethyloxy group, a 2-ethoxyethyloxy group and the like.

The aryloxy group represented by $R^2$ and $R^3$ in the formula (1) has a carbon atom number of usually 6 to 60. The aryloxy group includes a phenoxy group, a $C_1$ to $C_{12}$ alkoxyphenoxy group ("$C_1$ to $C_{12}$ alkoxy" means that an alkoxy portion has a carbon atom number of 1 to 12, the same shall apply hereinafter), a $C_1$ to $C_{12}$ alkylphenoxy group ("$C_1$ to $C_{12}$ alkyl" means that an alkyl portion has a carbon atom number of 1 to 12, the same shall apply hereinafter), a 1-naphthyloxy group, a 2-naphthyloxy group, a pentafluorophenyloxy group and the like.

The aralkyl group represented by $R^1$, $R^2$ and $R^3$ in the formula (1) has a carbon atom number of usually 7 to 60. The above-described aralkyl group includes a phenyl $C_1$ to $C_{12}$ alkyl group, a $C_1$ to $C_{12}$ alkoxyphenyl $C_1$ to $C_{12}$ alkyl group, a $C_1$ to $C_{12}$ alkylphenyl $C_1$ to $C_{12}$ alkyl group, and the like.

The arylalkoxy group represented by $R^2$ and $R^3$ in the formula (1) has a carbon atom number of usually 7 to 60. The arylalkoxy group includes a phenyl $C_1$ to $C_{12}$ alkoxy group, a $C_1$ to $C_{12}$ alkoxyphenyl $C_1$ to $C_{12}$ alkoxy group, a $C_1$ to $C_{12}$ alkylphenyl $C_1$ to $C_{12}$ alkoxy group, and the like.

The substituted amino group represented by $R^1$, $R^2$ and $R^3$ in the formula (1) has a carbon atom number of usually 2 to 60. The above-described substituted amino group includes amino groups substituted by an alkyl group, an aryl group, an aralkyl group or a monovalent aromatic heterocyclic group. The substituted amino group includes also those in which substituents of the amino group are bonded directly or via a carbon atom, an oxygen atom, a sulfur atom or the like to form a condensed ring. The substituted amino group is preferably a dialkyl-substituted amino group or a diaryl-substituted amino group, more preferably a dimethylamino group, a diethylamino group, a diphenylamino group, a di-4-tolylamino group, a di-4-t-butylphenylamino group, a bis(3,5-di-t-butylphenyl)amino group, a N-carbazolyl group, a N-phenoxazinyl group, a N-acridinyl group or a N-phenothiazinyl group.

The substituted carbonyl group represented by $R^2$ and $R^3$ in the formula (1) has a carbon atom number of usually 2 to 60. The above-described substituted carbonyl group includes carbonyl groups substituted by an alkyl group, an aryl group, an aralkyl group or a monovalent aromatic heterocyclic group, and preferable are an acetyl group, a butyryl group and a benzoyl group.

The substituted carboxyl group represented by $R^2$ and $R^3$ in the formula (1) has a carbon atom number of usually 2 to 60. The above-described substituted carboxyl group includes carboxyl groups substituted by an alkyl group, an aryl group, an aralkyl group or a monovalent aromatic heterocyclic group, and preferable are a methoxycarbonyl group, an ethoxycarbonyl group, a butoxycarbonyl group, a phenoxycarbonyl group and a benzyloxycarbonyl group.

The group represented by $R^1$ in the formula (1) is preferably an alkyl group, an aryl group or an aralkyl group, and from the standpoint of reactivity in polymerizing a monomer, more preferably an alkyl group, further preferably a methyl group, an ethyl group, a propyl group, a butyl group, a pentyl group or a hexyl group, particularly preferably a methyl group.

From the standpoint of a balance between the heat resistance of the polymer compound of the present invention and the solubility thereof in an organic solvent, the group represented by $R^2$ in the formula (1) is preferably a hydrogen atom, an alkyl group, an aryl group, a monovalent aromatic heterocyclic group, or a substituted amino group, more preferably a hydrogen atom; an alkyl group; an unsubstituted aryl group or an aryl group substituted by an alkyl group, an aryl group, a monovalent aromatic heterocyclic group or a substituted amino group; an unsubstituted monovalent aromatic heterocyclic group or a monovalent aromatic heterocyclic group substituted by an alkyl group, an aryl group or a monovalent aromatic heterocyclic; or a diaryl-substituted amino group, further preferably a hydrogen atom; an alkyl group; an unsubstituted aryl group or an aryl group substituted by an alkyl group or an aryl group, particularly preferably a hydrogen atom; an alkyl group; an unsubstituted phenyl group or a phenyl group substituted by an alkyl group or an aryl group.

From the standpoint of the driving voltage of a light emitting device obtained by using the polymer compound of the present invention, the group represented by $R^2$ in the formula (1) is preferably a hydrogen atom, an alkyl group, an aryl group, a monovalent aromatic heterocyclic group, or a substituted amino group, more preferably an unsubstituted aryl group or an aryl group substituted by an alkyl group, an aryl group, a monovalent aromatic heterocyclic group or a substituted amino group; an unsubstituted monovalent aromatic heterocyclic group or a monovalent aromatic heterocyclic group substituted by an alkyl group, an aryl group or a monovalent aromatic heterocyclic group; or a diaryl-substituted amino group, further preferably an aryl group substituted by a monovalent aromatic heterocyclic group or a substituted amino group; an unsubstituted monovalent aromatic heterocyclic group or a monovalent aromatic heterocyclic group substituted by an alkyl group, an aryl group or a monovalent aromatic heterocyclic group; or a diaryl-substituted amino group, particularly preferably a phenyl group substituted by a monovalent aromatic heterocyclic group or a substituted amino group; a pyridyl group substituted by an alkyl group, an aryl group or a monovalent aromatic heterocyclic group; a pyrazyl group substituted by an alkyl group, an aryl group or a monovalent aromatic heterocyclic group; a pyridazyl group substituted by an alkyl group, an aryl group or a monovalent aromatic heterocyclic group; a pyrimidyl group substituted by an alkyl group, an aryl group or a monovalent aromatic heterocyclic group; a 1,3,5-triazin-2-yl group substituted by an alkyl group, an aryl group or a monovalent aromatic heterocyclic group; a pyridyl group; or a diaryl-substituted amino group.

From the standpoint of reactivity in polymerizing a monomer, the group represented by $R^3$ in the formula (1) is preferably a hydrogen atom, an alkyl group, an aryl group, or a monovalent aromatic heterocyclic group, more preferably a hydrogen atom.

The constitutional unit represented by the formula (1) includes constitutional units represented by the following formulae 1-001 to 1-017, 1-101 to 1-113 and 1-201 to 1-208.

1-001
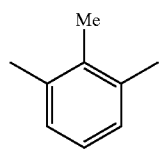

1-002
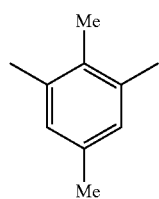

1-003
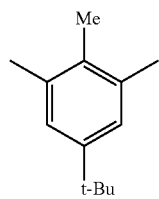

1-004
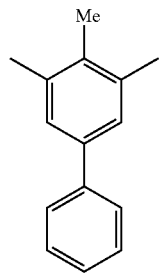

1-005
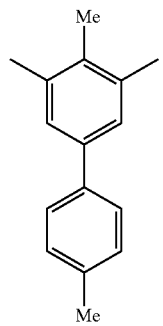

1-006
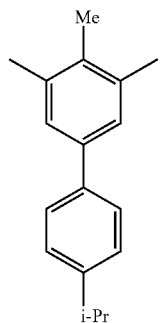

1-007
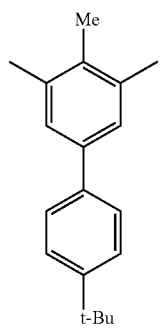

1-008
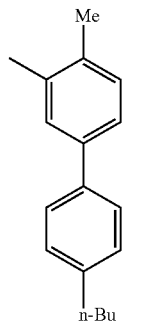

1-009
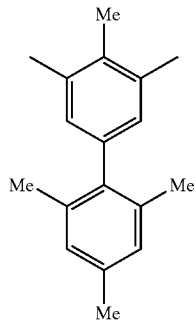

1-010
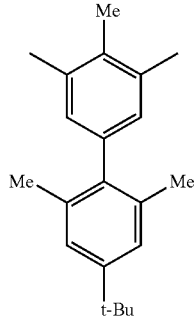

-continued
1-011 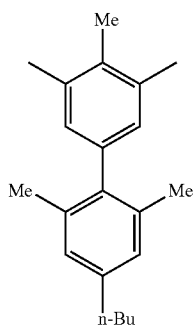
1-012 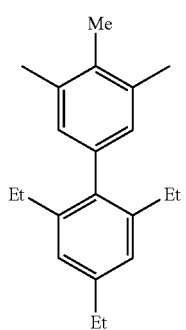
1-013 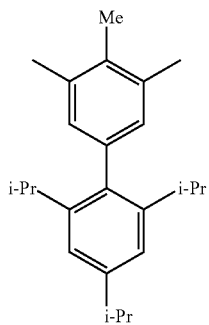
1-014 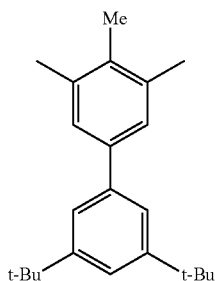
1-015 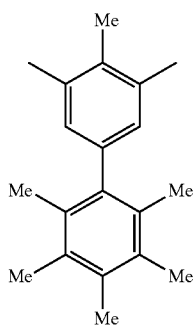
-continued
1-016 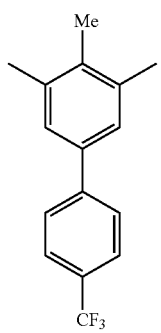
1-017 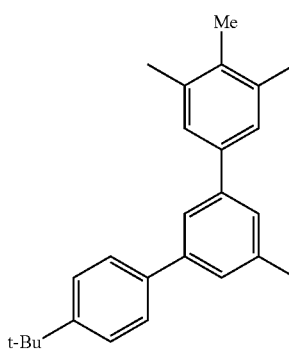
1-101 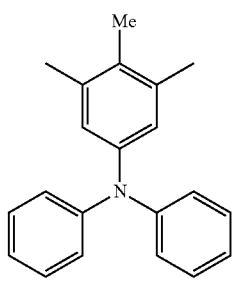
1-102 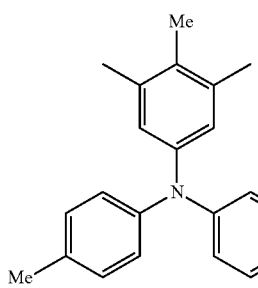
1-103 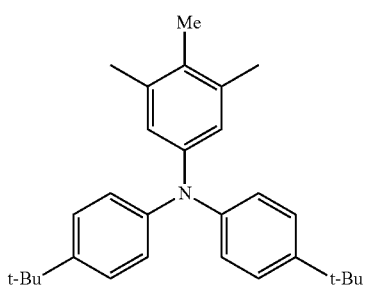

1-104
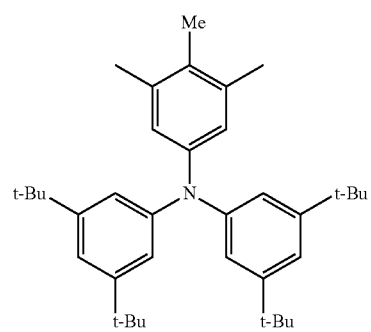
1-105
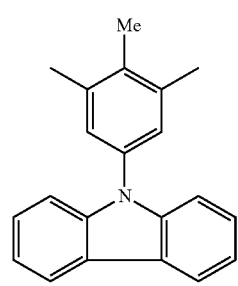
1-106
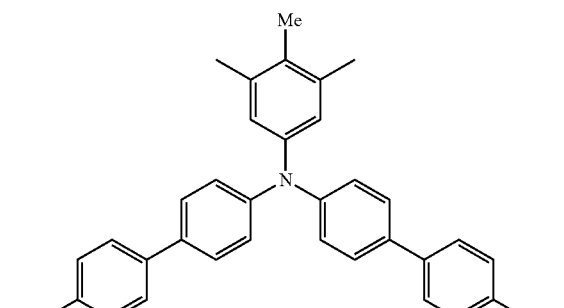
1-107
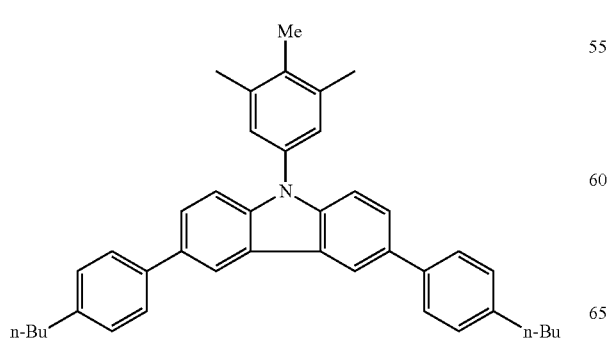
1-108
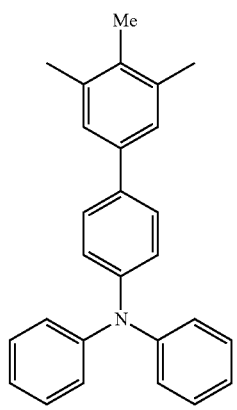
1-109
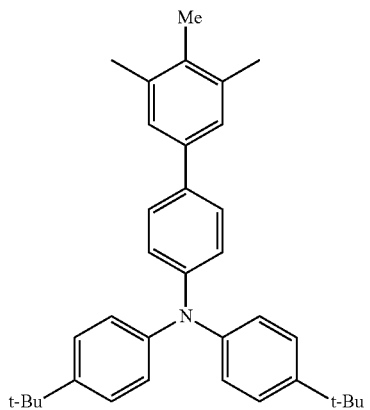
1-110
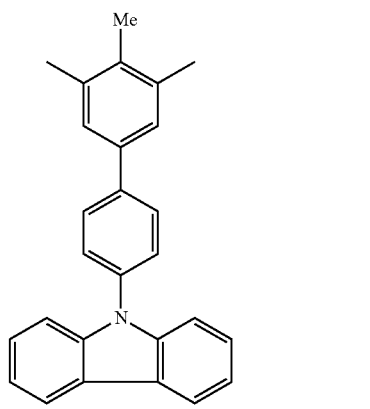
1-111
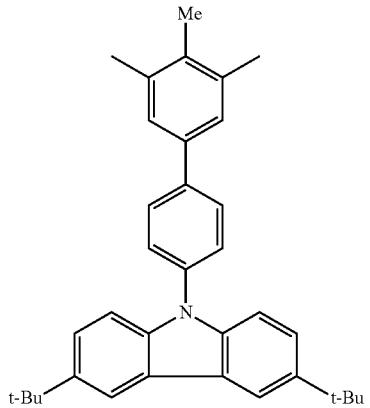

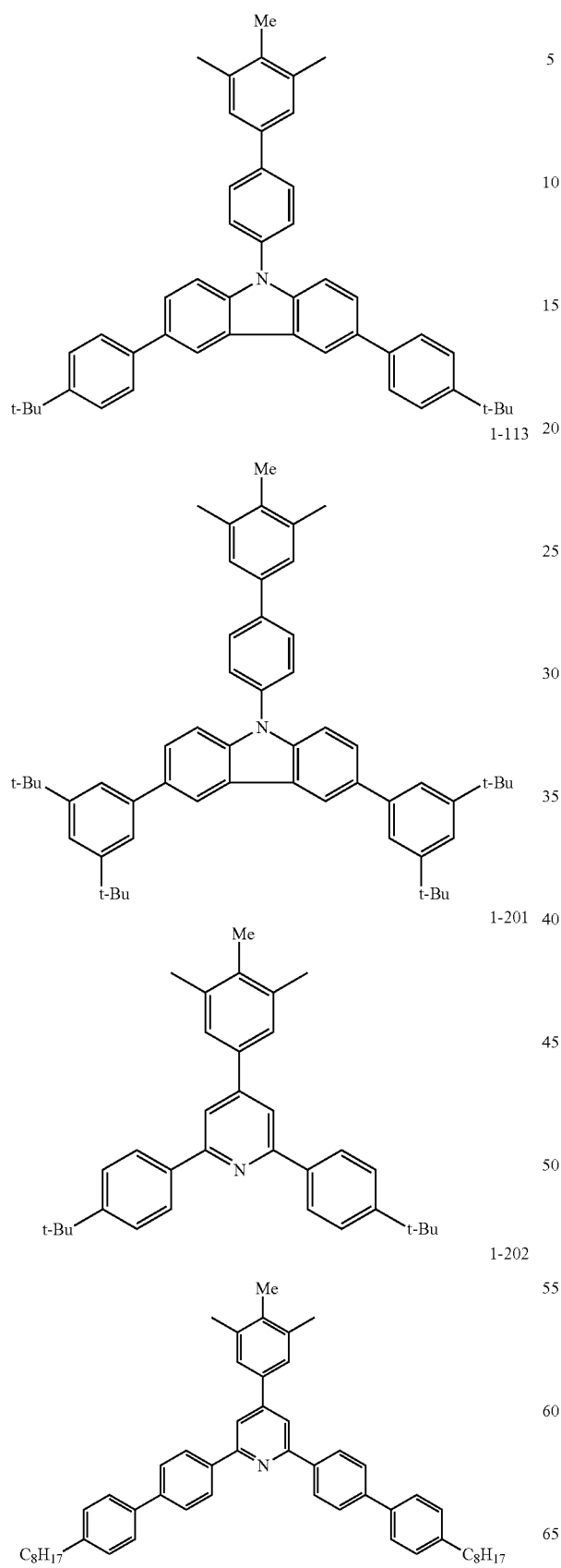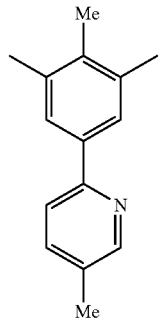

-continued

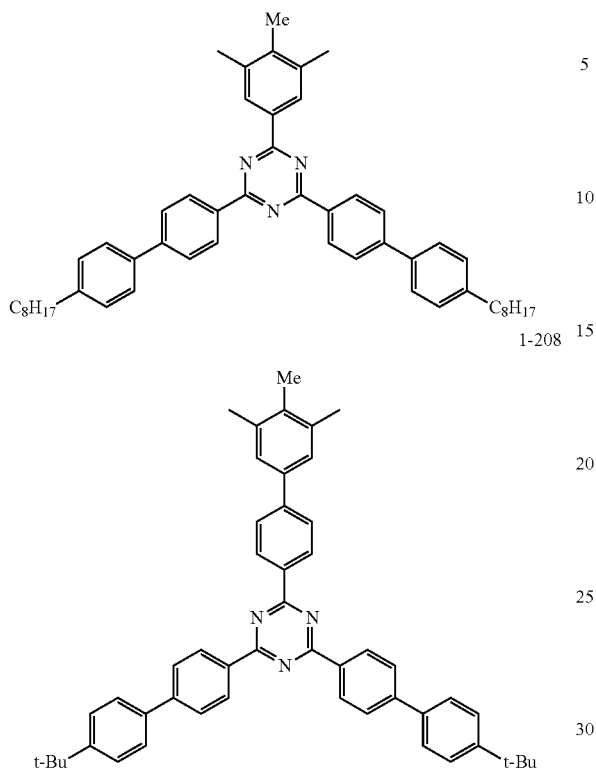

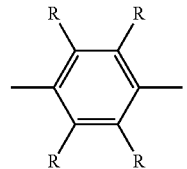
2-001

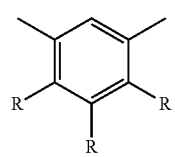
2-002

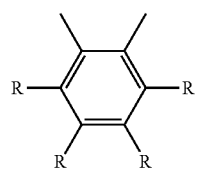
2-003

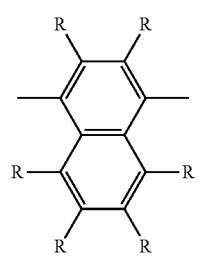
2-004

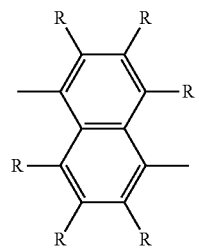
2-005

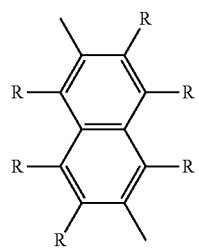
2-006

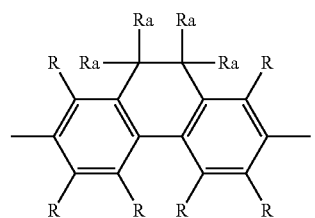
2-007

The constitutional unit represented by the formula (1) may be singly contained in the polymer compound of the present invention or two or more units represented by the formula (1) may be contained therein.

—Constitutional Unit Represented by the Formula (2)—

It is particularly preferable that the polymer compound of the present invention contains the constitutional unit represented by the formula (2).

The arylene group represented by $Ar^1$ in the formula (2) means an atomic group obtained by removing two hydrogen atoms from an aromatic hydrocarbon, and includes those having a condensed ring. The arylene group has a carbon atom number of usually 6 to 60, preferably 6 to 48, more preferably 6 to 30, further preferably 6 to 14. This carbon atom number does not include the carbon atom number of the substituent. The arylene group includes phenylene groups such as a 1,4-phenylene group (formula 2-001), a 1,3-phenylene group (formula 2-002), a 1,2-phenylene group (formula 2-003) and the like; naphthalenediyl groups such as a naphthalene-1,4-diyl group (formula 2-004), a naphthalene-1,5-diyl group (formula 2-005), a naphthalene-2,6-diyl group (formula (2-006) and the like; dihydrophenanthrenediyl groups such as a 4,5-dihydrophenanthrene-2,7-diyl group (formula 2-007) and the like; fluorenediyl groups such as a fluorine-3,6-diyl group (formula 2-008), a fluorene-2,7-diyl group (formula 2-009) and the like; etc. A hydrogen atom in these arylene groups may be substituted by an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group.

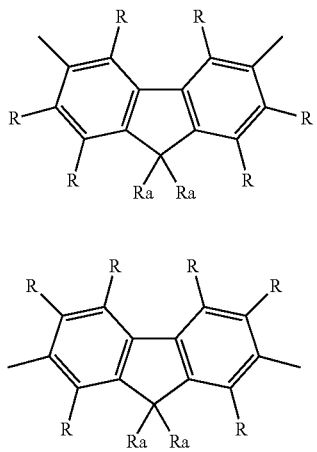

2-008

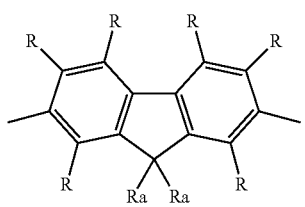

2-009

(wherein R represents a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group. Ra represents an alkyl group, an aryl group, a monovalent aromatic heterocyclic group or an aralkyl group. A plurality of Rs may be the same or different. A plurality of Ras may be the same or different).

The alkyl group, aryl group, monovalent aromatic heterocyclic group, alkoxy group, aryloxy group, aralkyl group, arylalkoxy group, substituted amino group, substituted carbonyl group and substituted carboxyl group represented by R in the formulae 2-001 to 2-009 are the same as explained and exemplified as the group represented by $R^2$ in the formula (1). R is preferably a hydrogen atom, an alkyl group, an aryl group, a monovalent aromatic heterocyclic group, an alkoxy group, an aryloxy group, an aralkyl group or a substituted amino group, more preferably a hydrogen atom, an alkyl group or an aryl group.

The alkyl group, aryl group, monovalent aromatic heterocyclic group and aralkyl group represented by Ra in the formulae 2-001 to 2-009 are the same as explained and exemplified as the group represented by $R^1$ in the formula (1). Ra is preferably an aryl group or an alkyl group, more preferably an unsubstituted aryl group or an aryl group substituted by an alkyl group, an alkoxy group or an aryl group; or an alkyl group.

The divalent aromatic heterocyclic group represented by $Ar^1$ in the formula (2) is an atomic group obtained by removing two hydrogen atoms from an aromatic heterocyclic compound, and includes also those having a condensed ring. The divalent aromatic heterocyclic group has a carbon atom number of usually 3 to 60, preferably 3 to 20. This carbon atom number does not include the carbon atom number of the substituent. The divalent aromatic heterocyclic group includes pyridinediyl groups such as a pyridine-2,5-diyl group (formula 2-101), a pyridine-2,6-diyl group (formula 2-102) and the like; pyrimidinediyl groups such as a pyrimidine-4,6-diyl group (formula 2-103) and the like; a triazine-2,4-diyl group (formula 2-104); pyrazinediyl groups such as a pyrazine-2,5-diyl group (formula 2-105) and the like; pyridazinediyl groups such as a pyridazine-3,6-diyl group (formula 2-106) and the like; quinolinediyl groups such as a quinolone-2,6-diyl group (formula 2-107) and the like; isoquinolinediyl groups such as an isoquinoline-1,4-diyl group (formula 2-108) and the like; quinoxalinediyl groups such as a quinoxaline-5,8-diyl group (formula 2-109) and the like; carbazolediyl groups such as a carbazole-3,6-diyl group (formula 2-110), a carbazole-2,7-diyl group (formula 2-111) and the like; dibenzofuranediyl groups such as a dibenzofurane-4,7-diyl group (formula 2-112), a dibenzofurane-3,8-diyl group (formula 2-113) and the like; dibenzothiophenediyl groups such as a dibenzothiophene-4,7-diyl group (formula 2-114), a dibenzothiophene-3,8-diyl group (formula 2-115) and the like; dibenzosilolediyl groups such as a dibenzosilole-4,7-diyl group (formula 2-116), a dibenzosilole-3,8-diyl group (formula 2-117) and the like; phenoxazinediyl groups such as a phenoxazine-3,7-diyl group (formula 2-118), a phenoxazine-2,8-diyl group (formula 2-119) and the like; phenothiazinediyl groups such as a phenothiazine-3,7-diyl group (formula 2-120), a phenothiazine-2,8-diyl group (formula 2-121) and the like; dihydroacridinediyl groups such as a dihydroacridine-2,7-diyl group (formula 2-123) and the like; a divalent group represented by (formula 2-124); pyrrolediyl groups such as a pyrrole-2,5-diyl group (formula 2-125) and the like; furanediyl groups such as a furane-2,5-diyl group (formula 2-126) and the like; thiophenediyl groups such as a thiophene-2,5-diyl group (formula 2-127) and the like; diazolediyl groups such as a diazole-2,5-diyl group (formula 2-128) and the like; triazolediyl groups such as a triazole-2,5-diyl group (formula 2-129) and the like; oxazolediyl groups such as an oxazole-2,5-diyl group (formula 2-130) and the like; an oxadiazole-2,5-diyl group (formula 2-131); triazolediyl groups such as a triazole-2,5-diyl group (formula 2-132) and the like; a thiadiazole-2,5-diyl group (formula 2-133); and the like. A hydrogen atom in these divalent aromatic heterocyclic groups may be substituted by an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group.

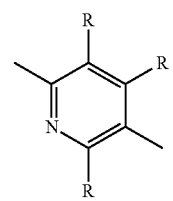

2-101

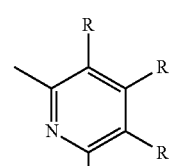

2-102

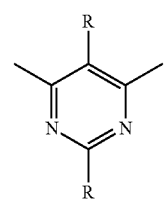

2-103

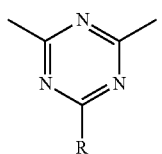
2-104
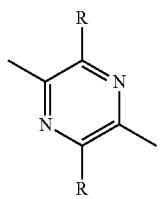
2-105
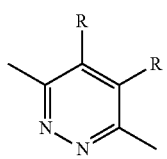
2-106
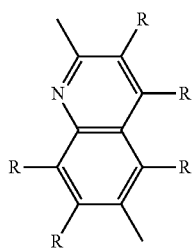
2-107
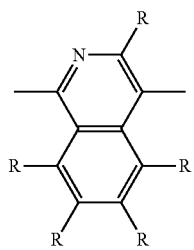
2-108
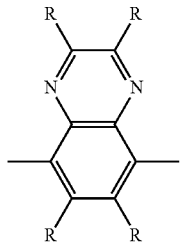
2-109
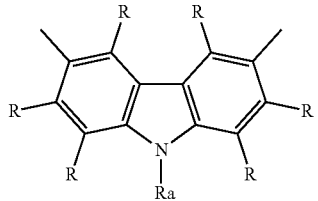
2-110
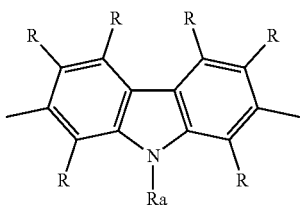
2-111
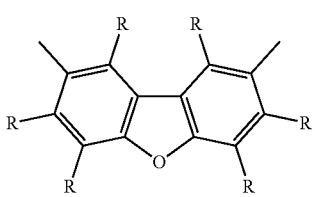
2-112
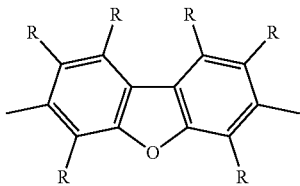
2-113
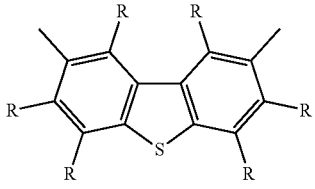
2-114
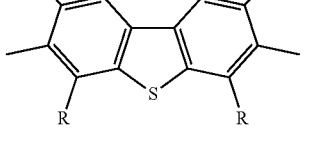
2-115
2-116
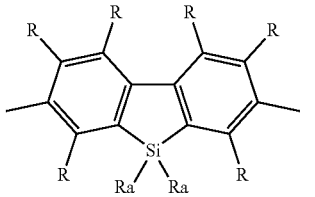
2-117
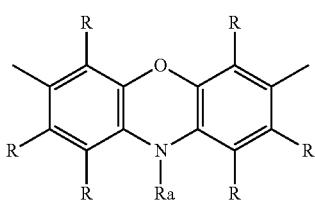
2-118

2-119 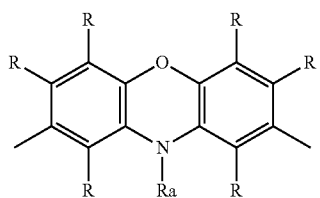
2-120 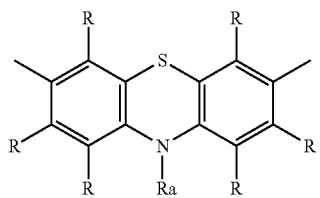
2-121 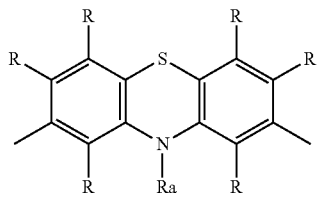
2-123 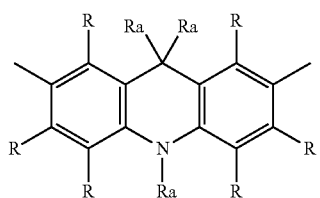
2-124 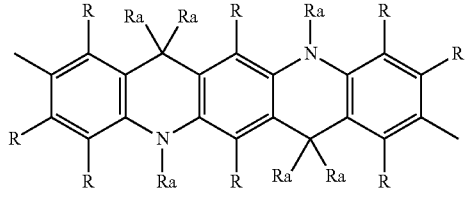
2-125 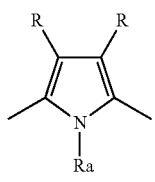
2-126 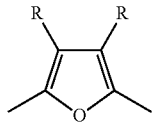
2-127 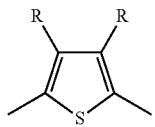
2-128 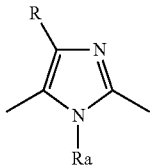
2-129 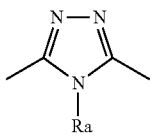
2-130 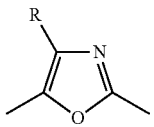
2-131 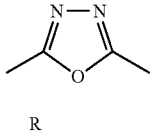
2-132 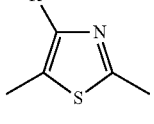
2-133 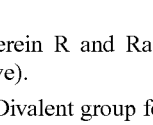
(wherein R and Ra have the same meaning as described above).
"Divalent group formed by direct bonding of the same or different two or more groups selected from the group consisting of arylene groups and divalent aromatic heterocyclic groups" represented by $Ar^1$ in the formula (2) includes groups represented by the following formulae 2-201 to 2-219.
2-201 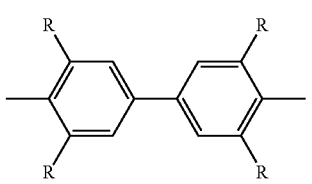
2-202 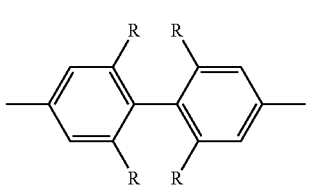
2-203 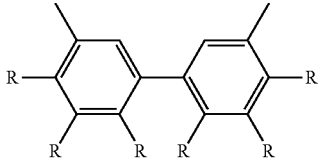

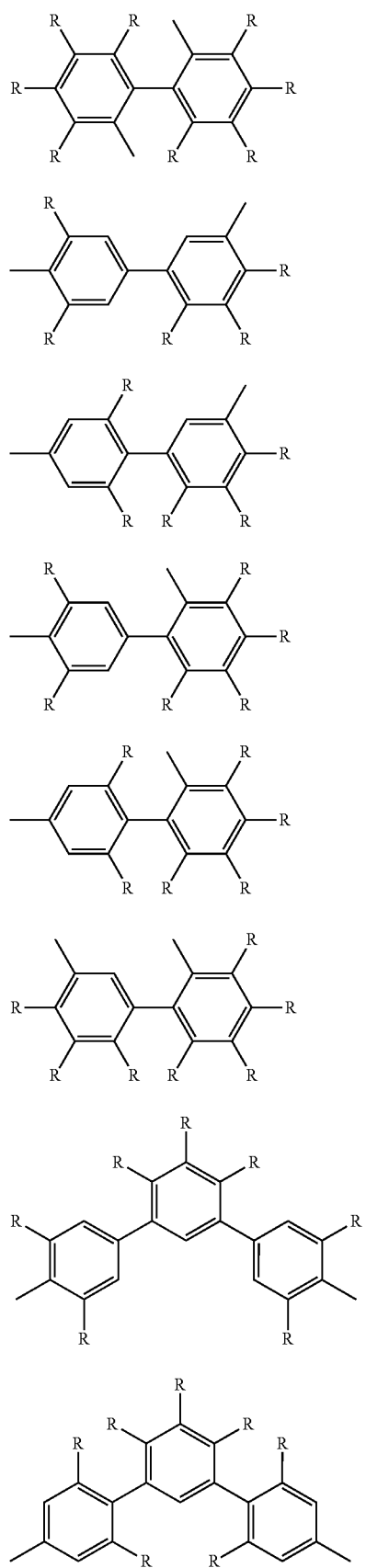
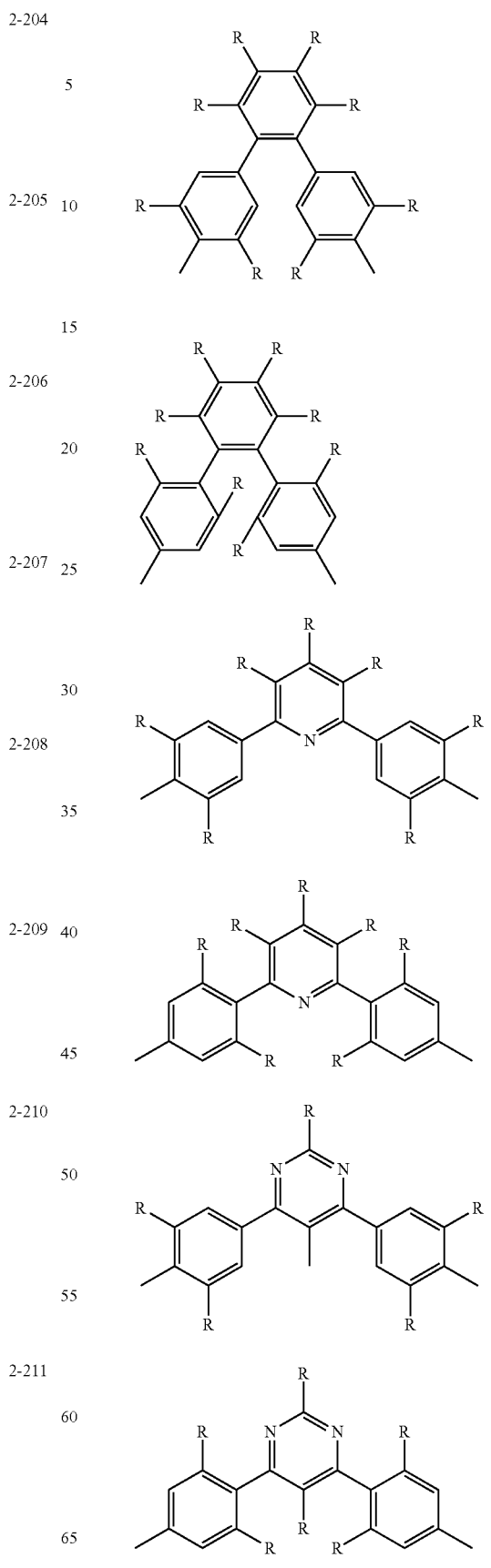

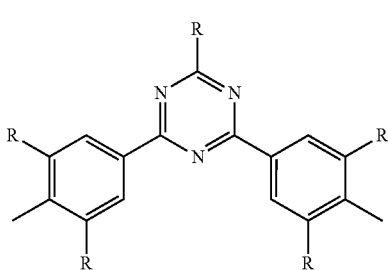

2-218

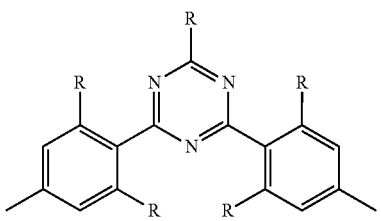

2-219 wherein R has the same meaning as described above.

As the constitutional unit represented by the formula (2), preferable are constitutional units in which $Ar^1$ is a group represented by the above-described formula 2-001, the above-described formula 2-009, the above-described formula 2-218 or the above-described formula 2-219.

From the standpoint of the light emission efficiency of the resultant light emitting device, it is preferable for the constitutional unit represented by the formula (2) to contain a constitutional unit represented by the following formula (4) and it is more preferable to contain a constitutional unit represented by the following formula (4) and a constitutional unit other than the constitutional unit represented by the following formula (4), from the standpoint of the driving voltage of the resultant light emitting device, it is preferable for the constitutional unit represented by the formula (2) to contain a constitutional unit represented by the following formula (5), and from both the standpoints, it is preferable for the constitutional unit represented by the formula (2) to contain a constitutional unit represented by the following formula (5) and a constitutional unit represented by the following formula (6) and it is more preferable to contain a constitutional unit represented by the following formula (4), a constitutional unit represented by the following formula (5) and a constitutional unit represented by the following formula (6).

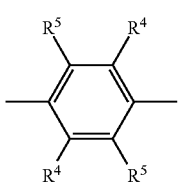

(4)

wherein $R^4$ represents an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group or a cyano group. $R^5$ represents a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group. Two $R^4$s may be the same or different. Two $R^5$s may be the same or different).

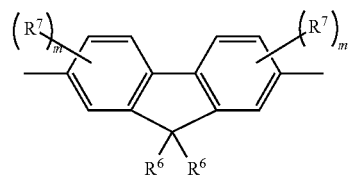

(5)

wherein $R^6$ represents an alkyl group, an aryl group, a monovalent aromatic heterocyclic group or an aralkyl group, and two $R^6$s may combine together; two $R^6$s may be the same or different; $R^7$ represents an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; m represents an integer of 0 to 3; two ms may be the same or different; when there are a plurality of $R^7$s, these may be the same or different.

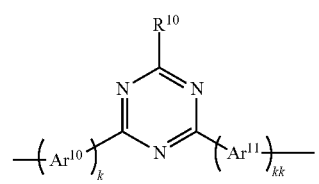

(6)

wherein $R^{10}$ represents a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; $Ar^{10}$ and $Ar^{11}$ each independently represent an arylene group or a divalent aromatic heterocyclic group; k and kk each independently represent an integer of 0 to 2, provided that $Ar^{10}$ and $Ar^{11}$ are not the above-described group represented by the formula (1); a hydrogen atom in the group represented by each of $Ar^{10}$ and $Ar^{11}$ may be substituted by an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; when there are a plurality of $Ar^{10}$s and $Ar^{11}$s, these may be the same or different, respectively).

The alkyl group, aryl group, monovalent aromatic heterocyclic group, alkoxy group, aryloxy group, aralkyl group, arylalkoxy group, substituted amino group, substituted carbonyl group and substituted carboxyl group represented by $R^4$ in the formula (4) are the same as explained and exemplified as the group represented by $R^2$ in the formula (1).

From the standpoint of a balance between the heat resistance of the polymer compound of the present invention and the solubility thereof in an organic solvent, the group represented by $R^4$ is preferably an alkyl group, an aryl group, a monovalent aromatic heterocyclic group, an alkoxy group, an aryloxy group, an aralkyl group or a substituted amino group, more preferably an alkyl group or an aralkyl group, further preferably an alkyl group, particularly preferably a propyl group, an isopropyl group, a butyl group, a sec-butyl group, an isobutyl group, a pentyl group, an isoamyl group, a hexyl group, a cyclohexyl group, a heptyl group, an octyl group, a 2-ethylhexyl group, a cyclohexylmethyl group, a nonyl group, a decyl group, a 3,7-dimethyloctyl group or a dodecyl group.

The alkyl group, aryl group, monovalent aromatic heterocyclic group, alkoxy group, aryloxy group, aralkyl group, arylalkoxy group, substituted amino group, substituted carbonyl group and substituted carboxyl group represented by $R^5$ in the formula (4) are the same as explained and exemplified as the group represented by $R^2$ in the formula (1).

From the standpoint of the heat resistance of the polymer compound of the present invention, the solubility thereof in an organic solvent and reactivity in polymerizing a monomer, the group represented by $R^5$ is preferably a hydrogen atom, an alkyl group, an alkoxy group, an aryl group, a monovalent aromatic heterocyclic group or an aralkyl group, more preferably a hydrogen atom or an alkyl group, particularly preferably a hydrogen atom.

The constitutional unit represented by the formula (4) includes constitutional units represented by the following formulae 4-001 to 4-017 and 4-101 to 4-105.

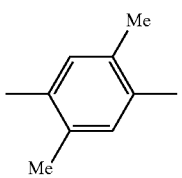
4-001

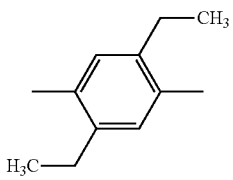
4-002

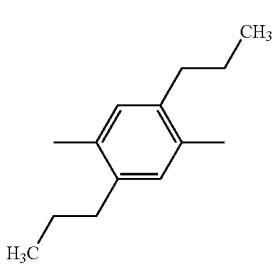
4-003

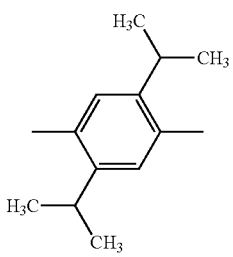
4-004

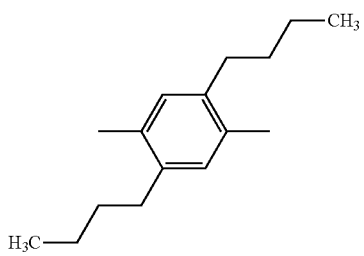
4-005

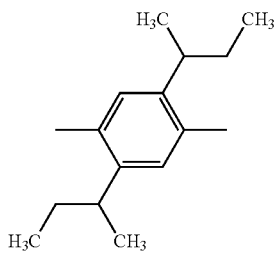
4-006

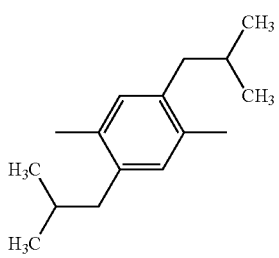
4-007

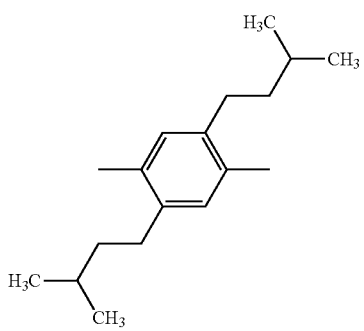
4-008

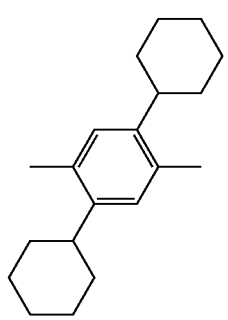
4-009

4-010
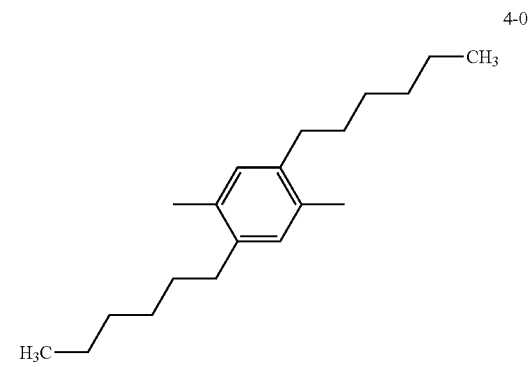
4-011
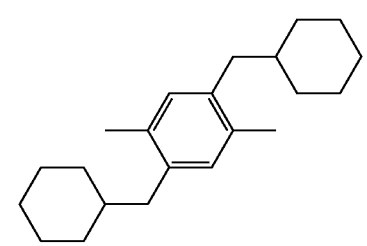
4-012
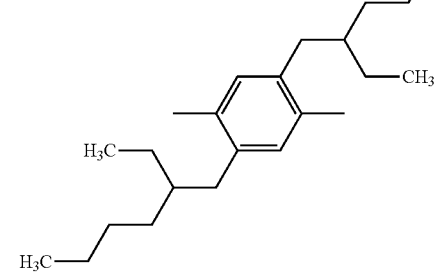
4-013
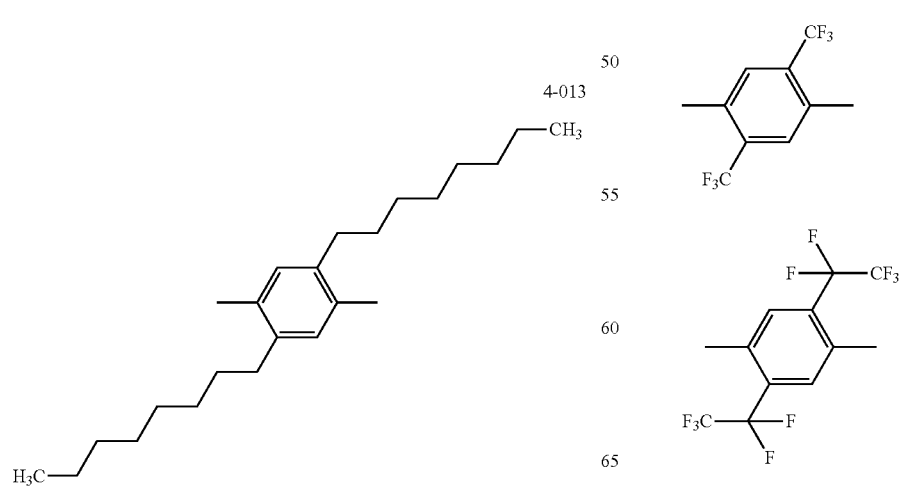
4-014
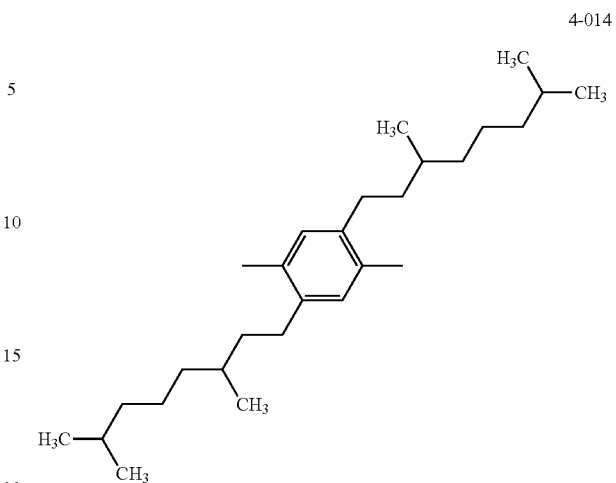
4-015
4-016
4-017
4-101
4-102

-continued

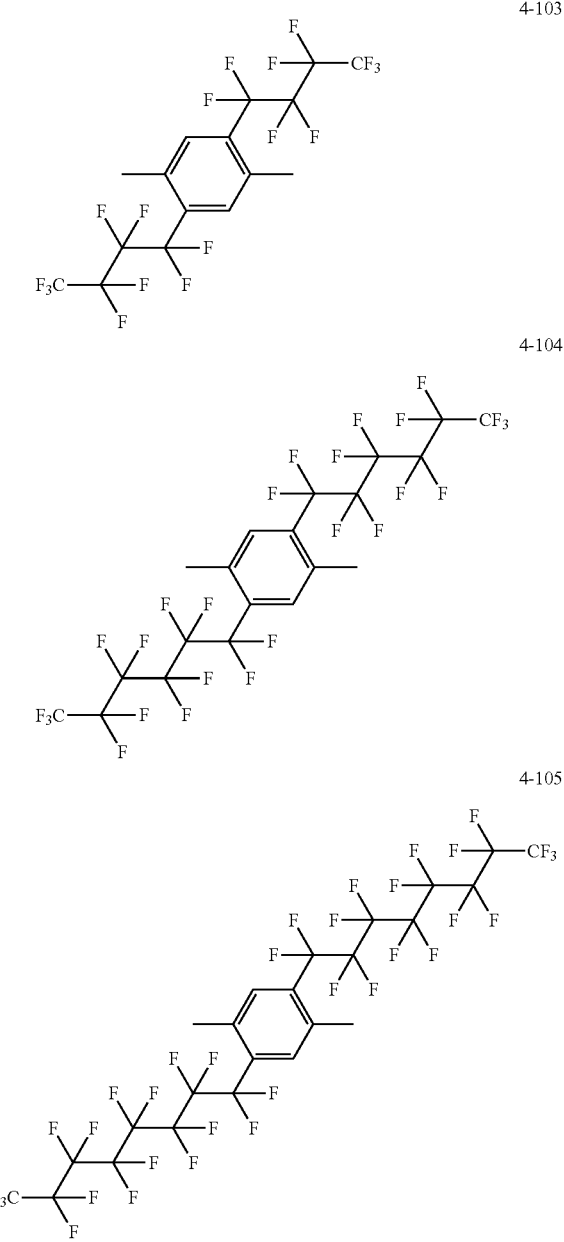

4-103

4-104

4-105

The monovalent aromatic heterocyclic group and aralkyl group represented by R⁶ in the formula (5) are the same as explained and exemplified as the group represented by $R^1$ in the formula (1).

The alkyl group represented by $R^6$ in the formula (5) includes a methyl group, an ethyl group, a propyl group, an isopropyl group, a butyl group, a sec-butyl group, an isobutyl group, a pentyl group, a 2-methylbutyl group, an isoamyl group, a hexyl group, a heptyl group, an octyl group, a 2-ethylhexyl group, a nonyl group, a decyl group, a 3,7-dimethyloctyl group, a dodecyl group and the like.

The aryl group represented by $R^6$ in the formula (5) includes a phenyl group, a 1-naphthyl group, a 2-naphthyl group and the like.

From the standpoint of a balance between the heat resistance of the polymer compound of the present invention and the solubility thereof in an organic solvent, the group represented by $R^6$ is preferably an aryl group or an alkyl group, more preferably an unsubstituted aryl group or an aryl group substituted by an alkyl group, an alkoxy group, an aryl group or a substituted amino group; or an alkyl group, particularly preferably a 4-tolyl group, a 4-butylphenyl group, a 4-t-butylphenyl group, a 4-hexylphenyl group, a 4-octylphenyl group, a 4-(2-ethylhexyl)phenyl group, a 4-(3,7-dimethyloctyl)phenyl group, a 3-tolyl group, a 3-butylphenyl group, a 3-t-butylphenyl group, a 3-hexylphenyl group, a 3-octylphenyl group, a 3-(2-ethylhexyl)phenyl group, a 3-(3,7-dimethyloctyl)phenyl group, a 3,5-dimethylphenyl group, a 3,5-di-(t-butyl)phenyl group, a 3,5-dihexylphenyl group, a 3,5-dioctylphenyl group, a 3,4-dihexylphenyl group, a 3,4-dioctylphenyl group, a 4-hexyloxyphenyl group, a 4-octyloxyphenyl group, a 4-(2'-ethoxyethyloxy)phenyl group, a 4-(4'-t-butylbiphenyl) group, a 9,9-dihexylfluorene-2-yl group or a 9,9-dioctylfluorene-2-yl group.

The alkyl group, aryl group, monovalent aromatic heterocyclic group, alkoxy group, aryloxy group, aralkyl group, arylalkoxy group, substituted amino group, substituted carbonyl group and substituted carboxyl group represented by $R^7$ in the formula (5) are the same as explained and exemplified as the group represented by $R^2$ in the formula (1).

In the formula (5), m represents an integer of 0 to 3, and preferably 0 or 1. It is preferable that two ms represent 0 or 1, or both of them are 0, and it is particularly preferable that both of them are 0.

The alkyl group, aryl group, monovalent aromatic heterocyclic group, alkoxy group, aryloxy group, aralkyl group, arylalkoxy group, substituted amino group, substituted carbonyl group and substituted carboxyl group represented by $R^{10}$ in the formula (6) are the same as explained and exemplified as the group represented by $R^2$ in the formula (1).

From the standpoint of a balance between the heat resistance of the polymer compound of the present invention and the solubility thereof in an organic solvent, the group represented by $R^{10}$ is preferably an aryl group, more preferably an unsubstituted aryl group or an aryl group substituted by an alkyl group, an alkoxy group, an aryl group, a monovalent aromatic heterocyclic group or a substituted amino group, further more preferably a 4-tolyl group, a 4-butylphenyl group, a 4-t-butylphenyl group, a 4-hexylphenyl group, a 4-octylphenyl group, a 4-(2-ethylhexyl)phenyl group, a 4-dodecylphenyl group, a 3-tolyl group, a 3-butylphenyl group, a 3-t-butylphenyl group, a 3-hexylphenyl group, a 3-octylphenyl group, a 3-(2-ethylhexyl)phenyl group, a 3-dodecylphenyl group, a 3,5-di-t-butylphenyl group or a 3,5-dihexylphenyl group. From the standpoint of lowering of the driving voltage of a light emitting device using the polymer compound of the present invention, preferable are a monovalent aromatic heterocyclic group and a substituted amino group, more preferable are an unsubstituted monovalent aromatic heterocyclic group containing one or more nitrogen atoms or a monovalent aromatic heterocyclic group containing one or more nitrogen atoms substituted by an alkyl group, an alkoxy group, an aryl group, a monovalent aromatic heterocyclic group or a substituted amino group; and a substituted amino group, further more preferable are a 2-pyridyl group, a 4-hexylpyridine-2-yl group, a 5-octylpyridine-2-yl group, a 3-pyridyl group, a 5-hexylpyridine-3-yl group, a 4-pyridyl group, a 2,5-dimethylpyridine-4-yl group, a N-phenoxazinyl group and a N-phenothiazinyl group.

The arylene group and divalent aromatic heterocyclic group represented by $Ar^{10}$ and $Ar^{11}$ in the formula (6) are the same as explained and exemplified as the arylene group and divalent aromatic heterocyclic group represented by $Ar^1$ in the formula (2).

From the standpoint of enhancement of the light emission efficiency of a light emitting device using the polymer compound of the present invention, the group represented by $Ar^{10}$ and $Ar^{11}$ includes preferably groups represented by the above-described formulae 2-001, 2-002, 2-101, 2-103, 2-104, 2-105 and 2-106, more preferably a group represented by the formula 2-001.

It is particularly preferable that the constitutional unit represented by the formula (6) contains a constitutional unit represented by the formula 2-104, 2-218 or 2-219.

Only one unit or two or more units among the constitutional units represented by the formula (2), the constitutional units represented by the formula (4) and the constitutional units represented by the formula (5) may be contained, respectively, in the polymer compound of the present invention.

Only one unit or two or more units among the constitutional units represented by the formula (6) may be contained in the polymer compound of the present invention.

—Constitutional Unit Represented by the Formula (3)—

From the standpoint of the driving voltage of a light emitting device using the polymer compound of the present invention, the constitutional unit represented by the formula (3) is preferably contained.

The arylene groups represented by $Ar^2$ to $Ar^5$ in the formula (3) include those explained and exemplified as the arylene group represented by $Ar^1$ in the formula (2), and the constitutional unit represented by the formula (1).

The divalent aromatic heterocyclic groups represented by $Ar^2$ to $Ar^5$ in the formula (3) are the same as explained and exemplified as the divalent aromatic heterocyclic group represented by $Ar^1$ in the formula (2)

The divalent group formed by direct bonding of the same or different two or more groups selected from the group consisting of arylene groups and divalent aromatic heterocyclic groups represented by $Ar^2$ to $Ar^5$ in the formula (3) are the same as explained and exemplified as "divalent group formed by direct bonding of the same or different two or more groups selected from the group consisting of arylene groups and divalent aromatic heterocyclic groups" represented by $Ar^1$ in the formula (2).

The aryl group and monovalent aromatic heterocyclic group represented by $Ar^6$ to $Ar^8$ in the formula (3) are the same as explained and exemplified as the aryl group and monovalent aromatic heterocyclic group represented by $Ar^1$ in the formula (1).

The groups represented by $Ar^5$, $Ar^6$, $Ar^7$ and $Ar^8$ in the formula (3) may be bonded directly or bonded via —O—, —S—, —C(=O)—, —C(=O)—O—, —N($R^4$)—, —C(=O)—N($R^4$)— or —C($R^4$)$_2$— to the groups represented by $Ar^2$, $Ar^3$, $Ar^4$, $Ar^5$, $Ar^7$ and $Ar^8$ linked to nitrogen atoms to which $Ar^5$, $Ar^6$, $Ar^7$ and $Ar^8$ are linked, respectively, to form 5- to 7-membered rings. n and nn are each independently 0 or 1. $R^4$ represents an alkyl group, an aryl group, a monovalent aromatic heterocyclic group or an aralkyl group. The groups represented by $R^4$ are the same as explained and exemplified as the group represented by $R^2$.

The constitutional unit represented by the formula (3) includes constitutional units represented by the following formulae 3-001 to 3-004.

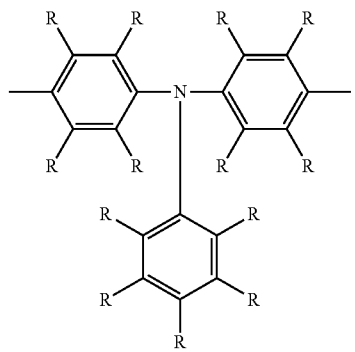

3-001

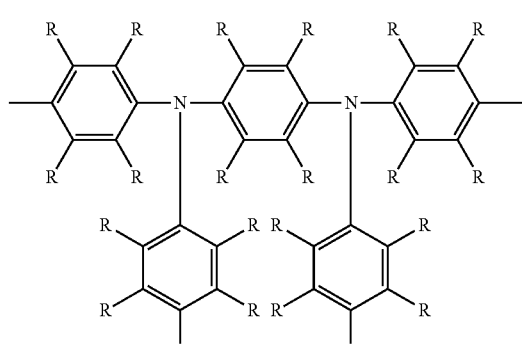

3-002

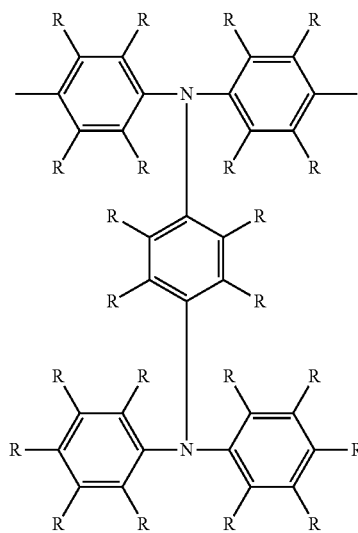

3-003

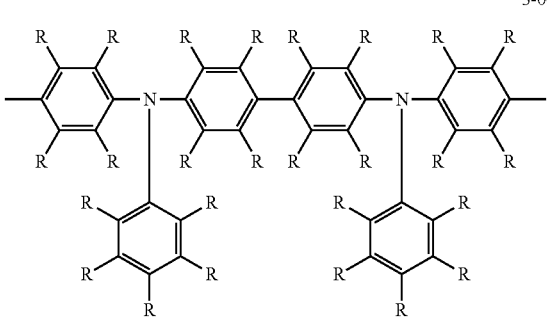

3-004 wherein R has the same meaning as described above.

3Only one unit or two or more units among the constitutional units represented by the formula (3) may be contained in the polymer compound of the present invention.

From the standpoint of workability in fabrication of a light emitting device, the polymer compound of the present invention may contain a constitutional unit derived from a phosphorescence emitting compound described later.

The polymer compound of the present invention includes the following compounds EP-1 to EP-3

TABLE 1

| | Constitutional units and proportion of molar amounts thereof | | | | |
|---|---|---|---|---|---|
| Compound | Formula (1) v | Formula (2) w | Formula (3) x | Constitutional unit derived from phosphorescence emitting compound y | other z |
| EP-1 | 0.001 to 0.9 | 0.001 to 0.999 | 0 | 0 to 0.4 | 0 to 0.1 |
| EP-2 | 0.001 to 0.9 | 0 | 0.001 to 0.999 | 0 to 0.4 | 0 to 0.1 |
| EP-3 | 0.001 to 0.9 | 0.001 to 0.998 | 0.001 to 0.998 | 0 to 0.4 | 0 to 0.1 |

(in the table, $v + w + x + y + z = 1$ and $1 \geq v + w + x \geq 0.5$).

When the polymer compound of the present invention contains a constitutional unit represented by the formula (4) or the formula (5) as the constitutional unit represented by the formula (2), the polymer compound of the present invention includes the following compounds EP-4 to EP-9.

TABLE 2

| | Constitutional units and proportion of molar amounts thereof | | | | | | |
|---|---|---|---|---|---|---|---|
| Compound | Formula (1) t' | Formula (3) u' | Formula (4) v' | Formula (5) w' | Constitutional unit represented by formula (2), other than formulae (4) and (5) x' | Constitutional unit derived from phosphorescence emitting compound y' | other z' |
| EP-4 | 0.001 to 0.9 | 0 | 0.001 to 0.999 | 0 | 0 to 0.3 | 0 to 0.4 | 0 to 0.1 |
| EP-5 | 0.001 to 0.9 | 0 | 0 | 0.001 to 0.999 | 0 to 0.3 | 0 to 0.4 | 0 to 0.1 |
| EP-6 | 0.001 to 0.9 | 0 | 0.001 to 0.998 | 0.001 to 0.998 | 0 to 0.3 | 0 to 0.4 | 0 to 0.1 |
| EP-7 | 0.001 to 0.9 | 0.001 to 0.998 | 0 | 0.001 to 0.998 | 0 to 0.3 | 0 to 0.4 | 0 to 0.1 |
| EP-8 | 0.001 to 0.9 | 0.001 to 0.998 | 0.001 to 0.998 | 0 | 0 to 0.3 | 0 to 0.4 | 0 to 0.1 |
| EP-9 | 0.001 to 0.9 | 0.001 to 0.997 | 0.001 to 0.997 | 0.001 to 0.997 | 0 to 0.3 | 0 to 0.4 | 0 to 0.1 |

(in the table, $t' + u' + v' + w' + x' + y' + z' = 1$ and $1 \geq t' + u' + v' + w' + x' \geq 0.5$).

When the polymer compound of the present invention contains a constitutional unit represented by the formula (4), the formula (5) or the formula (6) as the constitutional unit represented by the formula (2), the polymer compound of the present invention includes the following compounds EP-10 to EP-15.

The polymer compound of the present invention preferably contains at least one constitutional unit selected from the group consisting of a constitutional unit represented by the formula (3), a constitutional unit represented by the formula (5) and a constitutional unit represented by the formula (6) from the standpoint of the driving voltage of the resulting

TABLE 3

Constitutional units and proportion of molar amounts thereof

| Compound | Formula (1) t" | Formula (3) u" | Formula (4) v" | Formula (5) w" | Formula (6) s" | Constitutional unit represented by formula (2), other than formulae (4) to (6) x" | Constitutional unit derived from phosphorescence emitting compound y" | other z" |
|---|---|---|---|---|---|---|---|---|
| EP-10 | 0.001 to 0.9 | 0 | 0.001 to 0.998 | 0 | 0.001 to 0.998 | 0 to 0.2 | 0 to 0.4 | 0 to 0.1 |
| EP-11 | 0.001 to 0.9 | 0 | 0 | 0.001 to 0.998 | 0.001 to 0.998 | 0 to 0.2 | 0 to 0.4 | 0 to 0.1 |
| EP-12 | 0.001 to 0.9 | 0 | 0.001 to 0.997 | 0.001 to 0.997 | 0.001 to 0.997 | 0 to 0.2 | 0 to 0.4 | 0 to 0.1 |
| EP-13 | 0.001 to 0.9 | 0.001 to 0.997 | 0 | 0.001 to 0.997 | 0.001 to 0.997 | 0 to 0.2 | 0 to 0.4 | 0 to 0.1 |
| EP-14 | 0.001 to 0.9 | 0.001 to 0.997 | 0.001 to 0.997 | 0 | 0.001 to 0.997 | 0 to 0.2 | 0 to 0.4 | 0 to 0.1 |
| EP-15 | 0.001 to 0.9 | 0.001 to 0.996 | 0.001 to 0.996 | 0.001 to 0.996 | 0.001 to 0.996 | 0 to 0.2 | 0 to 0.4 | 0 to 0.1 |

(in the table, t" + u" + v" + w" + s" + x" + y" + z" = 1 and 1 ≥ t" + u" + v" + w" + s" + x" ≥ 0.5).

—Others—

The polymer compound of the present invention may take any form such as a linear polymer, a branched polymer, a hyperbranch polymer, a cyclic polymer, a comb polymer, a star polymer, a network polymer and the like, and may be a polymer having any composition and regularity such as a homo polymer, an alternating copolymer, a periodic copolymer, a random copolymer, a block copolymer, a graft copolymer and the like having any form described above.

In the polymer compound of the present invention, the proportion of the total molar amount of other constitutional units is usually 0.1 to 999, and from the standpoint of reactivity in polymerizing a monomer, preferably 0.95 to 199, more preferably 0.95 to 99 relative to the total molar amount of constitutional units represented by the formula (1).

In the polymer compound of the present invention, the proportion of the total molar amount of constitutional units represented by the formulae (1) to (3) is preferably 0.7 to 1.0, more preferably 0.8 to 1.0, further preferably 0.9 to 1.0 relative to the total molar amount of all constitutional units, from the standpoint of the driving voltage of a light emitting device.

The polymer compound of the present invention preferably contains the above-described constitutional unit represented by the formula (3) and/or the above-described constitutional unit represented by the formula (5) from the standpoint of the driving voltage of the resulting light emitting device, and the proportion of the total molar amount of constitutional units represented by the formulae (1), (3) and (5) is preferably 0.5 or more, more preferably 0.7 or more relative to the total molar amount of all constitutional units.

light emitting device, and the proportion of the total molar amount of constitutional units represented by the formulae (1), (3), (5) and (6) is preferably 0.5 or more, more preferably 0.7 or more relative to the total molar amount of all constitutional units.

In the polymer compound of the present invention, it is preferable that two or more constitutional units represented by the formula (1) are present in one molecule and the two or more constitutional units represented by the formula (1) substantially fail to be adjacent, from the standpoint of the driving voltage of the resulting light emitting device and reactivity in polymerizing a monomer. Here, "substantially" means that the proportion of the number of adjacent bonds between the constitutional units represented by the formula (1) is less than 0.05 relative to the number of bonds between all constitutional units.

When the polymer compound of the present invention is formulated into a composition with a phosphorescence emitting compound having a photoluminescence peak wavelength in the range of 480 to 550 nm and used for fabrication of a light emitting device, and if it is used, as a polymer compound containing a constitutional unit derived from a phosphorescence emitting compound having a photoluminescence peak wavelength in the range of 480 to 550 nm, for fabrication of a light emitting device, it is preferable, from the standpoint of the light emission efficiency of the resulting light emitting device, that a constitutional unit represented by the formula (4) is contained and the proportion of the total molar amount of other constitutional units is 0.95 to 1.05 relative to the total molar amount of a constitutional unit represented by the formula (1) and a constitutional unit represented by the formula (4) in the polymer compound of the present invention, and this proportion is more preferably 0.98 to 1.02, particularly preferably 0.99 to 1.01.

From the standpoint of reactivity in polymerizing a monomer and the driving voltage of the resulting light emitting device, it is preferable, for the polymer compound of the present invention, that "a constitutional unit represented by the formula (4) is contained and the proportion of the total molar amount of other constitutional units is 0.95 to 1.05 relative to the total molar amount of a constitutional unit represented by the formula (1) and a constitutional unit represented by the formula (4) in the polymer compound of the present invention" and "at least one constitutional unit selected from the group consisting of a constitutional unit represented by the formula (3) and a constitutional unit represented by the formula (5), and a constitutional unit represented by the formula (4) are contained and the proportion of the total molar amount of constitutional units represented by the formulae (1), (3), (4) and (5) is 0.7 or more relative to the total molar amount of all constitutional units in the polymer compound of the present invention".

From the standpoint of reactivity in polymerizing a monomer and the driving voltage of the resulting light emitting device, it is preferable, for the polymer compound of the present invention, that "a constitutional unit represented by the formula (4) is contained and the proportion of the total molar amount of other constitutional units is 0.95 to 1.05 relative to the total molar amount of a constitutional unit represented by the formula (1) and a constitutional unit represented by the formula (4) in the polymer compound of the present invention" and "at least one constitutional unit selected from the group consisting of a constitutional unit represented by the formula (3), a constitutional unit represented by the formula (5) and a constitutional unit represented by the formula (6), and a constitutional unit represented by the formula (4) are contained and the proportion of the total molar amount of constitutional units represented by the formulae (1), (3), (4), (5) and (6) is 0.7 or more relative to the total molar amount of all constitutional units in the polymer compound of the present invention".

From the standpoint of reactivity in polymerizing a monomer and the driving voltage of the resulting light emitting device, it is preferable, for the polymer compound of the present invention, that two or more constitutional units represented by the formula (1) and two or more constitutional units represented by the formula (4) are present respectively in one molecule and the two or more constitutional units represented by the formula (1) substantially fail to be adjacent, the two or more constitutional units represented by the formula (4) substantially fail to be adjacent and the constitutional unit represented by the formula (1) and the constitutional unit represented by the formula (4) substantially fail to be adjacent. Here, "substantially" means that the proportion of the sum of the number of adjacent bonds between the constitutional units represented by the formula (1), the number of adjacent bonds between the constitutional units represented by the formula (4) and the number of adjacent bonds between the constitutional unit represented by the formula (1) and the constitutional unit represented by the formula (4) is less than 0.05 relative to the number of bonds between all constitutional units.

When the end group of the polymer compound of the present invention is a polymerization active group, if the polymer compound is used for fabrication of a light emitting device, there is a possibility of lowering of the light emission efficiency and the life of the resultant light emitting device, thus, it is preferable that the end group is a stable group. This end group is preferably one having a conjugate bond to the main chain, and examples thereof include those having a bond to an aryl group or a monovalent aromatic heterocyclic group via a carbon-carbon bond. These aryl group and monovalent aromatic heterocyclic group are the same as explained and exemplified as the above-described aryl group and monovalent aromatic heterocyclic group represented by $R^1$ in the formula (1).

The polystyrene-equivalent number average molecular weight (Mn) according to gel permeation chromatography (hereinafter, referred to as "GPC") of the polymer compound of the present invention is usually $1\times10^3$ to $1\times10^8$, preferably $1\times10^4$ to $1\times10^6$, more preferably $1\times10^4$ to $5\times10^5$. The polystyrene-equivalent weight average molecular weight (Mw) of the polymer compound of the present invention is usually $1\times10^3$ to $1\times10^8$, and from the standpoint of film formability and the light emission efficiency of a light emitting device, is preferably $1\times10^4$ to $5\times10^6$, more preferably $3\times10^4$ to $1\times10^6$, further preferably $3\times10^4$ to $5\times10^5$.

From the standpoint of durability against processes for fabricating a light emitting device or the like and heat resistance and stability against heat generation during driving of a light emitting device, the glass transition temperature of the polymer compound of the present invention is preferably 70° C. or higher, more preferably 100° C. or higher.

The polymer compound of the present invention usually emits fluorescence or phosphorescence at the solid state, and is useful as a material of a light emitting device (for example, light emitting material, charge transporting material). A light emitting device using this polymer compound is a high performance light emitting device which can be driven at high light emission efficiency. Therefore, this light emitting device is useful for backlight of a liquid crystal display; curved or flat light sources for illumination; segment type display devices; displays such as a dot matrix type flat panel display and the like. Further, the polymer compound of the present invention is useful also as a dye for laser; a material for an organic solar battery; an organic semiconductor for an organic transistor; a material for conductive films such as electric conductive films, organic semiconductor films and the like; or a material for a light emitting film emitting fluorescence or phosphorescence.

<Method of Producing Polymer Compound>

The polymer compound of the present invention can be synthesized, for example, by copolymerizing at least one compound selected from the group consisting of a compound represented by the following formula (B) (compound as monomer) and a compound represented by the following formula (C) (compound as monomer), and a compound represented by the following formula (A) (compound as monomer), each having a suitable reactive group depending on the kind of the polymerization reaction, according to a known polymerization method such as aryl coupling or the like using an alkali and a suitable catalyst and a ligand, if necessary, under the condition of dissolution in an organic solvent.

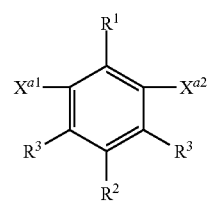

(A)

wherein $R^1$, $R^2$ and $R^3$ have the same meaning as described above. $X^{a1}$ and $X^{a2}$ each independently represent a bromine atom, an iodine atom, a chlorine atom, —O—S(=O)$_2$R$^{20}$, —B(OR$^{21}$)$_2$, —BF$_4^-$Q$^1$, —Sn(R$^{22}$)$_2$, —MgY$^1$ or ZnY$^1$; R$^{20}$ represents an alkyl group, or an aryl group optionally substituted by an alkyl group, an alkoxy group, a nitro group, a fluorine atom or a cyano group; R$^{21}$ and R$^{22}$ each independently represent a hydrogen atom or an alkyl group; two R$^{21}$s may be the same or different and may together form a ring; three R$^{22}$s may be the same or different and may together form a ring; Q$^1$ represents a monovalent cation of lithium, sodium, potassium, rubidium or cesium; Y$^1$ represents a bromine atom, an iodine atom or a chlorine atom.

  (B)

wherein Ar$^1$ has the same meaning as described above; X$^{b1}$ and X$^{b2}$ each independently represent a bromine atom, an iodine atom, a chlorine atom, —O—S(=O)$_2$R$^{20}$, —B(OR$^{21}$)$_2$, —BF$_4^-$Q$^1$, —Sn(R$^{22}$)$_3$, —MgY$^1$ or –ZnY$^1$; R$^{20}$, R$^{21}$, R$^{22}$, Q$^1$ and Y$^1$ have the same meaning as described above.

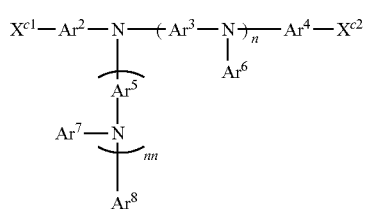  (C)

wherein Ar$^2$ to Ar$^8$, n and nn represent the same meaning as described above; X$^{c1}$ and X$^{c2}$ each independently represent a bromine atom, an iodine atom, a chlorine atom, —O—S(=O)$_2$R$^{20}$, —B(OR$^{21}$)$_2$, —BF$_4^-$Q$^1$, —Sn(R$^{22}$)$_3$, —MgY$^1$ or —ZnY$^1$; R$^{20}$, R$^{21}$, R$^{22}$, Q$^1$ and Y$^1$ have the same meaning as described above.

The alkyl groups represented by R$^{20}$, R$^{21}$ and R$^{22}$ in the formulae (A), (B) and (C) are the same as explained and exemplified as the above-described alkyl group represented by R$^2$ in the formulae (1), and have a carbon atom number of usually 1 to 20, preferably 1 to 15, more preferably 1 to 10.

The aryl groups represented by R$^{20}$ in the formulae (A), (B) and (C) are the same as explained and exemplified as the aryl group represented by R$^2$, and preferable from the standpoint of easiness of synthesis of the polymer compound of the present invention and reactivity in polymerizing a monomer are a phenyl group, a 4-tolyl group, a 4-methoxyphenyl group, a 4-nitrophenyl group, a 3-nitrophenyl group, a 2-nitrophenyl group and a 4-trifluoromethylphenyl group.

The group represented by —O—S(=O)$_2$R$^{20}$ in the formulae (A), (B) and (C) includes a methanesulfonyloxy group, a trifluoromethanesulfonyloxy group, a phenylsulfonyloxy group, a 4-methylphenylsulfonyloxy group, a 4-trifluoromethylphenylsulfonyloxy group and the like.

The group represented by —B(OR$^{21}$)$_2$ in the formulae (A), (B) and (C) includes groups represented by the following formulae, and the like.

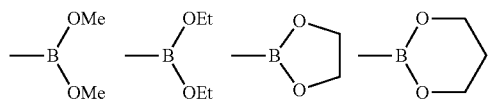

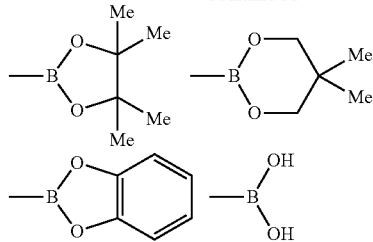

The group represented by —BF$_4^-$Q$^1$ in the formulae (A), (B) and (C) includes a group represented by the following formula, and the like.

The group represented by —Sn(R$^{22}$)$_3$ in the formulae (A), (B) and (C) includes a trimethylstannanyl group, a triethylstannanyl group, a tributylstannanyl group and the like.

The compounds represented by the formulae (A), (B) and (C) may be previously synthesized and isolated before use, or may be synthesized in the reaction system and used as they, and when the resultant polymer compound is used in a light emitting device, its purity exerts an influence on the performance of a device such as a light emission property, thus, it is preferable that monomers before polymerization are purified by distillation, sublimation purification, re-crystallization and the like before carrying out condensation polymerization.

As the compound represented by the formula (A), preferable from the standpoint of the heat resistance of the polymer compound of the present invention and solubility thereof in an organic solvent are compounds represented by the above-described formula (1a), and preferable from the standpoint of the driving voltage of the resultant light emitting device are compounds represented by the following formula (1b):

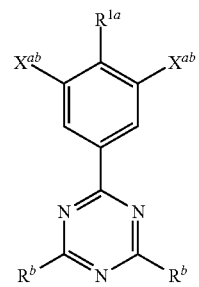  (1b)

wherein R$^{1b}$ represents an alkyl group; R$^b$ represents an optionally substituted aryl group, an optionally substituted monovalent aromatic heterocyclic group or a substituted amino group; two R$^b$s may be the same or different; X$^{ab}$ represents a bromine atom, an iodine atom, a chlorine atom, —O—S(=O)$_2$R$^{20}$, —B(OR$^{21}$)$_2$, —BF$_4^-$Q$^1$, —Sn(R$^{22}$)$_3$, —MgY$^1$ or ZnY$^1$, two R$^{ab}$s may be the same or different; R$^{20}$, R$^{21}$, R$^{22}$, Q$^1$ and Y$^1$ have the same meaning as described above, and compounds represented by the above-described formula (1c). In these formulae, the alkyl groups represented by R$^{1a}$, R$^{1b}$ and R$^{1c}$ are the same as explained and exemplified as the alkyl group represented by R$^1$, and the alkyl group, optionally substituted aryl group, optionally substituted monovalent aromatic heterocyclic group, substituted amino group, substituted carbonyl group and substituted carboxyl group represented by $R^a$, $R^b$ and $R^c$ are the same as explained and exemplified as the group represented by $R^2$.

The condensation polymerization method includes a method of polymerization by the Suzuki coupling reaction (Chem. Rev., vol. 95, p. 2457-2483 (1995)), a method of polymerization by the Grignard reaction (Bull. Chem. Soc. Jpn., vol. 51, p. 2091 (1978)), a method of polymerization with a Ni(0) catalyst (Progress in Polymer Science, vol. 17, p. 1153 to 1205, 1992), a method of using the Stille coupling reaction (European Polymer Journal, vol. 41, p. 2923-2933 (2005)), and the like, and the method of polymerization by the Suzuki coupling reaction and the method of polymerization with a Ni(0) catalyst are preferable from the standpoint of easiness of synthesis of a raw material and simplicity of the polymerization reaction operation, and in view of easiness of control of the structure of a polymer compound, more preferable are methods of polymerization by a cross-coupling reaction such as the Suzuki coupling reaction, the Grignard reaction, the Stille coupling reaction and the like, particularly preferable is a method of polymerization by the Suzuki coupling reaction.

As $X^{a1}$, $X^{a2}$, $X^{b1}$, $X^{b2}$, $X^{c1}$ and $X^{c2}$ in the formulae (A), (B) and (C), suitable groups may be selected depending on the kind of the polymerization reaction, and in the case of selection of a method of polymerization by the Suzuki coupling reaction, a bromine atom, an iodine atom, a chlorine atom and —B(OR$^{21}$)$_2$ are preferable and a bromine atom and —B(OR$^{21}$)$_2$ are more preferable from the standpoint of simplicity of synthesis and easiness of handling of the compound represented by the above-described formulae (A), (B) and (C).

The condensation polymerization method includes a method in which compounds represented by the above-described formulae (A), (B) and (C) are reacted, if necessary together with a suitable catalyst and a suitable base. In the case of selection of a method of polymerization by the Suzuki coupling reaction, the ratio of the total molar amount of a bromine atom, an iodine atom and a chlorine atom represented by $X^{a1}$, $X^{a2}$, $X^{b1}$, $X^{b2}$, $X^{c1}$ and $X^{c2}$ to the total molar amount of groups represented by —B(OR$^{21}$)$_2$, contained in the compounds represented by the above-described formulae (A), (B) and (C), may be advantageously adjusted, and usually, the ratio of the total molar amount of groups represented by —B(OR$^{21}$)$_2$ relative to the total molar amount of a bromine atom, an iodine atom and a chlorine atom represented by $X^{a1}$, $X^{a2}$, $X^{b1}$, $X^{b2}$, $X^{c1}$ and $X^{c2}$, contained in the compounds represented by the above-described formulae (A), (B) and (C), is preferably 0.95 to 1.05, more preferably 0.98 to 1.02, particularly preferably 0.98 to 1.01, for obtaining the desired molecular weight of the resulting polymer compound.

When the constitutional unit represented by the formula (2) contains a constitutional unit represented by the above-described formula (4), compounds represented by the following formula (D) may advantageously be used.

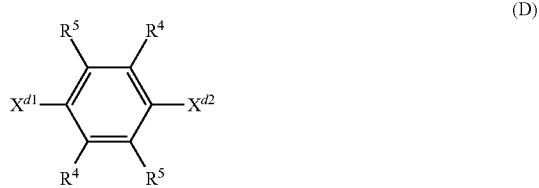

(D)

wherein $R^4$ and $R^5$ have the same meaning as described above; $X^{d1}$ and $X^{d2}$ each independently represent a bromine atom, an iodine atom, a chlorine atom, —O—S(=O)$_2$R$^{20}$, —B(OR$^{21}$)$_2$, —BF$_4^-$Q$^1$, —Sn(R$^{22}$)$_3$, —MgY$^1$ or ZnY$^1$; R$^{20}$, R$^{21}$, R$^{22}$, Q$^1$ and Y$^1$ have the same meaning as described above.

As the method of synthesizing "the polymer compound in which two or more constitutional units represented by the formula (1) are present in one molecule and the two or more constitutional units represented by the formula (1) substantially fail to be adjacent" which is a preferable embodiment of the present invention, preferable are reaction methods of polymerization by the Suzuki coupling reaction in which only groups represented by —B(OR$^{21}$)$_2$ are used as $X^{a1}$ and $X^{a2}$ in the formula (A), or only a bromine atom, an iodine atom or a chlorine atom is used as $X^{a1}$ and $X^{a2}$ in the formula (A). These methods are capable of obtaining a polymer compound in which the constitutional units represented by the above-described formula (1) are adjacently bonded in an amount corresponding only to the proportion of a homo coupling reaction which potentially occurs slightly as a side reaction, since the Suzuki coupling reaction is a cross coupling reaction. The proportion of the homo coupling reaction can be estimated from the number-average molecular weight of a polymer compound relative to the charge ratio of monomer compounds.

As the method of synthesizing "the polymer compound in which two or more constitutional units represented by the formula (1) and two or more constitutional units represented by the formula (4) are present respectively in one molecule and the two or more constitutional units represented by the formula (1) substantially fail to be adjacent, the two or more constitutional units represented by the formula (4) substantially fail to be adjacent and the constitutional unit represented by the formula (1) and the constitutional unit represented by the formula (4) substantially fail to be adjacent" which is another preferable embodiment of the present invention, preferable are reaction methods of polymerization by the Suzuki coupling reaction in which only groups represented by —B(OR$^{21}$)$_2$ are used as $X^{a1}$ and $X^{a2}$ in the formula (A) and $X^{d1}$ and $X^{d2}$ in the formula (D), or only a bromine atom, an iodine atom or a chlorine atom is used as $X^{a1}$ and $X^{a2}$ in the formula (A) and $X^{d1}$ and $X^{d2}$ in the formula (D). These methods are capable of obtaining a polymer compound in which the constitutional units represented by the formula (1) are adjacently bonded, the constitutional units represented by the formula (4) are adjacently bonded, and the constitutional unit represented by the formula (1) and the constitutional unit represented by the formula (4) are adjacently bonded in an amount corresponding only to the proportion of a homo coupling reaction which potentially occurs slightly as a side reaction, since the Suzuki coupling reaction is a cross coupling reaction. The proportion of the homo coupling reaction can be estimated from the number-average molecular weight of a polymer compound relative to the charge ratio of monomer compounds.

The catalyst is, in polymerization by the Suzuki coupling reaction, for example, a catalyst composed of a transition metal complex such as a palladium complex such as palladium[tetrakis(triphenylphosphine)], [tris(dibenzylideneacetone)]dipalladium, palladium acetate, dichlorobistriphenylphosphinepalladium and the like, and if necessary, a ligand such as triphenylphosphine, tri(t-butylphosphine), tricyclohexylphosphine and the like.

The catalyst is, in polymerization with a Ni(0) catalyst, for example, a catalyst composed of a transition metal complex such as a nickel complex such as nickel[tetrakis(triphenylphosphine)], [1,3-bis(diphenylphosphino)propane] dichloronickel, [bis(1,4-cyclooctadiene)]nickel and the like, and if necessary, a ligand such as triphenylphosphine, tri(t-butylphosphine), tricyclohexylphosphine, diphenylphosphinopropane, bipyridyl and the like.

The catalysts may be previously synthesized before use, or may be prepared in the reaction system and used as they are. The catalysts may be used singly or in combination of two or more.

When a catalyst is used, the use amount of the catalyst may be an effective amount as a catalyst, and the amount of the catalyst relative to the total molar amount of compounds represented by the formulae (A), (B) and (C) is usually 0.00001 to 3 mol equivalent, preferably 0.00005 to 0.5 mol equivalent, more preferably 0.0001 to 0.2 mol equivalent, in terms of a transition metal.

Bases to be used in polymerization by the Suzuki coupling reaction include inorganic bases such as sodium carbonate, potassium carbonate, cesium carbonate, potassium fluoride, cesium fluoride, tripotassium phosphate and the like, and organic bases such as tetrabutylammonium fluoride, tetrabutylammonium chloride, tetrabutylammonium bromide, tetraethylammonium hydroxide, tetrabutylammonium hydroxide and the like.

In the case of use of a base, its amount is usually 0.5 to 20 mol equivalent, preferably 1 to 10 mol equivalent relative to the total molar amount of compounds represented by the formulae (A), (B) and (C).

The condensation polymerization may be carried out in the absence of a solvent or may be carried out in the presence of a solvent, and usually, it is carried out in the presence of an organic solvent.

The organic solvent includes toluene, xylene, mesitylene, tetrahydrofuran, 1,4-dioxane, dimethoxyethane, N,N-dimethylacetamide, N,N-dimethylformamide and the like. In general, it is desirable to carry out a deoxidation treatment, for suppressing side reactions. The organic solvents may be used singly or in combination of two or more.

The use amount of the organic solvent is so regulated that the total concentration of compounds represented by the formulae (A), (B) and (C) is usually 0.1 to 90 wt %, preferably 1 to 50 wt %, more preferably 2 to 30 wt %.

The reaction temperature of condensation polymerization is preferably −100 to 200° C., more preferably −80 to 150° C., further preferably 0 to 120° C.

The reaction time is usually 1 hour or more, preferably 2 to 500 hours.

The condensation polymerization is carried out under dehydration conditions if $X^{a1}$, $X^{a2}$, $X^{b1}$, $X^{b2}$, $X^{c1}$ or $X^{c2}$ in the formulae (A), (B) and (C) is a group represented by $-MgY^1$.

In the condensation polymerization, a compound represented by the following formula (F) may be used as a chain terminator, for avoiding retention of a polymerization active group at the end of the polymer compound of the present invention. By this, a polymer compound can be obtained of which end is substituted by an aryl group or a monovalent aromatic heterocyclic group.

$$X^f - Ar^9 \quad (F)$$

wherein $Ar^9$ represents an aryl group or a monovalent aromatic heterocyclic group; $X^f$ represents a bromine atom, an iodine atom, a chlorine atom, $-O-S(=O)_2R^{20}$, $-B(OR^{21})_2$, $-BF_4Q^1$, $-Sn(R^{22})_3$, $-MgY^1$ or $ZnY^1$; $R^{20}$, $R^{21}$, $R^{22}$, $Q^1$ and $Y^1$ have the same meaning as described above.

The aryl group and monovalent aromatic heterocyclic group represented by $Ar^9$ in the formula (F) are the same as explained and exemplified as the aryl group and monovalent aromatic heterocyclic group in the formula (1).

The post-treatment of condensation polymerization can be carried out by a known method, for example, by a method in which a reaction solution obtained by the above-described condensation polymerization is added to a lower alcohol such as methanol and the like thereby causing deposition of a precipitate which is then filtrated and dried.

When the purity of the polymer compound of the present invention is low, the polymer compound may advantageously be purified by a usual method such as re-crystallization, continuous extraction by a Soxhlet extractor, column chromatography and the like, and when the polymer compound of the present invention is used in a light emitting device, its purity exerts an influence on the performance of a device such as a light emission property and the like, thus, it is preferable, after condensation polymerization, to perform a refinement treatment such as re-precipitation purification, chromatographic fractionation and the like.

—Phosphorescence Emitting Compound—

The phosphorescence emitting compound includes known compounds such as triplet light emitting complexes and the like, and compounds conventionally used as low molecular weight light emitting materials for organic EL devices. The phosphorescence emitting compounds are described in Nature, (1998), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852, Inorg. Chem., (2003), 42, 8609, Inorg. Chem., (2004), 43, 6513, Journal of the SID 11/1, 161 (2003), WO2002/066552, WO2004/020504, WO2004/020448 and the like. For the phosphorescence emitting compound, it is preferable that, in HOMO of a metal complex, the proportion of the sum of the squares of the orbital coefficients of the outermost d-orbitals of the center metal in the sum of the squares of all atomic orbital coefficients is ⅓ or more, from the standpoint of obtaining high light emission efficiency, and ortho metallized complexes in which the center metal is a transition metal belonging to the VI period and the like are listed.

As the center metal of the triplet light emitting complex, there are usually mentioned metal atoms having an atomic number of 50 or more, manifesting a spin-orbital interaction to the complex, and capable of causing intersystem crossing between a singlet state and a triplet state. Preferable as the center metal are gold, platinum, iridium, osmium, rhenium, tungsten, europium, terbium, thulium, dysprosium, samarium, praseodymium, gadolinium and ytterbium, more preferable are gold, platinum, iridium, osmium, rhenium and tungsten, further preferable are gold, platinum, iridium, osmium and rhenium, particularly preferable are gold, platinum, iridium and rhenium, especially preferable are platinum and iridium.

The ligand of the triplet light emitting complex includes 8-quinolinol and derivatives thereof, benzoquinolinol and derivatives thereof, 2-phenyl-pyridine and derivatives thereof, and the like.

The phosphorescence emitting compound is preferably a compound having a substituent such as an alkyl group, an alkoxy group, an optionally substituted aryl group, an optionally substituted heteroaryl group, and the like, from the standpoint of solubility. In this substituent, the total number of atoms other than a hydrogen atom is preferably 3 or more, more preferably 5 or more, further preferably 7 or more, particularly preferably 10 or more. It is preferable that this substituent is present on every ligand, and the kinds of the substituents may be identical or different between the ligands.

The phosphorescence emitting compound includes the following compounds.
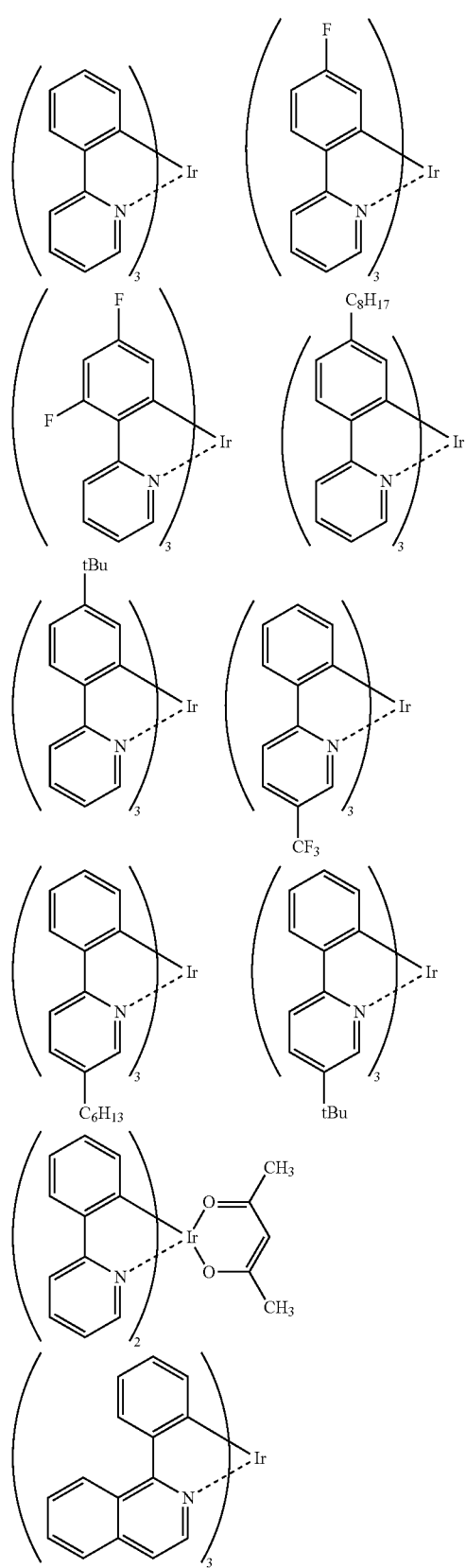
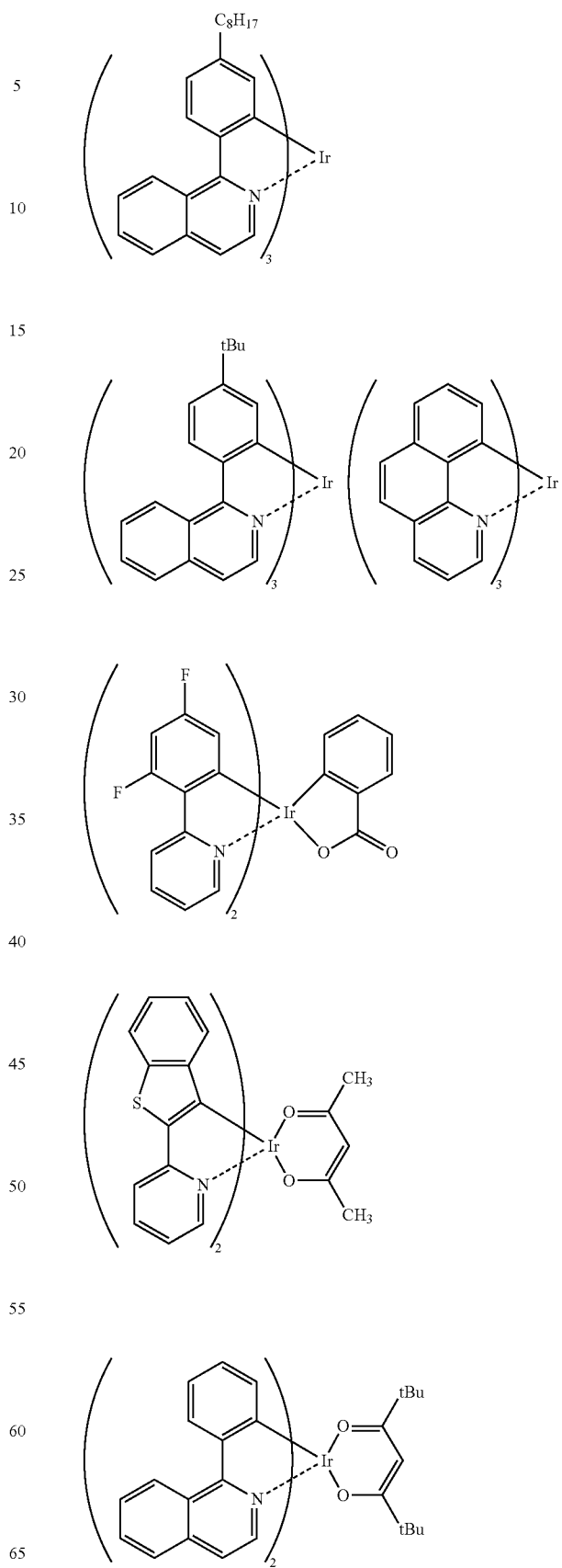

-continued

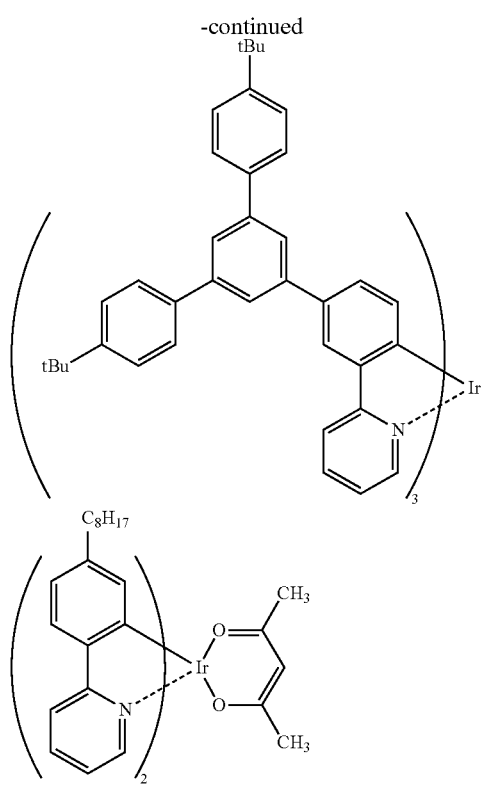

"The constitutional unit derived from a phosphorescence emitting compound" which can be contained in the polymer compound of the present invention includes arylene groups or divalent aromatic heterocyclic groups having as a substituent a residue remaining after removal of one hydrogen atom from a phosphorescence emitting compound, residues remaining after removal of two hydrogen atoms from the above-described phosphorescence emitting compound, and residues remaining after removal of three hydrogen atoms from the above-described phosphorescence emitting compound. When this constitutional unit is a residue remaining after removal of three hydrogen atoms from the phosphorescence emitting compound, the polymer compound of the present invention is branched in the constitutional unit. In the polymer compound of the present invention, the proportion of the total molar amount of constitutional units derived from a phosphorescence emitting compound relative to the total molar amount of all constitutional units is usually 0.0001 to 0.4, preferably 0.001 to 0.3, more preferably 0.001 to 0.25.

—Compound as Monomer—

As the compound represented by the formula (A), there are mentioned compounds containing constitutional units exemplified in the above-described section of the constitutional unit represented by the formula (1) (constitutional units represented by the formulae 1-001 to 1-018, 1-101 to 1-115, and 1-201 to 1-205, and these constitutional units having a substituent) having two connecting bonds one of which is substituted by a group represented by $X^{a1}$ and another of which is substituted by a group represented by $X^{a2}$.

As the method of producing the compound represented by the formula (A), known reactions can be used. For example, the compound represented by the formula (A) can be synthesized according to the following reaction scheme (1).

reaction scheme (1)

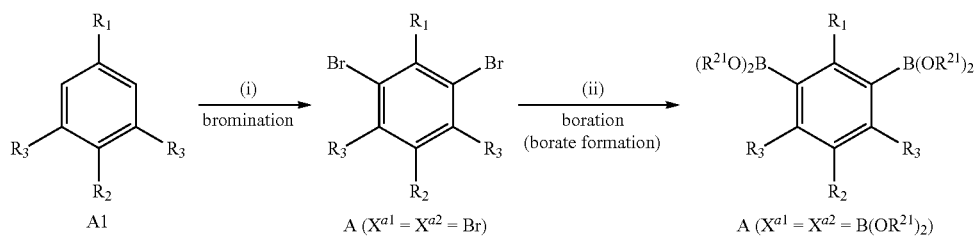

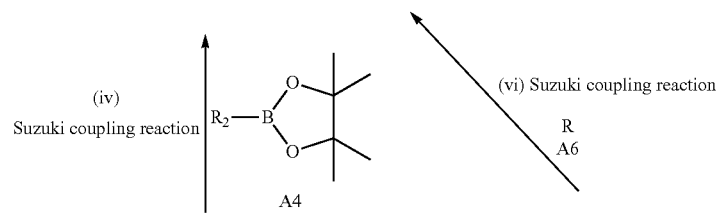

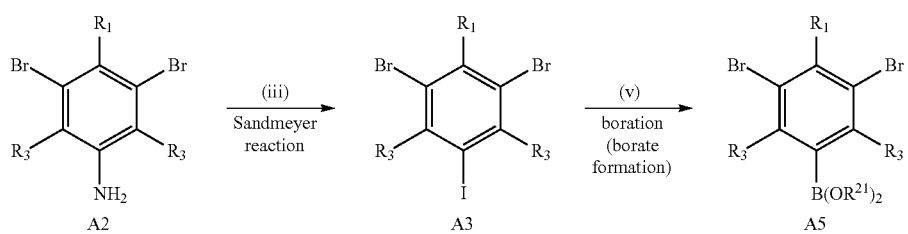

As one example, the reaction scheme (1) will be explained below.

—Step (i)—

A compound ($X^{a1}$=$X^{a2}$=Br) can be synthesized by allowing bromine to act on a compound A1 in the presence of a catalytic amount of an iron powder in a chloroform solvent.

—Step (ii)—

A monomer A ($X^{a1}$=$X^{a2}$=B(OR$^{21}$)$_2$) can be synthesized by performing borate formation of a compound ($X^{a1}$=$X^{a2}$=Br) in a tetrahydrofuran solvent by preparing a Grignard intermediate with a magnesium piece, subsequently, allowing 2-isopropyloxy-4,4,5,5-tetramethyl-1,3,2-dioxaborolane or the like to act, or by performing boration by allowing trimethoxyborane, triisopropyloxyborane or the like to act, then, carrying out hydrolysis thereof.

—Step (iii)—

A compound A3 can be synthesized by allowing sodium nitrite to act on a compound A2 for diazotation in hydrochloric acid, then, treating this with potassium iodide (Sandmeyer reaction) for iodination.

—Step (iv)—

The compound A3 and a compound A4 can be coupled by the Suzuki coupling reaction in a tetrahydrofuran solvent to synthesize a compound ($X^{a1}$=$X^{a2}$=Br). Since a bromine atom and an iodine atom are present as a substituent in the compound A3 under this condition, conditions for a selective reaction of an iodine atom are preferable. These conditions are described in Journal of Organic Chemistry 2005. 70. 3730-3733.

—Step (v)—

A compound A5 can be synthesized by performing borate formation by allowing a tetrahydrofuran solution of isopropyloxymagnesium chloride to act on the compound A3 in a tetrahydrofuran solvent to prepare a Grignard intermediate, subsequently, allowing 2-isopropyloxy-4,4,5,5-tetramethyl-1,3,2-dioxaborolane or the like to act, or by performing boration by allowing trimethoxyborane, triisopropyloxyborane or the like to act, then, carrying out hydrolysis thereof.

—Step (vi)—

The compound A5 and a compound A6 can be coupled by the Suzuki coupling reaction in a tetrahydrofuran solvent to synthesize a compound ($X^{a1}$=$X^{a2}$=Br). In this case, a bromine atom and B(OR$^{21}$)$_2$ are present as a substituent in the compound A5 and an iodine atom is present as a substituent in the compound A6, and conditions for a selective reaction of an iodine atom are preferable. These conditions are described in Journal of Organic Chemistry 2005. 70. 3730-3733.

The above-described compound represented by the formula (1a) can be synthesized, for example, via the steps (iii), (iv) and (ii) in the above-described reaction scheme (1).

The above-described compound represented by the formula (1b) can be synthesized, for example, via the steps (iii), (v), (vi) and (ii) in the above-described reaction scheme (1).

The above-described compound represented by the formula (1c) can be synthesized by causing reflux by heating the compound A2 in the above-described reaction scheme (1) and aryl iodide in the presence of a base such as potassium carbonate, tert-butoxysodium and the like, and a catalytic amount of cuprous chloride, phenanthroline or bipyridine, in a toluene solvent (Ullmann coupling reaction).

<Composition>

The composition of the present invention contains the polymer compound of the present invention, and at least one material selected from the group consisting of a hole transporting material, an electron transporting material and a light emitting material. The composition of the present invention can be used as a light emitting material, a hole transporting material or an electron transporting material. In the composition of the present invention, the polymer compound of the present invention, hole transporting material, electron transporting material and light emitting material may each be used singly or in combination of two or more.

In the composition of the present invention, regarding the ratio of "at least one material selected from the group consisting of a hole transporting material, an electron transporting material and a light emitting material" to the polymer compound of the present invention, the proportion of "at least one material selected from the group consisting of a hole transporting material, an electron transporting material and a light emitting material" relative to 100 parts by weight of the polymer compound of the present invention is, for each material, usually 0.01 to 400 parts by weight, preferably 0.05 to 150 parts by weight, when the composition of the present invention is used for a light emitting material.

The hole transporting material includes polyvinylcarbazole and derivatives thereof, polysilane and derivatives thereof, polysiloxane derivatives having an aromatic amine on its side chain or main chain, pyrazoline derivatives, arylamine derivatives, stilbene derivatives, polyaniline and derivatives thereof, polythiophene and derivatives thereof, polyarylamine and derivatives thereof, polypyrrole and derivatives thereof, poly(p-phenylenevinylene) and derivatives thereof, poly(2,5-thienylenevinylene) and derivatives thereof, and the like, known as the hole transporting material of an organic EL device. Here, these derivatives may have an arylene group and a divalent aromatic heterocyclic group as a copolymerization component (constitutional unit).

The electron transporting material includes oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivative, metal complexes of 8-hydroxyquinoline and derivatives thereof, triaryltriazine and derivatives thereof, polyquinoline and derivatives thereof, polyquinoxaline and derivatives thereof, polyfluorene and derivatives thereof, and the like, known as the electron transporting material of an organic EL device. Here, these derivatives may have an arylene group and a divalent aromatic heterocyclic group as a copolymerization component (constitutional unit).

As the light emitting material, materials containing the above-described phosphorescence emitting compound are preferable from the standpoint of light emission efficiency. Additionally, fluorescence emitting compounds can also be used as the above-described light emitting material. The fluorescence emitting compound includes low molecular weight fluorescent materials and high molecular weight fluorescent materials. The low molecular weight fluorescent material is usually a material having the maximum peak of fluorescence emission in the wavelength range of 400 to 700 nm, and its molecular weight is usually less than 3000, preferably 100 to 2000, more preferably 100 to 1000.

The low molecular weight fluorescent material includes dye materials such as naphthalene derivatives, anthracene and derivatives thereof, perylene and derivatives thereof, quinacridone derivatives, xanthene dyes, coumarin dyes, cyanine dyes, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, olligothiophene derivatives and the like; metal complex type materials such as alumiquinolinol complexes, benzoquinolinolberyllium complexes, benzooxazolyl zinc complexes, benzothiazole zinc complexes, azomethyl zinc complexes, porphyrin zinc complexes, europium complexes and the like, and metal complexes having Al, Zn, Be and the like or a rare earth metal such as Tb, Eu, Dy and the like as the center metal and having oxadiazole, thiadiazole, phenylpyridine, phenylbenzoimidazole, quinolone structure or the like as a ligand, and the like, known as the light emitting material of an organic EL device.

The high molecular weight fluorescent material includes polyparaphenylenevinylene derivatives, polythiophene derivatives, polyparaphenylene derivatives, polysilane derivatives, polyacetylene derivatives, polyfluorene derivatives, polyvinylcarbazole derivatives, and materials obtained by increasing the molecular weight of the dyes and metal complex type light emitting materials exemplified as the above-described low molecular weight fluorescent material.

In the composition of the present invention, the components such as the polymer compound of the present invention and the like may each be used singly or in combination of two or more.

When the composition of the present invention is a composition containing a phosphorescence emitting compound, the proportion of the phosphorescence emitting compound is usually 0.01 to 80 parts by weight, preferably 0.1 to 50 parts by weight, relative to 100 parts by weight of the polymer compound of the present invention.

<Solution>

The solution of the present invention is a solution containing the polymer compound of the present invention and a solvent, or a solution composed of the composition of the present invention containing a solvent. This solution is useful for a printing method and the like, and in general, called an ink, an ink composition or the like, in some cases. The solution of the present invention may contain, if necessary, a hole transporting material, an electron transporting material, a light emitting material, a stabilizer, a thickening agent (high molecular weight compound for enhancing viscosity), a low molecular weight compound for lowering viscosity, a surfactant, an antioxidant, a high molecular weight compound other than the polymer compound of the present invention, and the like. The components contained in the solution of the present invention may each be used singly or in combination of two or more.

The proportion of the polymer compound of the present invention in the solution of the present invention is usually 0.1 to 99 parts by weight, preferably 0.5 to 40 parts by weight, more preferably 0.5 to 20 parts by weight, relative to 100 parts by weight of the whole solution.

The viscosity of the solution of the present invention may be adjusted depending on the kind a printing method, and the viscosity at 25° C. is preferably in the range of 1 to 20 mPa·s, for preventing clogging and flying curving in discharging, when the solution passes through a discharge apparatus such as in an inkjet print method and the like.

The thickening agent may advantageously be an agent which is soluble in the same solvent as for the polymer compound of the present invention and which does not disturb light emission and charge transportation, and use can be made of high molecular weight polystyrene, high molecular weight polymethyl methacrylate and the like. The compound used as the thickening agent has a polystyrene-equivalent weight average molecular weight of preferably $5 \times 10^5$ or more, more preferably $1 \times 10^6$ or more.

The antioxidant is an agent for improving the preservation stability of the solution. The antioxidant may advantageously be an agent which is soluble in the same solvent as for the polymer compound of the present invention and which does not disturb light emission and charge transportation, and includes a phenol antioxidant, a phosphorus antioxidant and the like.

As the solvent constituting the solution of the present invention, preferable are those capable of dissolving or uniformly dispersing solid components as a solute. The solvent includes chlorine-based solvents such as chloroform, methylene chloride, 1,2-dichloroethane, 1,1,2-trichloroethane, chlorobenzene, o-dichlorobenzene and the like; ether solvents such as tetrahydrofuran, dioxane, anisole and the like; aromatic hydrocarbon solvents such as toluene, xylene and the like; aliphatic hydrocarbon solvents such as cyclohexane, methylcyclohexane, n-pentane, n-hexane, n-heptane, n-octane, n-nonane, n-decane and the like; ketone solvents such as acetone, methyl ethyl ketone, cyclohexanone, benzophenone, acetophenone and the like; ester solvents such as ethyl acetate, butyl acetate, ethyl cellosolve acetate, methyl benzoate, phenyl acetate and the like; polyhydric alcohols such as ethylene glycol, ethylene glycol monobutyl ether, ethylene glycol monoethyl ether, ethylene glycol monomethyl ether, dimethoxyethane, propyrene glycol, diethoxymethane, triethylene glycol monoethyl ether, glycerin, 1,2-hexane diol and the like, and derivatives thereof; alcohol solvents such as methanol, ethanol, propanol, isopropanol, cyclohexanol and the like; sulfoxide solvents such as dimethyl sulfoxide and the like; amide solvents such as N-methyl-2-pyrrolidone, N,N-dimethylformamide and the like. These solvents may be used singly or in combination of two or more.

It is preferable to use two or more solvents, it is more preferable to use two to three solvents and it is particularly preferable to use two solvents, from the standpoint of film formability, device property and the like.

When two solvents are contained in the solution of the present invention, one of them may be solid at 25° C. From the standpoint of film formability, it is preferable that one solvent has a boiling point of 180° C. or higher, more preferably a boiling point of 200° C. or higher. From the standpoint of viscosity, it is preferable that the polymer compound of the present invention is dissolved at a concentration of 1 wt % or more at 60° C. in both two solvents, and it is preferable that the polymer compound of the present invention is dissolved at a concentration of 1 wt % or more at 25° C. in one of the two solvents.

When two or more solvents are contained in the solution of the present invention, the content of a solvent having the highest boiling point is preferably 40 to 90 wt %, more preferably 50 to 90 wt %, and further preferably 65 to 85 wt % relative to the weight of all solvents contained in the solution, from the standpoint of viscosity and film formability.

The solution of the present invention may further contain water, metals and salts thereof, silicon, phosphorus, fluorine, chlorine, bromine and the like in an amount of 1 to 1000 ppm by weight. The above-described metals include lithium, sodium, calcium, potassium, iron, copper, nickel, aluminum, zinc, chromium, manganese, cobalt, platinum, iridium and the like.

<Film>

The film of the present invention contains the polymer compound of the present invention, and is a light emitting film, an electric conductive film, an organic semiconductor film or the like.

The film of the present invention can be fabricated by a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet print method, a capillary coat method, a nozzle coat method and the like.

When a film is fabricated using the solution of the present invention, it is possible to performing baking usually at a temperature of 100° C. or higher (for example, 130° C., 160° C.), though varying depending on the glass transition temperature of the polymer compound contained in the solution.

The light emitting film has a light emission quantum yield of preferably 30% or more, more preferably 40% or more, further preferably 50% or more, particularly preferably 60% or more, from the standpoint of the luminance and light emission voltage of a device.

The electric conductive film has a surface resistance of preferably 1 KΩ/□ or less, more preferably 100Ω/□ or less, further preferably 10Ω/□ or less. By doping the electric conductive film with a Lewis acid, ionic compound or the like, electric conductivity can be enhanced.

In the organic semiconductor film, one larger parameter of electron mobility or hole mobility is preferably $10^{-5}$ cm²/V/s or more, more preferably $10^{-3}$ cm²/V/s or more, particularly preferably $10^{-1}$ cm²/V/s or more. By forming the organic semiconductor film on a Si substrate carrying a gate electrode and an insulation film made of $SiO_2$ and the like formed thereon, and forming a source electrode and a drain electrode with Au and the like, an organic transistor can be fabricated.

<Light Emitting Device>

The light emitting device of the present invention is a light emitting device having electrodes consisting of an anode and a cathode, and an organic layer containing the polymer compound of the present invention disposed between the electrodes. The above-described organic layer may be composed of one layer or may be composed of two or more layers, and when composed of two or more layers, at least one of them may advantageously contain the above-described polymer compound. The organic layer containing the polymer compound functions usually as a light emitting layer, a hole transporting layer or an electron block layer, and preferably, the organic layer functions as a light emitting layer. In addition to the anode, the cathode and the organic layer functioning as a light emitting layer (hereinafter, referred to simply as "light emitting layer"), the light emitting device of the present invention may contain other layers between them. In the light emitting device, each layer may be composed of one layer or composed of two or more layers. The materials and compounds constituting each layer may be used singly or in combination of two or more.

The layer disposed between an anode and a light emitting layer includes a hole injection layer, a hole transporting layer, an electron block layer and the like. When only one layer is disposed between the anode and light emitting layer, it is a hole injection layer, and when two or more layers are disposed between the anode and light emitting layer, the layer next to an anode is a hole injection layer and other layers are hole transporting layers. The above-described hole injection layer is a layer having a function of improving hole injection efficiency from a cathode. The above-described hole transporting layer is a layer having a function of improving hole injection from a hole injection layer or a layer nearer to an anode. When a hole injection layer and a hole transporting layer have a function of blocking transportation of electrons, these layers are electron block layers. The function of blocking transportation of electrons can be confirmed by fabricating a device allowing only electron current and measuring decrease in its current value.

The layer disposed between a cathode and a light emitting layer includes an electron injection layer, an electron transporting layer, a hole block layer and the like. When only one layer is disposed between a cathode and a light emitting layer, it is an electron injection layer, and when two or more layers are disposed between a cathode and a light emitting layer, the layer next to a cathode is an electron injection layer and other layers are electron transporting layers. The electron injection layer is a layer having a function of improving electron injection efficiency from a cathode. The electron transporting layer is a layer having a function of improving electron injection from an electron injection layer or a layer nearer to a cathode. When an electron injection layer and an electron transporting layer have a function of blocking transportation of holes, these layers are called a hole block layer in some cases. The function of blocking transportation of holes can be confirmed by fabricating a device allowing only hole current and measuring decrease in its current value.

The structure of the light emitting device of the present invention includes the following structures a) to d).

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (here, "/" means adjacent lamination of layers, the same shall apply hereinafter).

Among hole transporting layers and electron transporting layers disposed adjacent to an electrode, those having a function of improving charge (hole, electron) injection efficiency from an electrode and having an effect of lowering the driving voltage of a device are called a charge injection layer (hole injection layer, electron injection layer) in some cases.

Further, for improving close adherence with an electrode and improving charge injection from an electron, the above-described charge injection layer and insulation layer may be disposed next to an electrode. For improving close adherence of an interface and preventing mixing, a thin buffer layer may be inserted into an interface of the above-described charge transporting layer and light emitting layer. The order and number of layers to be laminated, and the thickness of each layer may be adjusted in view of light emission efficiency and device life.

The structure of the light emitting device of the present invention having a charge injection layer includes the following structures e) to p).

e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transporting layer/light emitting layer/cathode
i) anode/hole transporting layer/light emitting layer/charge injection layer/cathode
j) anode/charge injection layer/hole transporting layer/light emitting layer/charge injection layer/cathode
k) anode/charge injection layer/light emitting layer/electron transporting layer/cathode
l) anode/light emitting layer/electron transporting layer/charge injection layer/cathode
m) anode/charge injection layer/light emitting layer/electron transporting layer/charge injection layer/cathode
n) anode/charge injection layer/hole transporting layer/light emitting layer/electron transporting layer/cathode
o) anode/hole transporting layer/light emitting layer/electron transporting layer/charge injection layer/cathode
p) anode/charge injection layer/hole transporting layer/light emitting layer/electron transporting layer/charge injection layer/cathode The anode is usually transparent or semi-transparent and constituted of film of a metal oxide, a metal sulfide or a metal having high electric conductivity, and particularly, the anode is preferably constituted of a material of high transmission. As the material of the anode, use is made of films (NESA and the like) fabricated using electric conductive inorganic compounds composed of indium oxide, zinc oxide, tin oxide, and composite thereof: indium.tin.oxide (ITO), indium.zinc.oxide and the like; and gold, platinum, silver, copper and the like, and ITO, indium.zinc.oxide and tin oxide are preferable. For fabrication of the anode, a vacuum vapor-deposition method, a sputtering method, an ion plating method, a plating method and the like can be used. As the anode, organic transparent electric conductive films made of polyaniline and its derivatives, polythiophene and its derivatives, and the like may be used.

The thickness of the anode can be selected in view of light transmission and electric conductivity, and it is usually 10 nm to 10 μm, preferably 20 nm to 1 μm, more preferably 50 nm to 500 nm.

The material used in the hole injection layer includes phenyl amines, starburst type amines, phthalocyanines, oxides such as vanadium oxide, molybdenum oxide, ruthenium oxide, aluminum oxide and the like, amorphous carbon, electric conductive polymers such as polyaniline and derivatives thereof, polythiophene and derivatives thereof, and the like.

When the material used in the hole injection layer is an electric conductive polymer, anions such as a polystyrenesulfonic ion, an alkylbenzenesulfonic ion, a camphor sulfonic ion and the like may be doped, if necessary, for improving the electric conductivity of the electric conductive polymer and the polymer compound.

The material used in the hole transporting layer includes those explained and exemplified as the above-described hole transporting material. When the material used in the hole transporting layer is a low molecular weight compound, it is preferably dispersed in a polymer binder in use.

When the polymer compound of the present invention is used in the hole transporting layer, it is preferable that the polymer compound of the present invention contains a hole transporting group (aromatic amino group, thienyl group or the like) as a constitutional unit and/or a substituent of the polymer compound.

Among them, preferable as the hole transporting material to be used in the hole transporting layer are polyvinylcarbazole and derivatives thereof, polysilane and derivatives thereof, polysiloxane derivatives having an aromatic amine on its side chain or main chain, and polyarylamine and derivatives thereof, and in addition, the polymer compound of the present invention.

As the method of film formation of the hole transporting layer, film formation from a mixed solution with a polymer binder is used when the material used in the hole transporting layer is a low molecular weight compound, and film formation from a solution is used in the case of a high molecular weight compound.

The solvent used for film formation from a solution may advantageously be one which dissolves materials used in the hole transporting layer. The solvent includes chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, ester solvents such as ethyl acetate, butyl acetate, ethylcellosolve acetate and the like.

For film formation from a solution, there can be used application methods from a solution such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet print method and the like.

As the polymer binder, those not extremely disturbing charge transportation are preferable, and those showing no strong absorption against visible light are suitably used. The polymer binder includes polycarbonate, polyacrylate, polymethyl acrylate, polymethyl methacrylate, polystyrene, polyvinyl chloride, polysiloxane and the like.

The thickness of the hole transporting layer may be selected in view of driving voltage and light emission efficiency, and a thickness causing no formation of pin holes is necessary, and when the thickness is too large, the driving voltage of a device increases in some cases. Therefore, the thickness of the hole transporting layer is usually 1 nm to 1 μm, preferably 2 nm to 500 nm, further preferably 5 nm to 200 nm.

The light emitting layer is usually formed from an organic compound emitting fluorescence or phosphorescence (low molecular weight compound, high molecular weight compound), and a dopant aiding this if necessary. In the light emitting layer in the light emitting device of the present invention, the polymer compound of the present invention, the above-described light emitting material and the like are contained. When the light emitting material is a low molecular weight compound, it is preferably dispersed in a polymer binder in use.

To the light emitting layer, a dopant can be added for improving light emission efficiency and changing light emission wavelength. The dopant includes anthracene derivatives, perylene derivatives, coumarin derivatives, rubrene derivatives, quinacridone derivatives, squalium derivatives, porphyrin derivatives, styryl dyes, tetracene derivatives, pyrazolone derivatives, decacyclene, phenoxazone and the like.

The thickness of the light emitting layer may be selected in view of driving voltage and light emission efficiency, and is usually 2 to 200 nm.

For film formation of the light emitting layer, there can be used a method in which a solution containing a light emitting material is coated on or above a substrate, a vacuum vapor deposition method, a transfer method and the like. The solvent used for film formation from a solution is the same as explained and exemplified in the section of film formation from a solution of a hole transporting layer. For coating a solution containing a light emitting material on or above a substrate, there can be used printing methods such as a spin coat method, a dip coat method, an inkjet method, a flexo printing method, a gravure printing method, a slit coat method and the like. In the case of a sublimating low molecular weight compound, a vacuum vapor deposition method can be used. Use can be made also of a method of forming a light emitting layer at a desired position, by laser transfer or thermal transfer.

As the material to be used in the electron transporting layer, there are mentioned the polymer compound of the present invention, the above-described electron transporting material and the like.

When the polymer compound of the present invention is used in the electron transporting layer, it is preferable that the polymer compound of the present invention contains an electron transporting group (oxadiazole group, oxathiadiazole group, pyridyl group, pyrimidyl group, pyridazyl group, triazyl group or the like) as a constitutional unit and/or a substituent of the polymer compound.

Of them, preferable as the electron transporting material used in the electron transporting layer are the polymer compound of the present invention, oxadiazole derivatives, benzoquinone and derivatives thereof, anthraquinone and derivatives thereof, metal complexes of 8-hydroxyquinoline and derivatives thereof, polyquinoline and derivatives thereof, polyquinoxaline and derivatives thereof, and polyfluorene and derivatives thereof.

For film formation of the electron transporting layer, a vacuum vapor deposition method from a powder and a method of film formation from a solution or melted condition are used when the material used in the electron transporting layer is a low molecular weight compound, and a method of film formation from a solution or melted condition is used when the material used in the electron transporting layer is a high molecular weight compound. For film formation from a solution or melted condition, a polymer binder may be used together. The film formation from a solution may be the same as the above-described method of forming a hole transporting layer from a solution.

The thickness of the electron transporting layer may be adjusted in view of driving voltage and light emission efficiency, and a thickness causing no formation of pin holes is necessary, and when the thickness is too large, the driving voltage of a device increases in some cases. Therefore, the thickness of the electron transporting layer is usually 1 nm to 1 µm, preferably 2 nm to 500 nm, further preferably 5 nm to 200 nm.

The electron injection layer includes, depending on the kind of a light emitting layer, an electron injection layer having a single layer structure composed of a Ca layer, or an electron injection layer having a lamination structure composed of a Ca layer and a layer formed of one or two or more materials selected from the group consisting of metals belonging to group IA and group IIA of the periodic table of elements and having a work function of 1.5 to 3.0 eV excluding Ca, and oxides, halides and carbonates of the metals. As the metals belonging to group IA of the periodic table of elements and having a work function of 1.5 to 3.0 eV or oxides, halides and carbonates thereof, listed are lithium, lithium fluoride, sodium oxide, lithium oxide, lithium carbonate and the like. As the metals belonging to group IIA of the periodic table of elements and having a work function of 1.5 to 3.0 eV excluding Ca, or oxides, halides and carbonates thereof, listed are strontium, magnesium oxide, magnesium fluoride, strontium fluoride, barium fluoride, strontium oxide, magnesium carbonate and the like.

The electron injection layer may be formed by a vapor deposition method, a sputtering method, a printing method and the like. The thickness of the electron injection layer is preferably 1 nm to 1 µm.

As the material of the cathode, materials having a small work function and providing easy injection of electrons into a light emitting layer are preferable, and use is made of metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys composed of two or more of the above-described metals, or alloys composed of at least one of them and at least one of gold, silver, platinum, copper, manganese, titanium, cobalt, nickel, tungsten and tin, and, graphite or graphite intercalation compounds, and the like.

The above-described alloy includes a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like.

When the cathode has a laminated structure consisting of two or more layers, preferable is a laminated structure composed of the above-described metal, metal oxide, metal fluoride or alloy thereof and of a metal such as aluminum, silver, chromium and the like.

The thickness of the cathode may be advantageously selected in view of electric conductivity and durability, and it is usually 10 nm to 10 µm, preferably 20 nm to 1 µm, more preferably 50 nm to 500 nm.

For fabrication of the cathode, a vacuum vapor deposition method, a sputtering method, a lamination method of thermally press-binding a metal film, and the like are used. After fabrication of the cathode, a protective layer for protecting a light emitting device may be installed. For use of a light emitting device stably for a long period of time, it is preferable to install a protective layer and/or a protective cover, for protecting the light emitting device from outside.

As the protective layer, high molecular weight compounds, metal oxides, metal fluorides, metal borides and the like can be used. As the protective cover, a metal plate, a glass plate, and a plastic plate having a surface which has been subjected to a low water permeation treatment, and the like can be used. As the protective method, a method in which the protective cover is pasted to a device substrate with a thermosetting resin or a photo-curing resin to attain sealing is used. When a space is kept using a spacer, blemishing of a device can be prevented easily. If an inert gas such as nitrogen, argon and the like is filled in this space, oxidation of a cathode can be prevented, further, by placing a drying agent such as barium oxide and the like in this space, it becomes easy to suppress moisture adsorbed in a production process or a small amount of water invaded through a hardened resin from imparting a damage to the device. It is preferable to adopt at least one strategy among these methods.

The light emitting device of the present invention can be used as a planar light source, a display (segment displays, dot matrix display), back light of a liquid crystal display, or the like. For obtaining light emission in the form of plane using the light emitting device of the present invention, a planar anode and a planar cathode may advantageously be placed so as to overlap. For obtaining light emission in the form of pattern, there are a method in which a mask having a window in the form of pattern is placed on the surface of the planar light emitting device, a method in which an organic layer in non-light emitting parts is formed with extremely large thickness to give substantially no light emission, and a method in which either an anode or a cathode, or both electrodes are formed in the form of pattern. By forming a pattern by any of these methods, and placing several electrodes so that on/off is independently possible, a display of segment type is obtained which can display digits, letters, simple marks and the like. Further, for providing a dot matrix device, it may be advantageous that both an anode and a cathode are formed in the form of stripe, and placed so as to cross. By using a method in which several polymer compounds showing different emission colors are painted separately or a method in which a color filter or a fluorescence conversion filter is used, partial color display and multi-color display are made possible. In the case of a dot matrix device, passive driving is possible, and active driving may be carried out in combination with TFT and the like. These display devices can be used as a display of a computer, a television, a portable terminal, a cellular telephone, a car navigation, a view finder of a video camera, and the like. Further, the planar light emitting device is of self emitting and thin type, and can be suitably used as a planar light source for back light of a liquid crystal display, or as a planar light source for illumination, and the like. If a flexible substrate is used, it can also be used as a curved light source or display.

EXAMPLES

The present invention will be illustrated further in detail by examples below.

(Number Average Molecular Weight and Weight Average Molecular Weight)

In examples, the polystyrene-equivalent number average molecular weight (Mn) and the polystyrene-equivalent weight average molecular weight (Mw) were measured by GPC (manufactured by Shimadzu Corp., trade name: LC-10 Avp). A polymer compound to be measured was dissolved in tetrahydrofuran so as to give a concentration of about 0.5 wt %, and 30 µL of the solution was injected into GPC. Tetrahydrofuran was used as the mobile phase of GPC, and allowed to flow at a flow rate of 0.6 mL/min. As the column, two TSKgel Super HM-H (manufactured by Tosoh Corp.) and one TSKgel Super H2000 (manufactured by Tosoh Corp.) were connected serially. A differential refractive index detector (manufactured by Shimadzu Corp., trade name: RID-10A) was used as a detector.

(High Performance Liquid Chromatography (HPLC))

In examples, the value of HPLC area percentage as an index of the purity of a compound was measured by high performance liquid chromatography (HPLC, manufactured by Shimadzu Corp., trade name: LC-20A) at 254 nm, unless otherwise stated. A compound to be measured was dissolved in tetrahydrofuran or chloroform so as to give a concentration of 0.01 to 0.2 wt %, and 1 to 10 µL of the solution was injected into HPLC, depending on the concentration. Acetonitrile and tetrahydrofuran were used as the mobile phase of HPCL and allowed to flow, at a flow rate of 1 ml/min, by gradient analysis of acetonitrile/tetrahydrofuran=100/0 to 0/100 (volume ratio). Kaseisorb LC ODS 2000 (manufactured by Tokyo Chemical Industry Co., Ltd.) was used as a column. Photodiode Array Detector (manufactured by Shimadzu Corp., trade name: SPD-M20A) was used as a detector.

(Glass Transition Temperature)

In examples, the glass transition temperature (Tg) was measured by a differential scanning calorimeter (DSC, manufactured by TA Instruments, trade name: DSC2920). As measurement conditions, a sample was kept at 200° C. for 5 minutes, then, quenched down to −50° C. and kept for 30 minutes. The temperature was raised up to 30° C., then, the measurement was carried out at a temperature rising rate of 5° C. per minute up to 300° C.

(Evaluation of Fluorescent Property)

In examples, evaluation of a fluorescent property (fluorescence peak wavelength of a film of a polymer compound) was carried out according to the following method. A polymer compound was dissolved in toluene (manufactured by Kanto Chemical Co., Inc., grade for electronic industry). In this operation, the concentration of solid components was adjusted to 0.8 wt %, and the solution was spin-coated on a quartz plate at a revolution of 1500 rpm to fabricate a film of the polymer compound. This film was excited with a wavelength of 350 nm, and the fluorescent spectrum was measured by using a fluorescence spectrophotometer (manufactured by JOBINYVON-SPEX, trade name: Fluorolog).

Example 1

Synthesis of Compound M1

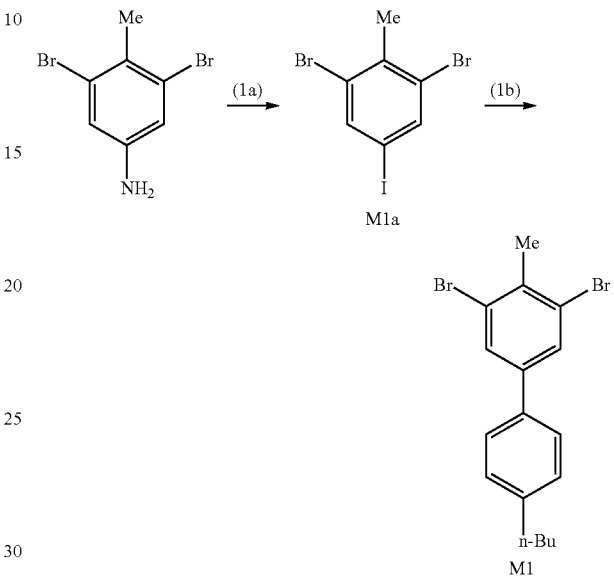

(Step (1a))

Under an argon gas atmosphere, 3,5-dibromo-4-methylaniline (47.0 g, 177 mmol), 35 wt % hydrochloric acid (111 ml) and ion exchanged water (111 ml) were mixed in a 1000 ml flask and cooled in an ice bath, and a solution prepared by dissolving sodium nitrite (12.9 g, 186 mmol) in ion exchanged water (about 130 ml) was dropped into the cooled mixture over a period of about 30 minutes. After completion of dropping, the mixture was stirred at room temperature for about 1 hour, then, cooled in an ice bath again, then, a solution prepared by dissolving potassium iodide (30.9 g, 186 mmol) in ion exchanged water (about 130 ml) was dropped into the cooled mixture over a period of 30 minutes. After completion of dropping, the mixture was stirred at room temperature for about 3 hours, then, added slowly to a separately prepared 10 wt % sodium hydrogen carbonate aqueous solution (about 1200 ml) while stirring. Ethyl acetate (about 1000 ml) was added and extraction was performed, the organic layer was washed with a 10 wt % sodium sulfite aqueous solution (about 450 ml), dried over anhydrous magnesium sulfate (50 g), filtrated, and the filtrate was concentrated to obtain a coarse product (77 g). The above-described coarse product was dissolved in acetone (750 ml), activated carbon (10 g) was added and stirred, then, the mixture was filtrated, and the filtrate was concentrated. It was again dissolved in acetone (750 ml), activated carbon (20 g) was added and stirred, then, the mixture was filtrated, and the filtrate was concentrated, and the deposited solid was dried under reduced pressure to obtain a yellow-brown solid (about 50 g). The resultant solid was dissolved in hexane, and ethanol was added to the solution to cause crystallization, and the resultant crystal was filtrated, and dried under reduced pressure, to obtain an intermediate 2,6-dibromo-4-iodotoluene (28.4 g, yield 43%, compound M1a) as a white crystal.

$^1$H-NMR (300 MHz, CDCl$_3$) δ (ppm)=2.51 (s, 3H), 7.83 (s, 2H)

(Step (1b))

Under an argon gas atmosphere, the compound M1a (7.14 g, 19 mmol) synthesized in the same manner as described above, 4-n-butylbenzeneboronic acid (3.21 g, 18.0 mmol), tetrakis(triphenylphosphine)palladium(0) (0.44 g, 0.38 mmol), silver carbonate (10.5 g, 38 mmol) and dehydrated tetrahydrofuran (190 ml) were mixed, and stirred for 4 hours under shading, then, passed through a filter matted with celite, to remove insoluble materials. The filtrate was concentrated, and purified by middle pressure silica gel column chromatography (hexane), to obtain the intended compound M1 (4.69 g, HPLC area percentage (ultraviolet wavelength 254 nm) 99.6%, yield 65%) as colorless transparent liquid.

$^1$H-NMR (300 MHz, CDCl$_3$) δ (ppm)=0.94 (t, 3H), 1.31-1.43 (m, 2H), 1.56-1.67 (m, 2H), 2.58 (s, 3H), 2.64 (t, 2H), 7.23 (d, 2H), 7.42 (d, 2H), 7.71 (s, 2H) $^{13}$C-NMR (75 MHz, CDCl$_3$) δ (ppm)=13.94, 13.98, 22.35, 23.35, 125.50, 126.71, 129.01, 130.08, 135.41, 135.61, 141.47, 143.09

Example 2

Synthesis of Compound M2

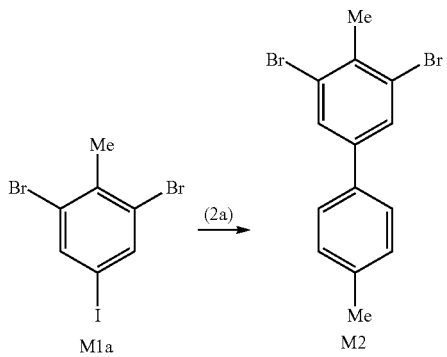

(Step (2a))

Under an argon gas atmosphere, a compound M1a (18.8 g, 50.0 mmol), 4-tolueneboronic acid (6.80 g, 50.0 mmol), tetrakis(triphenylphosphine)palladium(0) (2.89 g, 2.5 mmol), silver carbonate (27.6 g, 100 mmol) and dehydrated tetrahydrofuran (500 ml) were mixed, and stirred at room temperature for 1 hour under shading, then, heated up to 50° C. and further stirred for 2 hours. The mixture was cooled down to room temperature, then, diluted with hexane (about 1000 ml), and passed through a filter matted with celite to remove insoluble materials. The filtrate was concentrated, and to the resultant solid was added methanol (about 1500 ml), and the mixture was stirred for 30 minutes under reflux with heating, then, the mixture was cooled down to room temperature, and passed through a filter matted with celite to remove insoluble materials. The filtrate was concentrated, and purified by middle pressure silica gel column chromatography (hexane), to obtain the intended compound M2 (11.76 g, HPLC area percentage (ultraviolet wavelength 254 nm)>99.9%, yield 69%) as a white crystal.

$^1$H-NMR (300 MHz, THF-d$_8$) δ (ppm)=2.38 (s, 3H), 2.60 (s, 3H), 7.26 (d, 2H), 7.53 (d, 2H), 7.85 (s, 2H)

Example 3

Synthesis of Compound M3

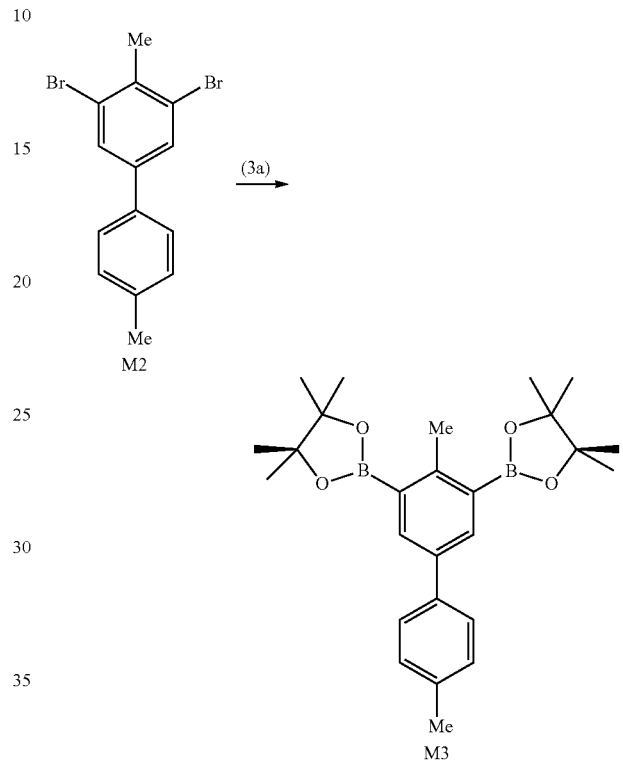

(Step (3a))

Under an argon gas atmosphere, a compound M2 (11.22 g, 33.0 mmol), bis(pinacolato)diborane (25.14 g, 99 mmol), [1,1'-bis(diphenylphosphino)ferrocene]dichloropalladium (II) (1.35 g, 1.65 mmol), 1,1'-bis(diphenylphosphino)ferrocene (0.91 g, 1.65 mmol), potassium acetate (9.72 g, 99 mmol) and dehydrated 1,4-dioxane (264 ml) were mixed, and stirred for about 13 hours under reflux with heating, and further allowed to stand still at room temperature for 10 hours. The mixture was again stirred for 1 hour under reflux with heating, then, bis(pinacolato)diborane (1.68 g, 6.6 mmol) was added, and the mixture was further stirred for 3 hours under reflux with heating. The mixture was cooled down to room temperature, then, insoluble materials were filtrated off, and the residue was concentrated until the content was about 70 g, and hexane (about 500 ml) was added and the mixture was stirred for 1 hour at room temperature. As a result, black solid was deposited. Insoluble materials were removed by passing through a filter matted with silica gel. The filtrate was concentrated to cause deposition of solid, the resultant solid was dissolved in toluene with heating and methanol was added to cause crystallization, and this series of operations were repeated twice, to obtain the intended compound M3 (9.64 g, HPLC area percentage (ultraviolet wavelength 254 nm) 99.0%, yield 67%) as a white crystal.

$^1$H-NMR (300 MHz, THF-d$_8$) δ (ppm)=1.36 (s, 24H), 2.43 (s, 3H), 2.78 (s, 3H), 7.14 (d, 2H), 7.48 (d, 2H), 8.05 (s, 2H)

Synthesis Example 1

Synthesis of Compound M4

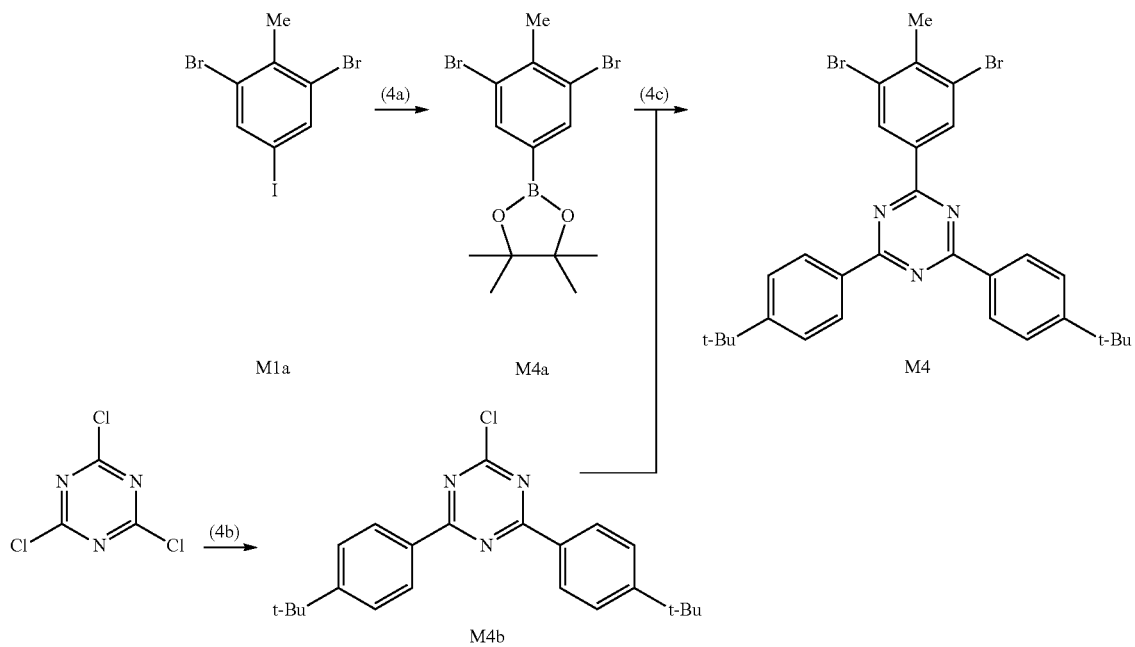

(Step (4a))

Under an argon gas atmosphere, a compound M1a (22.6 g, 60.0 mmol) was dissolved in dehydrated tetrahydrofuran (300 ml) in a 1000 ml flask, and into the resultant solution was dropped a tetrahydrofuran solution of isopropylmagnesium chloride (Manufactured by Aldrich, concentration 2.0M, 60 ml) at room temperature over a period of 10 minutes, and the mixture was stirred at room temperature for 1 hour. After cooling in an ice bath, 2-isopropyloxy-4,4,5,5-tetramethyl-1,3,2-dioxaborolane (22.3 g, 120 mmol) was added, and the mixture was stirred at room temperature for 2 hours, then, cooled in an ice bath again, then, 0.1 N hydrochloric acid (180 ml) was dropped. Extraction was performed with ethyl acetate (360 ml), the organic layer was washed with 15 wt % saline (180 ml) twice, dried over anhydrous sodium sulfate, and filtrated. The filtrate was concentrated, and methanol was added to cause deposition of solid. The deposited solid was filtrated, and dried under reduced pressure, to obtain an intermediate 2,6-dibromo-4-(4,4,5,5-tetramethyl-1,3,2-dioxaborolan-2-yl)toluene (16.3 g, yield 72%, compound M4a) as a white crystal.

$^1$H-NMR (300 MHz, CDCl$_3$) δ (ppm)=1.33 (s, 12H), 2.58 (s, 3H), 7.90 (s, 2H)

(Step (4b))

Under an argon gas atmosphere, 4-bromo-tert-butylbenzene (125 g, 587 mmol) was dissolved in dehydrated tetrahydrofuran (470 ml) in a 1000 ml flask and cooled down to −70° C., and into the cooled solution was dropped a n-butyllithium/hexane solution (1.6M, 367 mL, 587 mmol) over a period of 90 minutes, subsequently, stirred for 2 hours, to prepare a 4-tert-butylphenyllithium/tetrahydrofuran solution.

Separately, under an argon gas atmosphere, cyanuric chloride (50.8 g, 276 mmol) was dissolved in dehydrated tetrahydrofuran (463 mL) in a 200 ml flask and cooled down to −70° C. Into this cooled solution, the whole amount of the above-prepared 4-t-butylphenyllithium/tetrahydrofuran solution was dropped at a rate to keep the inner temperature at −60° C. or lower. After completion of dropping, the mixture was stirred at −40° C. for 4 hours, subsequently, stirred at room temperature for 4 hours. To the resultant reaction mixture was added ion exchanged water (50 ml) slowly, then, the solvent was distilled off under reduced pressure. To the resultant residue was added ion exchanged water (about 1000 ml) and chloroform (about 2000 ml) and the organic layer was extracted, further, the organic layer was washed with ion exchanged water (about 1000 ml), then, the solvent was distilled off under reduced pressure. To the resultant residue was added acetonitrile (600 ml), the mixture was stirred under reflux with heating, then, insoluble materials were filtrated off by hot filtration. The filtrate was concentrated under reduced pressure up to about 100 ml, further, cooled to 70° C. to cause deposition of solid, which was then filtrated. The resultant solid was dissolved in a chloroform (200 ml)/hexane (600 ml) mixed solvent, the solution was purified by silica gel column chromatography (developing solvent: chloroform/hexane), and further, recrystallized from acetonitrile, to obtain the intended intermediate 4,6-bis(4-tert-butylphenyl)-2-chloro-1,3,5-triazine (41.3 g, 109 mmol, yield 39%, compound M4b) as a white crystal.

$^1$H-NMR (300 MHz, CDCl$_3$) δ (ppm)=1.39 (s, 18H), 7.56 (d, 4H), 8.54 (d, 4H)

LC/MS (APPI, positive) m/z+=380 [M+H]+

(Step (4c))

Under a nitrogen atmosphere, a compound M4a (7.52 g, 20.0 mmol), a compound M4b (9.12 g, 24.0 mmol), tetrakis(triphenylphosphine)palladium(0) (2.32 g, 2.0 mmol), silver carbonate (16.5 g, 60 mmol) and dehydrated tetrahydrofuran (160 ml) were mixed in a 200 ml flask, and stirred for 33 hours under reflux with heating under shading. After completion of the reaction, the mixture was diluted with toluene (400 ml), then, insoluble materials were filtrated off. The filtrate was concentrated, acetonitrile (200 ml) was added, the mixture was stirred under reflux for 1 hour, then, the mixture was cooled down to room temperature, the deposited solid was filtrated, and dried under reduced pressure to obtain a coarse

Example 4

Synthesis of Compound M5

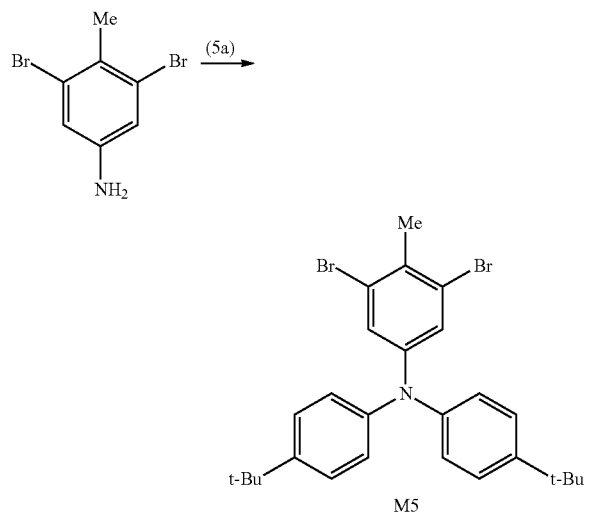

(Step (5a))

Under an argon gas atmosphere, 3,5-dibromo-4-methylaniline (5.30 g, 20.0 mmol), copper(I) chloride (0.99 g, 10 mmol), 1,10-phenanthroline (1.80 g, 10 mmol), potassium hydroxide (8.98 g, 160 mmol), 4-tert-butyliodobenzene (16.1 g, 62 mmol) and dehydrated toluene (40 ml) were mixed in a 200 ml flask equipped with a Dean-Stark dehydration apparatus, and the mixture was dehydrated while refluxing with stirring for about 8 hours while heating in an oil bath of 130° C. This was diluted with toluene (200 ml), and the mixture was cooled down to room temperature, then, passed through a filter matted with celite, to filtrate insoluble materials off. To the filtrate was added activated white earth (manufactured by Wako Pure Chemical Industries, 40 g), and the mixture was stirred at room temperature for 1 hour, then, the solid was filtrated, and this series of operations were repeated three times, then, the filtrate was concentrated, hexane was added to cause deposition of solid, which was then filtrated. The resultant solid was recrystallized from toluene-methanol, further, recrystallized from toluene-ethanol, subsequently, purified by middle pressure silica gel column chromatography (hexane), then, recrystallized again with toluene-methanol, to obtain the intended compound M5 (5.70 g, HPLC area percentage (ultraviolet wavelength 254 nm)>99.9%, yield 54%) as a white crystal.

$^1$H-NMR (300 MHz, THF-$d_8$) δ (ppm)=1.33 (s, 18H), 2.49 (s, 3H), 7.01 (d, 4H), 7.16 (s, 2H), 7.36 (d, 4H)

Example 5

Synthesis of Compound M6

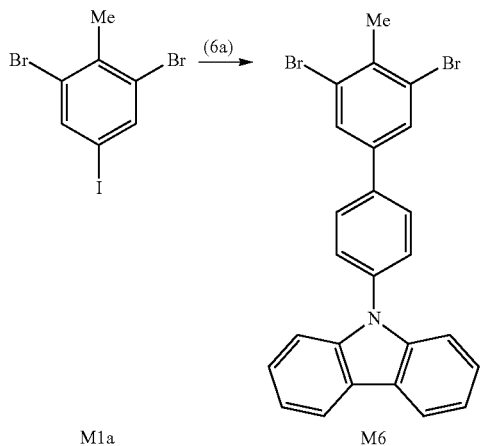

(Step (6a))

Under an argon gas atmosphere, a compound M1a (1.88 g, 5.00 mmol), N-[4'-(4,4,5,5-tetramethyl-1,3,2-dioxaborolan-2-yl)phenyl]carbazole (1.85 g, 5.00 mmol), tetrakis(triphenylphosphine)palladium(0) (0.29 g, 0.25 mmol), silver carbonate (2.76 g, 10 mmol) and dehydrated tetrahydrofuran (50 ml) were mixed in a 200 ml flask, and the mixture was stirred at room temperature for 2 hours under shading, then, further stirred for 5 hours under reflux with heating. After completion of the reaction, the mixture was diluted with toluene (100 ml), then, passed through a filter matted with celite to filtrate insoluble materials off. The filtrate was concentrated, purified by middle pressure silica gel chromatography (hexane/chloroform=100/0 to 70/30), then, recrystallized from toluene-ethanol, and further recrystallized from toluene-hexane, to obtain the intended compound M6 (1.13 g, HPLC area percentage (ultraviolet wavelength 254 nm) 99.3%, yield 37%) as a white crystal.

Synthesis Example 2

Synthesis of Compound M7

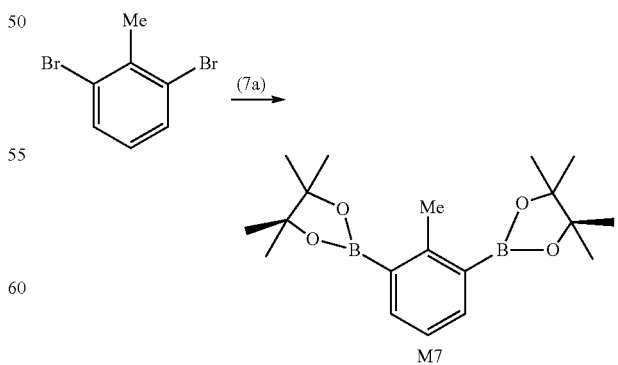

(Step (7a))

Under an argon gas atmosphere, to magnesium pieces (19.45 g, 800 mmol) were added a small amount of dehydrated tetrahydrofuran and 1,2-dibromoethane (1.50 g, 8 mmol) sequentially in a 1000 ml flask. Activation of magnesium was confirmed by heat generation and foaming, then, a solution prepared by dissolving 2,6-dibromotoluene (49.99 g, 200 mmol) in dehydrated tetrahydrofuran (200 ml) was dropped over a period of about 2 hours. After completion of dropping, the mixture was heated in an oil bath of 80° C., and stirred under reflux for 1 hour. The oil bath was removed, the mixture was diluted with dehydrated tetrahydrofuran (400 ml), further cooled in an ice bath, then, 2-isopropyloxy-4,4,5,5-tetramethyl-1,3,2-dioxaborolane (148.85 g, 800 mmol) was added. The ice bath was removed, and the mixture was stirred for 1.5 hours under reflux by heating in an oil bath of 80° C. The oil bath was removed, further cooled in an ice bath, then, a saturated ammonium chloride aqueous solution (50 ml) was added, and the mixture was stirred for 30 minutes. The ice bath was removed, hexane (1500 ml) was added, and the mixture was stirred vigorously for 30 minutes. Stirring was stopped, and the mixture was allowed to stand still under this condition for 15 minutes, then, filtrated through a glass filter matted with silica gel, and silica gel was washed with hexane (1000 ml), and the combined filtrates were concentrated under reduced pressure, to obtain a coarse product (72.0 g). The same operations were repeated to obtain a coarse product (75.4 g).

Next, methanol (740 ml) was added to the total amount of the coarse products, and stirred under reflux with heating for 1 hour using an oil bath of 85° C. The oil bath was removed, the mixture was cooled down to room temperature while stirring, then, the solid was filtrated, washed with methanol (100 ml), and dried under reduced pressure to obtain a white crystal (59.7 g). The dried crystal was dissolved in isopropanol (780 ml) with heating, then, cooled slowly down to room temperature under condition of standing still to cause deposition of a crystal, which was then filtrated, washed with methanol (100 ml) and dried under reduced pressure at 50° C. overnight, to obtain the intended compound M7 (50.8 g, HPLC area percentage (ultraviolet wavelength 254 nm) 99.8%, yield 37%) as a white crystal.

$^1$H-NMR (300 MHz, CDCl$_3$) δ (ppm)=1.34 (s, 24H), 2.74 (s, 3H), 7.14 (t, 1H), 7.79 (d, 2H)

Synthesis Example 3

Purification of Compound CM1

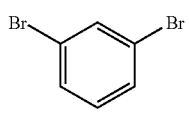

CM1

Commercially available 1,3-dibromobenzene was purified by distillation under reduced pressure, to obtain 1,3-dibromobenzene (compound CM1) having a GC area percentage value of >99.9%.

Synthesis Example 4

Synthesis of Compound CM2

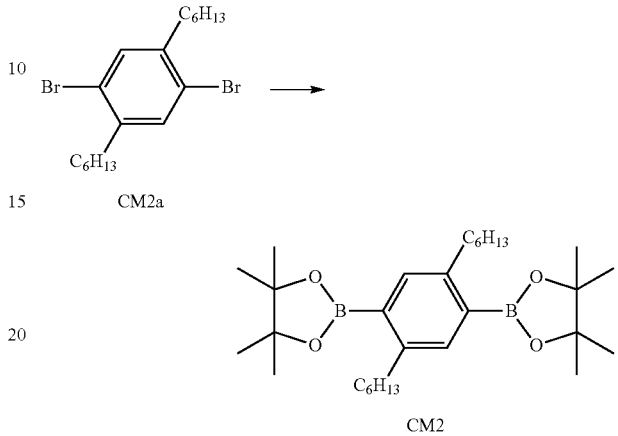

Under an argon gas atmosphere, 1,4-dihexyl-2,5-dibromobenzene (compound CM2a, 8.08 g, 20.0 mmol), bis(pinacolato)diborane (12.19 g, 48.0 mmol), [1,1'-bis(diphenylphosphino)ferrocene]dichloropalladium(II) (0.98 g, 1.2 mmol), potassium acetate (11.78 g, 120.0 mmol), and dehydrated 1,4-dioxane (100 ml) were mixed in a 300 ml flask, and the mixture was stirred for 6 hours under reflux with heating. Toluene and ion exchanged water were added, and the mixture was separated, and washed with ion exchanged water. Anhydrous sodium sulfate and activated carbon were added, and the mixture was filtrated through a funnel pre-coated with celite. The filtrate was concentrated to obtain a coarse product (11.94 g). Recrystallization from hexane was carried out, and the crystal was washed with methanol. The resultant crystal was dried under reduced pressure, to obtain the intended product 1,4-dihexyl-2,5-bis(4,4,5,5-tetramethyl-1,3,2-dioxaborolan-2-yl)benzene (4.23 g, yield 42%, compound CM2) as a while needle crystal.

$^1$H-NMR (300 MHz, CDCl$_3$), δ=0.95 (t, 6H), 1.39 to 1.42 (bd, 36H), 1.62 (m, 4H), 2.88 (t, 4H), 7.59 (bd, 2H)

LC/MS (ESI posi KCl addition): [M+K]+ 573

Synthesis Example 5

Synthesis of Compound CM3

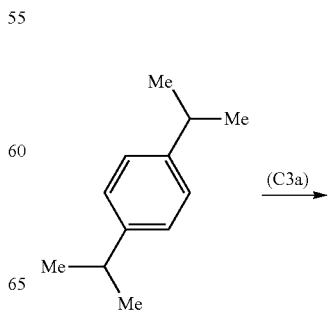

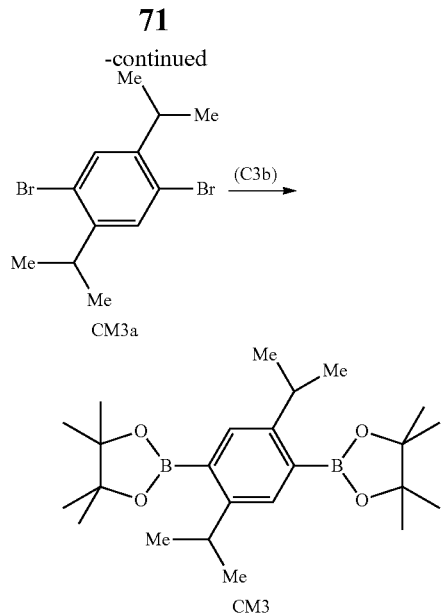

(Step (C3a))

Under an argon gas atmosphere, 1,4-diisopropylbenzene (24.34 g, 150 mmol), an iron powder (0.838 g, 15 mmol), dehydrated chloroform (40 ml) and trifluoroacetic acid (1.71 g, 15 mmol) were mixed and stirred in a shaded 300 ml round-bottomed flask and cooled in an ice bath, and into this mixture, a dehydrated chloroform (92 ml) diluted solution of bromine (55.1 g, 345 mmol) was dropped over a period of 30 minutes, and the mixture was further stirred and reacted for 5 hours while cooling in an ice bath, to obtain reaction liquid. After completion of the reaction, to a 10 wt % sodium hydroxide aqueous solution cooled in an ice bath was added the above-described reaction liquid slowly, and the mixture was further stirred for 15 minutes. The mixture was separated into an organic layer and an aqueous layer, extraction with chloroform (100 ml) from the aqueous solution was performed, and the resultant organic layers were combined, then, a 10 wt % sodium sulfite aqueous solution (200 ml) was added, and the mixture was stirred at room temperature for 30 minutes. In this procedure, the color of the organic layer was changed from pale yellow to approximately colorless transparent. The aqueous layer was removed by liquid-separation, the resultant organic layer was washed with 15 wt % saline (200 ml), dried over anhydrous magnesium sulfate (30 g), and the solvent was distilled off by concentration under reduced pressure, to obtain about 47 g of a pale yellow oil. Ethanol (15 g) was added, the mixture was shaken to become uniform, then, allowed to stand still for 3 hours in a refrigerator of −10° C. to cause deposition of a crystal, which was then filtrated, washed with a small amount of methanol, and dried under reduced pressure at room temperature overnight, to obtain the intended product 1,4-dibromo-2,5-diisopropylbenzene (30.8 g, yield 64%, compound CM3a) as a white crystal.

$^1$H-NMR (300 MHz, CDCl$_3$), δ=1.24 (d, 12H), 3.30 (m, 2H), 7.50 (s, 2H)

(Step (C3b))

Under an argon gas atmosphere, to magnesium pieces (97.24 g, 400 mmol) were added a small amount of dehydrated tetrahydrofuran and 1,2-dibromoethane (0.75 g, 4 mmol) sequentially in a 1000 ml flask. Activation of magnesium was confirmed by heat generation and foaming, then, a solution prepared by dissolving the above-described compound CM3a (32.0 g, 100 mmol) in dehydrated tetrahydrofuran (100 ml) was dropped over a period of about 1 hour. After completion of dropping, the mixture was heated in an oil bath of 80° C., and stirred under reflux for 1 hour. The oil bath was removed, the mixture was diluted with dehydrated tetrahydrofuran (200 ml), further cooled in an ice bath, then, 2-isopropyloxy-4,4,5,5-tetramethyl-1,3,2-dioxaborolane (74.4 g, 400 mmol) was added. The ice bath was removed, and the mixture was stirred for 1.5 hours under reflux by heating in an oil bath of 80° C. The oil bath was removed, further cooled in an ice bath, then, a saturated ammonium chloride aqueous solution (25 ml) was added, and the mixture was stirred for 30 minutes. The ice bath was removed, hexane (2000 ml) was added, and the mixture was stirred vigorously for 30 minutes. Stirring was stopped, and the mixture was allowed to stand still under this condition for 15 minutes, then, filtrated through a glass filter matted with silica gel, and silica gel was washed with hexane (1000 ml), and the combined filtrates were concentrated under reduced pressure, to obtain a coarse product (59.0 g). The same operations were repeated at a scale of 80% of the above-described scale to obtain a coarse product (44.8 g).

Methanol (520 ml) was added to the total amount of the coarse products (103.8 g), and stirred under reflux with heating for 1 hour using an oil bath of 75° C. The oil bath was removed, the mixture was cooled down to room temperature while stirring, then, the solid was filtrated, washed with methanol (100 ml), and dried under reduced pressure to obtain a white crystal (48.8 g, HPLC area percentage (ultraviolet wavelength 254 nm) 93.3%). The dried crystal was dissolved in isopropanol (690 ml) with heating, then, cooled slowly down to room temperature under condition of standing still to cause deposition of a crystal, which was then filtrated, washed with methanol (50 ml) and dried under reduced pressure at 50° C. overnight, to obtain the intended product 1,4-diisopropyl-2,5-bis(4,4,5,5-tetramethyl-1,3,2-dioxaborolan-2-yl)benzene as a white crystal (44.6 g, HPLC area percentage (ultraviolet wavelength 254 nm) 99.8%, yield 60%, compound CM3).

$^1$H-NMR (300 MHz, CDCl$_3$), δ=1.23 (d, 12H), 1.34 (s, 24H), 3.58 (m, 2H), 7.61 (s, 2H)

Synthesis Example 6

Light Emitting Material EM-B: Synthesis of Iridium Complex

Synthesis Method Described in WO02/066552

Under an inert gas atmosphere, 2-bromopyridine and 1.2 equivalents of 3-bromophenylboric acid were subjected to the Suzuki coupling (catalyst: tetrakis(triphenylphosphine)palladium(0), base: 2M sodium carbonate aqueous solution, solvent: ethanol, toluene), to obtain 2-(3'-bromophenyl)pyridine represented by the following formula:

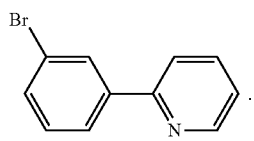 [SMILES: Brc1cccc(-c2ccccn2)c1]

Next, under an inert gas atmosphere, tribromobenzene and 2.2 equivalents of 4-tert-butylphenylboric acid were subjected to the Suzuki coupling (catalyst: tetrakis(triphenylphosphine)palladium(0), base: 2M sodium carbonate aqueous solution, solvent: ethanol, toluene), to obtain a bromo compound represented by the following formula:

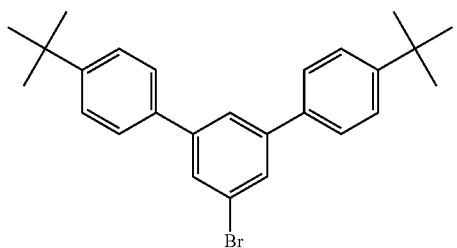

Under an inert gas atmosphere, this bromo compound was dissolved in anhydrous THF, then, cooled down to −78° C., and a slight excess amount of tert-butyllithium was dropped. After cooling, $B(OC_4H_9)_3$ was further dropped, and the mixture was reacted at room temperature. The resultant reaction liquid was subjected to a post treatment with 3M hydrochloric acid water, to obtain a boric acid compound represented by the following formula:

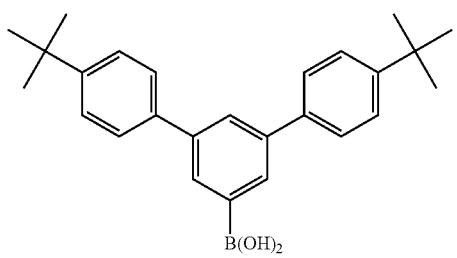

Under an inert gas atmosphere, 2-(3'-bromophenyl)pyridine and 1.2 equivalents of the above-described boric acid compound were subjected to the Suzuki coupling (catalyst: tetrakis(triphenylphosphine)palladium(0), base: 2M sodium carbonate aqueous solution, solvent: ethanol, toluene), to obtain a ligand (namely, compound as ligand) represented by the following formula:

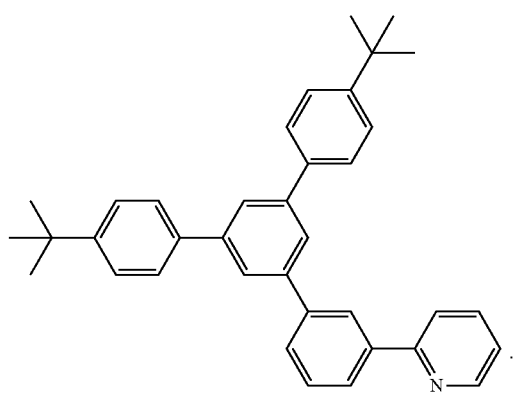 [SMILES: CC(C)(C)c1ccc(-c2cc(-c3ccc(C(C)(C)C)cc3)cc(-c3cccc(-c4ccccn4)c3)c2)cc1]

Under an argon atmosphere, the above-described ligand, 4 equivalents of $IrCl_3.3H_2O$, 2-ethoxyethanol and ion exchanged water were charged and refluxed. The deposited solid was filtrated under suction. The resultant solid was washed with ethanol and ion exchanged water in this order, then, dried, to obtain a yellow powder represented by the following formula:

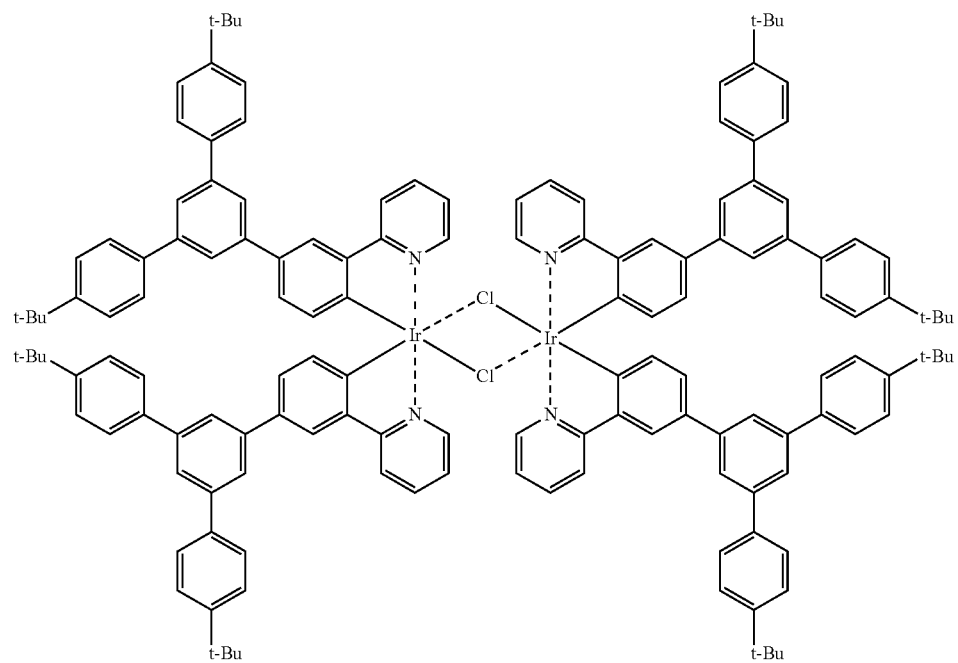

Under an argon atmosphere, to the above-described yellow powder was added 2 equivalents of the above-described ligand, and the mixture was heated in a glycol type solvent, to obtain an iridium complex (light emitting material EM-B) represented by the following formula:

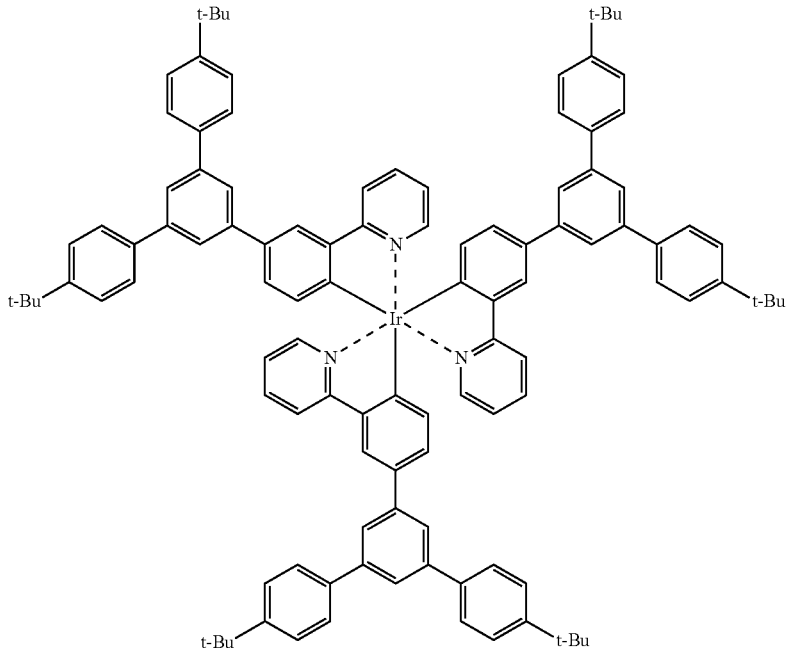

$^1$H NMR (300 MHz, CHCl$_3$)

δ 1.38 (s, 54H), δ 6.93 (dd, J=6.3, 6.6 Hz, 3H), δ 7.04 (br, 3H), δ 7.30 (d, J=7.9 Hz, 3H), δ 7.48 (d, J=7.3 Hz, 12H), δ 7.61-7.70 (m, 21H), δ 7.82 (s, 6H), δ 8.01 (s, 3H), δ 8.03 (d, J=7.9 Hz, 3H).

LC/MS (APCI posi): [M+H]+ 1677

Example 6

Synthesis of Polymer Compound P1

Under a nitrogen atmosphere, a mixture of 2,7-bis(1,3,2-dioxaborolan-2-yl)-9,9-dioctylfluorene (530.5 mg, 1.000 mmol), a compound M1 (382 mg, 1.00 mmol) and toluene (10 ml) was heated at 90° C. in a 100 ml flask, and palladium acetate (0.7 mg, 3 μmol), tris(2-methoxyphenyl)phosphine (2.1 mg, 6 μmol) and a 20 wt % tetraethylammonium hydroxide aqueous solution (3.3 ml, 4.7 mmol) were added, and further, the mixture was stirred for about 30 hours under reflux by heating.

Next, benzeneboronic acid (0.12 g, 1.0 mmol), palladium acetate (0.3 mg, 1.5 μmol) and tris(2-methoxyphenyl)phosphine (2.1 mg, 6 μmol) were added, and the mixture was stirred under reflux for about 8 hours while heating at 105° C.

Further, a solution prepared by dissolving sodium N,N-diethyldithiocarbamate trihydrate (0.61 g) in ion exchanged water (6 ml) was added, and the mixture was stirred for 2 hours while stirring at 85° C.

The organic layer was separated from the aqueous layer, then, the organic layer was washed with ion exchanged water (about 13 ml) twice, a 3 wt % acetic acid aqueous solution (about 13 ml) twice, and ion exchanged water (about 13 ml) twice, sequentially. The organic layer was dropped into methanol to cause precipitation of a polymer compound, which was then filtrated and dried to obtain solid. This solid was dissolved in toluene (31 ml), and the solution was passed through a silica gel column and an alumina column through which toluene had been passed previously, the resultant solution was dropped into methanol (155 ml) to cause precipitation of a polymer compound, which was then filtrated and dried to obtain a polymer compound (0.38 g, polymer compound P1). The polymer compound P1 had a polystyrene-equivalent number average molecular weight (Mn) and a weight average molecular weight (Mw) of Mn=1.9×10$^4$ and Mw=3.4×10$^4$, respectively, had a glass transition temperature of 124° C., and showed a film fluorescence peak wavelength of 404 nm. The polymer compound P1 is estimated to be an alternating copolymer having the following constitutional units and molar ratio based on the charging ratio of monomers.

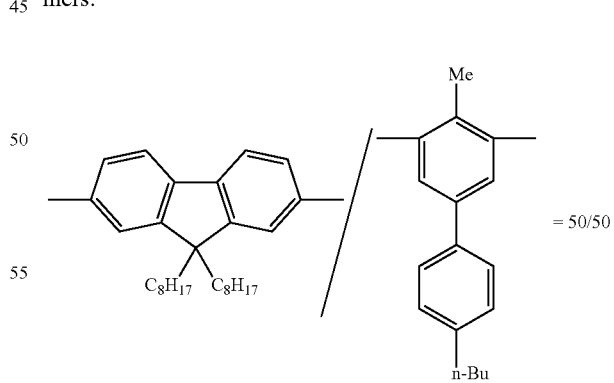

Example 7

Synthesis of Polymer Compound P2

Under a nitrogen atmosphere, a mixture of 2,7-bis(4,4,5,5-tetramethyl-1,3,2-dioxaborolan-2-yl)-9,9-dioctylfluorene (963.2 mg, 1.499 mmol), a compound M2 (510.1 mg, 1.500 mmol) and toluene (15 ml) was heated at 90° C. in a 200 ml flask, and palladium acetate (0.5 mg, 2.3 μmol), tris(2-methoxyphenyl)phosphine (3.2 mg, 9 μmol) and a 20 wt % tetraethylammonium hydroxide aqueous solution (5 ml, 7 mmol) were added, and further, the mixture was stirred for about 25 hours under reflux by heating.

Next, benzeneboronic acid (18.3 mg, 0.150 mmol) dissolved in toluene (15 ml), palladium acetate (0.5 mg, 2.3 μmol), tris(2-methoxyphenyl)phosphine (3.2 mg, 9 μmol), trioctylmethylammonium chloride (trade name: Aliquat336, manufactured by Aldrich) (0.19 g) and a 17.5 wt % sodium carbonate aqueous solution (8.2 ml) were added, and the mixture was stirred under reflux for about 21 hours while heating at 105° C.

Further, a solution prepared by dissolving sodium N,N-diethyldithiocarbamate trihydrate (0.91 g) in ion exchanged water (9 ml) was added and the mixture was stirred for 2 hours while heating at 85° C.

The organic layer was separated from the aqueous layer, then, the organic layer was washed with ion exchanged water (about 20 ml) twice, a 3 wt % acetic acid aqueous solution (about 20 ml) twice, and ion exchanged water (about 20 ml) twice, sequentially. The organic layer was dropped into methanol to cause precipitation of a polymer compound, which was then filtrated and dried to obtain solid. This solid was dissolved in toluene (47 ml), and the solution was passed through a silica gel column and an alumina column through which toluene had been passed previously, and the resultant solution was dropped into methanol (233 ml) to cause precipitation of a polymer compound, which was then filtrated and dried to obtain a polymer compound (0.67 g, polymer compound P2). The polymer compound P2 had a polystyrene-equivalent number average molecular weight (Mn) and a weight average molecular weight (Mw) of Mn=$3.1\times10^4$ and Mw=$9.0\times10^4$, respectively, had a glass transition temperature of 189° C., and showed a film fluorescence peak wavelength of 402 nm. The polymer compound P2 is estimated to be an alternating copolymer having the following constitutional units and molar ratio based on the charging ratio of monomers.

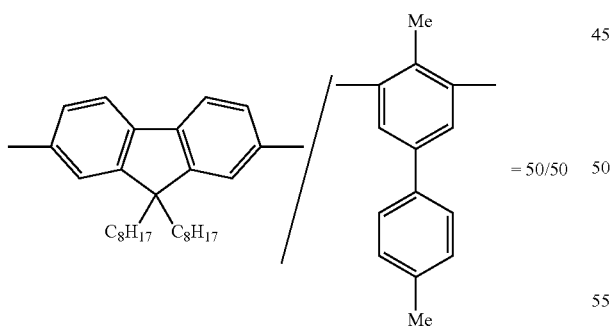

Example 8

Synthesis of Polymer Compound P3

Under a nitrogen atmosphere, a mixture of 2,7-bis(1,3,2-dioxaborolan-2-yl)-9,9-dioctylfluorene (1.5915 g, 3.000 mmol), a compound M5 (1.5881 g, 3.000 mmol) and toluene (30 ml) was heated at 90° C. in a 200 ml flask, and palladium acetate (1.0 mg, 4.5 μmol), tris(2-methoxyphenyl)phosphine (6.3 mg, 18 μmol) and a 20 wt % tetraethylammonium hydroxide aqueous solution (10 ml, 14 mmol) were added, and further, the mixture was stirred for about 20 hours under reflux by heating.

Next, benzeneboronic acid (0.366 g, 3.0 mmol), palladium acetate (1.0 mg, 4.5 μmol) and tris(2-methoxyphenyl)phosphine (6.3 mg, 18 μmol) were added and the mixture was stirred under reflux for about 4 hours while heating at 105° C.

Next, bromobenzene (0.66 g, 4.2 mmol), palladium acetate (1.0 mg, 4.5 μmol) and tris(2-methoxyphenyl)phosphine (6.3 mg, 18 μmol) were added and the mixture was stirred under reflux for about 4 hours while heating at 105° C.

Further, a solution prepared by dissolving sodium N,N-diethyldithiocarbamate trihydrate (1.83 g) in ion exchanged water (18 ml) was added, and the mixture was stirred for 2 hours while heating at 85° C.

The organic layer was separated from the aqueous layer, then, the organic layer was washed with ion exchanged water (about 40 ml) twice, a 3 wt % acetic acid aqueous solution (about 40 ml) twice, and ion exchanged water (about 40 ml) twice, sequentially. The organic layer was dropped into methanol to cause precipitation of a polymer compound, which was then filtrated and dried to obtain solid. This solid was dissolved in toluene (93 ml), and the solution was passed through a silica gel column and an alumina column through which toluene had been passed previously, the resultant solution was dropped into methanol (465 ml) to cause precipitation of a polymer compound, which was then filtrated and dried to obtain a polymer compound (1.87 g, polymer compound P3). The polymer compound P3 had a polystyrene-equivalent number average molecular weight (Mn) and a weight average molecular weight (Mw) of Mn=$1.7\times10^4$ and Mw=$3.2\times10^4$, respectively, had a glass transition temperature of 137° C., and showed a film fluorescence peak wavelength of 413 nm. The polymer compound P3 is estimated to be an alternating copolymer having the following constitutional units and molar ratio based on the charging ratio of monomers.

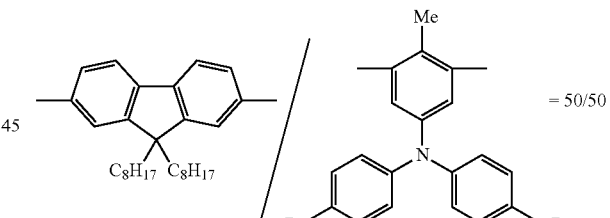

Example 9

Synthesis of Polymer Compound P4

Under a nitrogen atmosphere, a mixture of 2,7-bis(4,4,5,5-tetramethyl-1,3,2-dioxaborolan-2-yl)-9,9-dioctylfluorene (1.2851 mg, 2.000 mmol), a compound CM2a (646.8 mg, 1.600 mmol), a compound M5 (211.7 mg, 0.400 mmol) and toluene (40 ml) was heated at 90° C. in a 200 ml flask, and palladium acetate (0.9 mg, 4 μmol), tris(2-methoxyphenyl)phosphine (5.6 mg, 16 μmol) and a 20 wt % tetraethylammonium hydroxide aqueous solution (6.6 ml, 9.4 mmol) were added, and further, the mixture was stirred for about 6 hours under reflux by heating.

Next, benzeneboronic acid (25.7 mg, 0.200 mmol) dissolved in toluene (20 ml), palladium acetate (0.9 mg, 4 μmol), tris(2-methoxyphenyl)phosphine (5.6 mg, 16 μmol) and a 20 wt % tetraethylammonium hydroxide aqueous solution (6.6 ml, 9.4 mmol) were added, and the mixture was stirred under reflux for about 16 hours while heating at 105° C.

Further, a solution prepared by dissolving sodium N,N-diethyldithiocarbamate trihydrate (1.22 g) in ion exchanged water (20 ml) was added, and the mixture was stirred for 2 hours while heating at 85° C.

The organic layer was separated from the aqueous layer, then, the organic layer was washed with ion exchanged water (about 26 ml) twice, a 3 wt % acetic acid aqueous solution (about 26 ml) twice, and ion exchanged water (about 26 ml) twice, sequentially. The organic layer was dropped into methanol to cause precipitation of a polymer compound, which was then filtrated and dried to obtain solid. This solid was dissolved in toluene (62 ml), and the solution was passed through a silica gel column and an alumina column through which toluene had been passed previously, the resultant solution was dropped into methanol (310 ml) to cause precipitation of a polymer compound, which was then filtrated and dried to obtain a polymer compound (1.14 g, polymer compound P4). The polymer compound P4 had a polystyrene-equivalent number average molecular weight (Mn) and a weight average molecular weight (Mw) of $Mn=4.5\times10^4$ and $Mw=8.5\times10^5$, respectively, had a glass transition temperature of 56° C., and showed a film fluorescence peak wavelength of 405 nm. The polymer compound P4 is estimated to be a polymer having the following constitutional units and molar ratio in which the constitutional unit of (PA) and the constitutional unit selected from (PB) are polymerized alternately, based on the charging ratio of monomers.

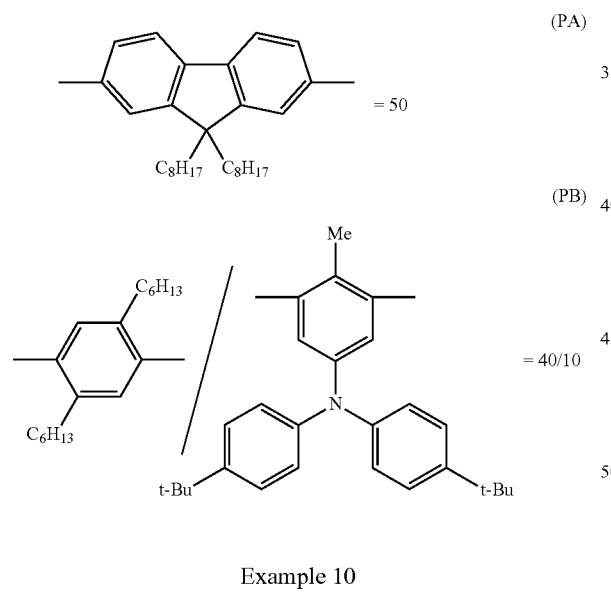

Example 10

Synthesis of Polymer Compound P5

Under a nitrogen atmosphere, a mixture of 2,7-bis(4,4,5,5-tetramethyl-1,3,2-dioxaborolan-2-yl)-9,9-dioctylfluorene (1.2851 mg, 2.000 mmol), a compound CM2a (646.8 mg, 1.600 mmol), a compound M4 (238.3 mg, 0.400 mmol) and toluene (40 ml) was heated at 90° C. in a 200 ml flask, and palladium acetate (0.9 mg, 4 μmol), tris(2-methoxyphenyl)phosphine (5.6 mg, 16 μmol) and a 20 wt % tetraethylammonium hydroxide aqueous solution (6.6 ml, 9.4 mmol) were added, and further, the mixture was stirred for about 6 hours under reflux by heating.

Next, benzeneboronic acid (25.7 mg, 0.200 mmol) dissolved in toluene (20 ml), palladium acetate (0.9 mg, 4 μmol), tris(2-methoxyphenyl)phosphine (5.6 mg, 16 μmol) and a 20 wt % tetraethylammonium hydroxide aqueous solution (6.6 ml, 9.4 mmol) were added, and the mixture was stirred under reflux for about 16 hours while heating at 105° C.

Further, a solution prepared by dissolving sodium N,N-diethyldithiocarbamate trihydrate (1.22 g) in ion exchanged water (20 ml) was added, and the mixture was stirred for 2 hours while heating at 85° C.

The organic layer was separated from the aqueous layer, then, the organic layer was washed with ion exchanged water (about 26 ml) twice, a 3 wt % acetic acid aqueous solution (about 26 ml) twice, and ion exchanged water (about 26 ml) twice, sequentially. The organic layer was dropped into methanol to cause precipitation of a polymer compound, which was then filtrated and dried to obtain solid. This solid was dissolved in toluene (62 ml), and the solution was passed through a silica gel column and an alumina column through which toluene had been passed previously, the resultant solution was dropped into methanol (310 ml) to cause precipitation of a polymer compound, which was then filtrated and dried to obtain a polymer compound (1.14 g, polymer compound P5). The polymer compound P5 had a polystyrene-equivalent number average molecular weight (Mn) and a weight average molecular weight (Mw) of $Mn=5.6\times10^4$ and $Mw=1.2\times10^5$, respectively, had a glass transition temperature of 75° C., and showed a film fluorescence peak wavelength of 403 nm. The polymer compound P5 is estimated to be a polymer having the following constitutional units and molar ratio in which the constitutional unit of (PA) and the constitutional unit selected from (PB) are polymerized alternately, based on the charging ratio of monomers.

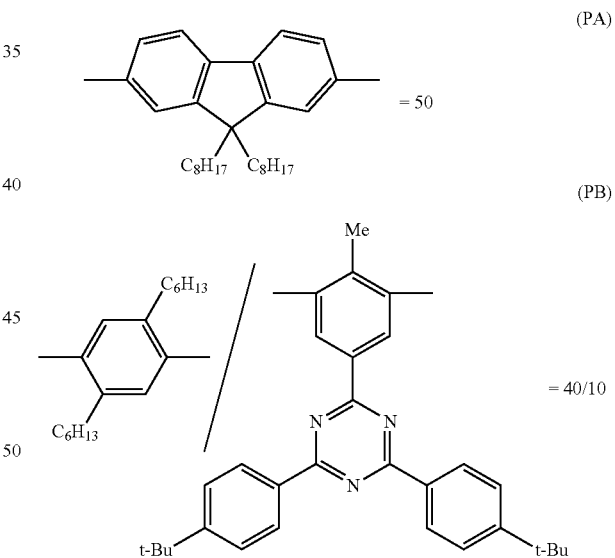

Example 11

Synthesis of Polymer Compound P6

Under a nitrogen atmosphere, a mixture of a compound CM2 (797.4 mg, 1.600 mmol), a compound M3 (173.7 mg, 0.400 mmol), 2,7-dibromo-9,9-dioctylfluorene (658.1 mg, 1.200 mmol), 2,7-dibromo-9,9-bis(4-methylphenyl)fluorine (201.7 mg, 0.400 mmol), 4,4'-dibromo-4"-sec-butyltriphenylamine (183.7 mg, 0.400 mmol) and toluene (40 ml) was heated at 90° C. in a 200 ml flask, and palladium acetate (0.9 mg, 4 µmol), tris(2-methoxyphenyl)phosphine (5.6 mg, 16 µmol) and a 20 wt % tetraethylammonium hydroxide aqueous solution (6.6 ml, 9.4 mmol) were added, and further, the mixture was stirred for about 6 hours under reflux by heating.

Next, benzeneboronic acid (25.7 mg, 0.200 mmol) dissolved in toluene (20 ml), palladium acetate (0.9 mg, 4 µmol), tris(2-methoxyphenyl)phosphine (5.6 mg, 16 µmol) and a 20 wt % tetraethylammonium hydroxide aqueous solution (6.6 ml, 9.4 mmol) were added, and the mixture was stirred under reflux for about 16 hours while heating at 105° C.

Further, a solution prepared by dissolving sodium N,N-diethyldithiocarbamate trihydrate (1.22 g) in ion exchanged water (20 ml) was added, and the mixture was stirred for 2 hours while heating at 85° C.

The organic layer was separated from the aqueous layer, then, the organic layer was washed with ion exchanged water (about 26 ml) twice, a 3 wt % acetic acid aqueous solution (about 26 ml) twice, and ion exchanged water (about 26 ml) twice, sequentially. The organic layer was dropped into methanol to cause precipitation of a polymer compound, which was then filtrated and dried to obtain solid. This solid was dissolved in toluene (62 ml), and the solution was passed through a silica gel column and an alumina column through which toluene had been passed previously, the resultant solution was dropped into methanol (310 ml) to cause precipitation of a polymer compound, which was then filtrated and dried to obtain a polymer compound (0.99 g, polymer compound P6). The polymer compound P6 had a polystyrene-equivalent number average molecular weight (Mn) and a weight average molecular weight (Mw) of Mn=$4.0 \times 10^4$, Mw=$7.5 \times 10^4$, respectively, had a glass transition temperature of 90° C., and showed a film fluorescence peak wavelength of 402 nm. The polymer compound P6 is estimated to be a polymer having the following constitutional units and molar ratio in which the constitutional unit selected from (PA) and the constitutional unit selected from (PB) are polymerized alternately, based on the charging ratio of monomers.

Example 12

Synthesis of Polymer Compound P7

Under a nitrogen atmosphere, a mixture of 2,7-bis(4,4,5,5-tetramethyl-1,3,2-dioxaborolan-2-yl)-9,9-dioctylfluorene (771.1 mg, 1.200 mmol), 2,7-bis(1,3,2-dioxaborolan-2-yl)-9,9-dihexylfluorene (142.3 mg, 0.300 mmol), a compound CM2a (303.2 mg, 0.750 mmol), a compound M2 (102.1 mg, 0.300 mmol), a compound M4 (178.7 mg, 0.300 mmol), a compound M5 (79.4 mg, 0.150 mmol) and toluene (30 ml) was heated at 90° C. in a 200 ml flask, and palladium acetate (0.7 mg, 3 µmol), tris(2-methoxyphenyl)phosphine (4.2 mg, 12 µmol) and a 10 wt % tetraethylammonium hydroxide aqueous solution (10 ml, 7 mmol) were added, and further, the mixture was stirred for about 16 hours under reflux by heating.

Next, benzeneboronic acid (19.3 mg, 0.150 mmol) dissolved in toluene (15 ml), palladium acetate (0.7 mg, 3 µmol), tris(2-methoxyphenyl)phosphine (4.2 mg, 12 µmol) and a 10 wt % tetraethylammonium hydroxide aqueous solution (10 ml, 7 mmol) were added, and the mixture was stirred under reflux for about 9 hours while heating at 105° C.

Further, a solution prepared by dissolving sodium N,N-diethyldithiocarbamate trihydrate (0.91 g) in ion exchanged water (16 ml) was added, and the mixture was stirred for 2 hours while heating at 85° C.

The organic layer was separated from the aqueous layer, then, the organic layer was washed with ion exchanged water (about 20 ml) twice, a 3 wt % acetic acid aqueous solution (about 20 ml) twice, and ion exchanged water (about 20 ml) twice, sequentially. The organic layer was dropped into methanol to cause precipitation of a polymer compound, which was then filtrated and dried to obtain solid. This solid was dissolved in toluene (47 ml), and the solution was passed through a silica gel column and an alumina column through which toluene had been passed previously, and the resultant solution was dropped into methanol (233 ml) to cause pre-

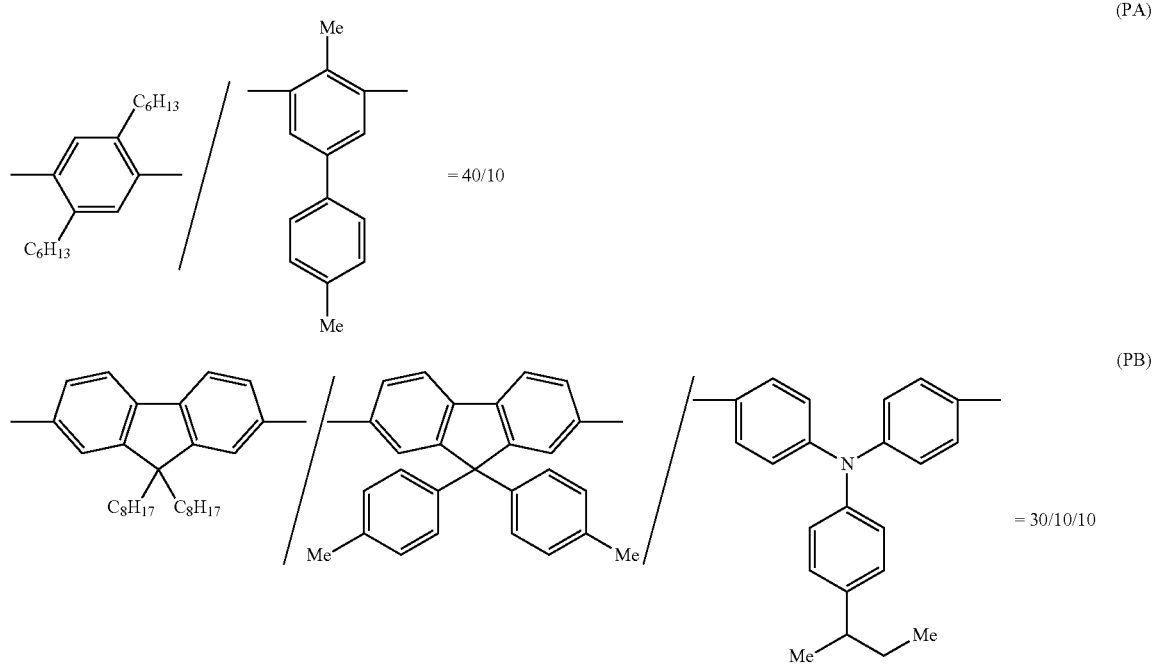

cipitation of a polymer compound, which was then filtrated and dried to obtain a polymer compound (0.77 g, polymer compound P7). The polymer compound P7 had a polystyrene-equivalent number average molecular weight (Mn) and a weight average molecular weight (Mw) of Mn=2.2×10$^4$ and Mw=4.0×10$^4$, respectively, had a glass transition temperature of 117° C., and showed a film fluorescence peak wavelength of 406 nm. The polymer compound P7 is estimated to be a polymer having the following constitutional units and molar ratio in which the constitutional unit selected from (PA) and the constitutional unit selected from (PB) are polymerized alternately, based on the charging ratio of monomers.

passed through a silica gel column and an alumina column through which toluene had been passed previously, the resultant solution was dropped into methanol (585 ml) to cause precipitation of a polymer compound, which was then filtrated and dried to obtain a polymer compound (1.73 g, polymer compound P8). The polymer compound P8 had a polystyrene-equivalent number average molecular weight (Mn) and a weight average molecular weight (Mw) of Mn=5.1×10$^4$ and Mw=1.2×10$^5$, respectively, had a glass transition temperature of 108° C., and showed a film fluorescence peak wavelength of 396 nm. The polymer compound P8 is estimated to be a polymer having the following constitutional

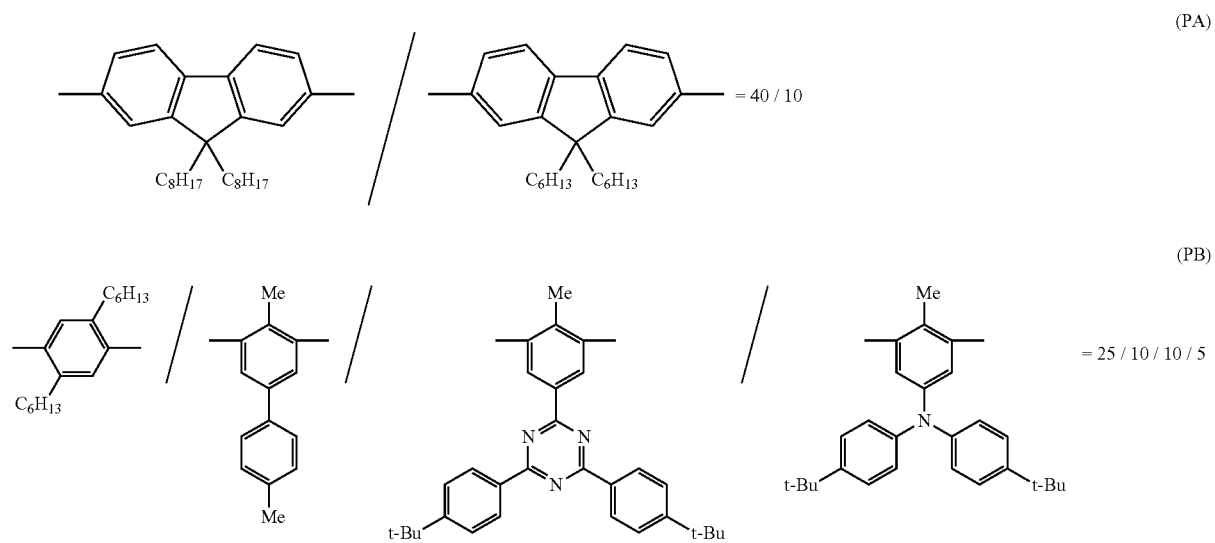

Example 13

Synthesis of Polymer Compound P8

Under a nitrogen atmosphere, a compound CM3 (1.288 g, 3.111 mmol), a compound M7 (260.9 mg, 0.760 mmol), 2,7-dibromo-9,9-dioctylfluorene (2.009 mg, 3.550 mmol), 4,4'-dibromo-4''-sec-butyltriphenylamine (0.104 mg, 0.230 mmol), toluene (38 ml), palladium acetate (0.85 mg, 3.8 μmol), tris(2-methoxyphenyl)phosphine (5.3 mg, 15 μmol) and a 20 wt % tetraethylammonium hydroxide aqueous solution (12.8 ml, 18 mmol) were stirred for about 21 hours under reflux, in a 200 ml flask, Next, benzeneboronic acid (46.5 mg, 0.4 mmol) dissolved in toluene (5.7 ml), palladium acetate (0.85 mg, 3.8 μmol) and tris(2-methoxyphenyl)phosphine (5.3 mg, 15 μmol) were added, and the mixture was stirred under reflux for about 15 hours while heating at 105° C.

Further, a solution prepared by dissolving sodium N,N-diethyldithiocarbamate trihydrate (2.1 g) in ion exchanged water (42 ml) was added, and the mixture was stirred for 2 hours while heating at 85° C.

The organic layer was separated from the aqueous layer, then, the organic layer was washed with ion exchanged water (about 50 ml) twice, a 3 wt % acetic acid aqueous solution (about 50 ml) twice, and ion exchanged water (about 50 ml) twice, sequentially. The organic layer was dropped into methanol to cause precipitation of a polymer compound, which was then filtrated and dried to obtain solid. This solid was dissolved in toluene (117 ml), and the solution was units and molar ratio in which the constitutional unit selected from (PA) and the constitutional unit selected from (PB) are polymerized alternately, based on the charging ratio of monomers.

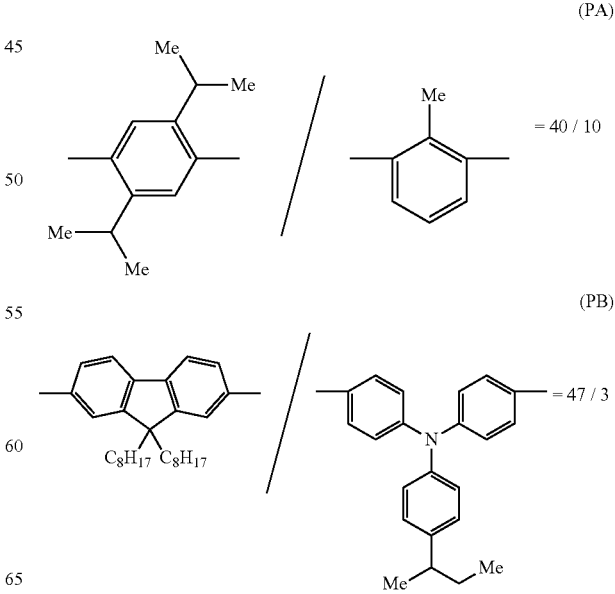

Synthesis Example 7

Synthesis of Polymer Compound CP1

Under a nitrogen atmosphere, a mixture of 2,7-bis(1,3,2-dioxaborolan-2-yl)-9,9-dioctylfluorene (795.8 mg, 1.500 mmol), a compound CM1 (354 mg, 1.50 mmol) and toluene (15 ml) was heated at 90° C. in a 100 ml flask, and palladium acetate (1.0 mg, 4.5 μmol), tris(2-methoxyphenyl)phosphine (3.2 mg, 9 μmol) and a 20 wt % tetraethylammonium hydroxide aqueous solution (5 ml, 7 mmol) were added, and further, the mixture was stirred for about 21 hours under reflux by heating.

Next, benzeneboronic acid (18.3 mg, 0.150 mmol) dissolved in toluene (15 ml), palladium acetate (0.5 mg, 2.3 μmol) and tris(2-methoxyphenyl)phosphine (3.2 mg, 9 μmol) were added, and the mixture was stirred under reflux for about 8 hours while heating at 105° C.

Further, a solution prepared by dissolving sodium N,N-diethyldithiocarbamate trihydrate (0.91 g) in ion exchanged water (9 ml) was added, and the mixture was stirred for 2 hours while heating at 85° C.

The organic layer was separated from the aqueous layer, then, the organic layer was washed with ion exchanged water (about 20 ml) twice, a 3 wt % acetic acid aqueous solution (about 20 ml) twice, and ion exchanged water (about 20 ml) twice, sequentially. The organic layer was dropped into methanol to cause precipitation of a polymer compound, which was then filtrated and dried to obtain solid. This solid was dissolved in toluene (47 ml), and the solution was passed through a silica gel column and an alumina column through which toluene had been passed previously, and the resultant solution was dropped into methanol (233 ml) to cause precipitation of a polymer compound, which was then filtrated and dried to obtain a polymer compound (0.57 g, polymer compound CP1). The polymer compound CP1 had a polystyrene-equivalent number average molecular weight (Mn) and a weight average molecular weight (Mw) of Mn=$3.0 \times 10^4$ and Mw=$7.0 \times 10^4$, respectively, had a glass transition temperature of 89° C., and showed a film fluorescence peak wavelength of 397 nm and 415 nm. The polymer compound CP1 is estimated to be an alternating copolymer having the following constitutional units and molar ratio based on the charging ratio of monomers.

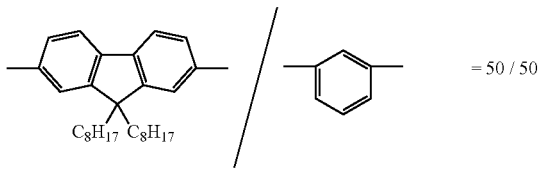

Synthesis Example 8

Synthesis of Polymer Compound CP2

Under a nitrogen atmosphere, a mixture of a compound CM2 (1.4731 g, 2.955 mmol), 2,7-dibromo-9,9-dioctylfluorene (1.6980 g, 3.000 mmol) and toluene (30 ml) was heated at 90° C. in a 100 ml flask, and palladium acetate (1.0 mg, 4.5 μmol), tris(2-methoxyphenyl)phosphine (6.3 mg, 18 μmol) and a 20 wt % tetraethylammonium hydroxide aqueous solution (10 ml, 14 mmol) were added, and further, the mixture was stirred for about 20 hours under reflux by heating.

Next, benzeneboronic acid (0.37 g, 3 mmol), palladium acetate (1.0 mg, 4.5 μmol) and tris(2-methoxyphenyl)phosphine (6.3 mg, 18 μmol) were added, and the mixture was stirred under reflux for about 8 hours while heating at 105° C.

Further, a solution prepared by dissolving sodium N,N-diethyldithiocarbamate trihydrate (1.83 g) in ion exchanged water (18 ml) was added, and the mixture was stirred for 2 hours while heating at 85° C.

The organic layer was separated from the aqueous layer, then, the organic layer was washed with ion exchanged water (about 40 ml) twice, a 3 wt % acetic acid aqueous solution (about 40 ml) twice, and ion exchanged water (about 40 ml) twice, sequentially. The organic layer was dropped into methanol to cause precipitation of a polymer compound, which was then filtrated and dried to obtain solid. This solid was dissolved in toluene (93 ml), and the solution was passed through a silica gel column and an alumina column through which toluene had been passed previously, the resultant solution was dropped into methanol (465 ml) to cause precipitation of a polymer compound, which was then filtrated and dried to obtain a polymer compound (1.50 g, polymer compound CP2). The polymer compound CP2 had a polystyrene-equivalent number average molecular weight (Mn) and a weight average molecular weight (Mw) of Mn=$5.1 \times 10^4$ and Mw=$1.1 \times 10^5$, and showed a film fluorescence peak wavelength of 395 nm. A clear glass transition temperature was not measured, and it is estimated to be a temperature lower than 30° C. in view of the measuring conditions. The polymer compound CP2 is estimated to be an alternating copolymer having the following constitutional units and molar ratio based on the charging ratio of monomers.

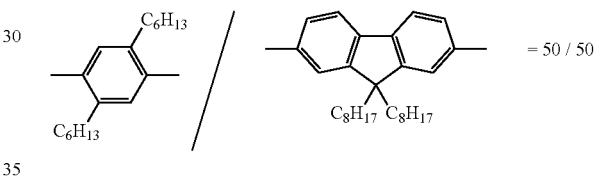

Synthesis Example 9

Synthesis of Polymer Compound CP3

Under an inert atmosphere, 2,7-bis(1,3,2-dioxaborolan-2-yl)-9,9-dioctylfluorene (5.20 g), 4,4'-dibromo-4"-sec-butyltriphenylamine (5.42 g), palladium acetate (2.2 mg), tris(2-methylphenyl)phosphine (15.1 mg), trioctylmethylammonium chloride (trade name: Aliquat336 (manufactured by Aldrich), 0.91 g) and toluene (70 ml) were mixed and the mixture was heated at 105° C. Into the reaction liquid, a sodium carbonate aqueous solution (2 mol/l, 19 ml) was dropped, and refluxed for 4 hours. After the reaction, benzeneboronic acid (121 mg) was added, and further refluxed for 3 hours. Then, an aqueous solution of sodium N,N-diethyldithiocarbamate trihydrate was added, and the mixture was stirred for 2 hours at 80° C. After cooling, the resultant reaction liquid was washed with water (60 ml) three times, a 3 wt % acetic acid aqueous solution (60 ml) four times, and water (60 ml) three times, and the resultant toluene solution was purified by passing through an alumina column and a silica gel column. The resultant toluene solution was dropped into methanol (about 3000 ml), stirred, then, the resultant precipitate was filtrated and dried, to obtain a polymer compound (5.25 g, polymer compound CP3). The polymer compound CP3 had a polystyrene-equivalent number average molecular weight (Mn) and a weight average molecular weight (Mw) of Mn=$1.2 \times 10^5$ and Mw=$2.6 \times 10^5$, respectively, and had a glass transition temperature of 89° C. The polymer compound CP3 is estimated to be an alternating copolymer having the following constitutional units and molar ratio based on the charging ratio of monomers.

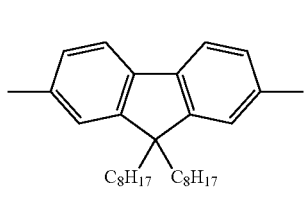
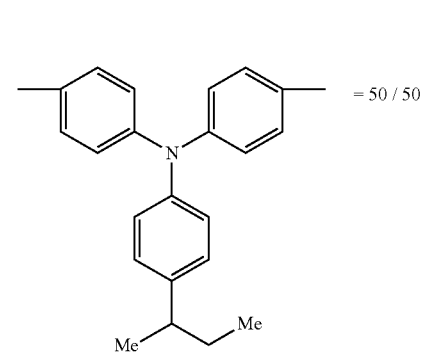

= 50 / 50

Synthesis Example 10

Synthesis of Electron Transporting Material ET-A

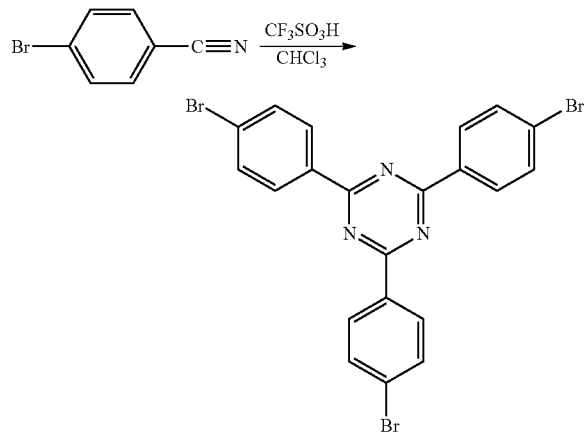

Under a nitrogen atmosphere, trifluoromethanesulfonic acid (100 g, 0.653 mmol) was charged, and the mixture was stirred at room temperature. Into the resultant reaction liquid, a solution prepared by dissolving 4-bromobenzonitrile (61.93 g, 0.327 mmol) in dehydrated chloroform (851 ml) was added dropwise. The resultant solution was heated up to 95° C., stirred while heating, then, cooled down to room temperature, and to this was added a dilute ammonia aqueous solution in an ice bath.

The resultant solid was filtrated, washed with water, then, washed with diethyl ether, and dried under reduced pressure, to obtain a white crystal (47.8 g).

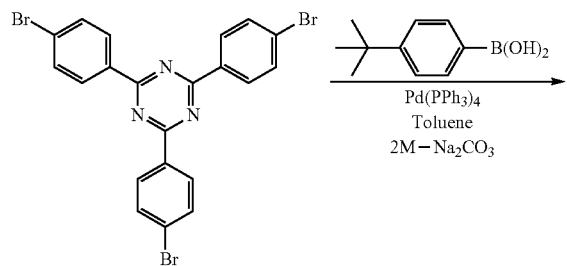

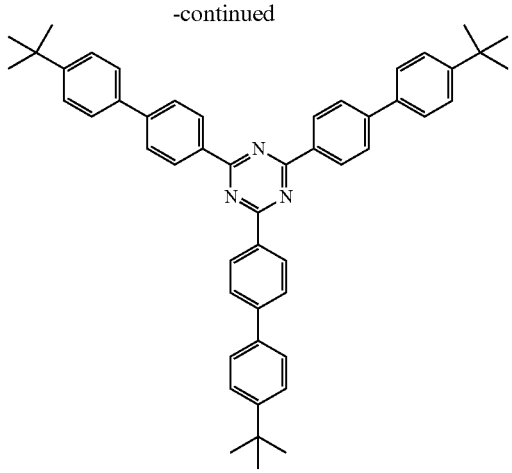

Electron Transporting Material ET-A

Under a nitrogen atmosphere, the resultant white crystal (8.06 g, 14.65 mmol), 4-t-butylphenylboronic acid (9.15 g, 49.84 mmol), Pd(PPh$_3$)$_4$ (1.54 g, 1.32 mmol), toluene (500 ml) which had been previously bubbled with nitrogen, and ethanol (47.3 ml) which had been previously bubbled with nitrogen were charged, stirred, heated and refluxed. Into the resultant reaction liquid, a 2M sodium carbonate aqueous solution (47.3 ml) which had been previously bubbled with nitrogen was dropped, and further, heated and refluxed. The resultant reaction liquid was allowed to cool, then, liquid-separated, the aqueous layer was removed, and the organic layer was washed with dilute hydrochloric acid and water in this order, and liquid-separated. The organic layer was dried over anhydrous magnesium sulfate, filtrated, and concentrated. The resultant coarse product was passed through a silica gel column, and to the resultant filtrate was added acetonitrile. The resultant crystal was dried under reduced pressure, to obtain 8.23 g of a white crystal (hereinafter, referred to as "electron transporting material ET-A").

$^1$H-NMR (270 MHz/CDCl$_3$):

δ 1.39 (s, 27H), 7.52 (d, 6H), 7.65 (d, 6H), 7.79 (d, 6H), 8.82 (d, 6H)

<Measurement of PLQY (Photoluminescence Quantum Yield)>

In Examples 14 to 28, Examples 39, 40 and Comparative Examples 1 to 5, PLQY was measured using Absolute PL Quantum Yield Measurement System (manufactured by Hamamatsu Photonics K.K., trade name: C9920-02) at an excitation center wavelength of 325 nm, an excitation wavelength range of 315 to 335 nm and a measurement wavelength range of 390 to 800 nm (condition A), and 460 to 800 nm (condition B). It is believed that under the condition A, PLQY of the whole composition is measured, and under the condition B, PLQY derived from a light emitting material showing green as the emission color contained in the composition is measured. Thus, the ratio of the PLQY value measured under the condition B to the PLQY value measured under the condition A is believed to be an index of the proportion of light emission by the light emitting material added.

Example 14

A 0.8 wt % xylene solution of a composition was prepared, the composition being obtained by adding a light emitting material EM-A ((Iridium (III) tris(2-(4-tolyl)pyridinato-N, C2), manufactured by American Dye Source, Inc., trade name: ADS066GE) represented by the following formulae:

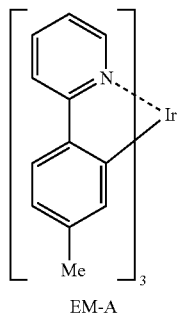

EM-A in a proportion of 5 wt % to the above-described polymer compound P1. This solution was applied on a quartz substrate by spin coat at a revolution of 1000 rpm to fabricate a film of the above-described composition, and PLQY of this film was measured. As a result, the film had a PLQY of 66% (condition A) and 55% (condition B), and the ratio as an index of the proportion of light emission derived from the light emitting material EM-A was 0.83. The chromaticity coordinate C.I.E.1931 judged from the light emission spectrum of the film was (x, y)=(0.25, 0.55), that is, the film showed excellent green emission. These results are shown in Table 4.

Example 15

A film of a composition was fabricated in the same manner as in Example 14 excepting that the polymer compound P1 was changed to the polymer compound P2 in Example 14, and PLQY of this film was measured. As a result, the film had a PLQY of 58% (condition A) and 56% (condition B), and the ratio as an index of the proportion of light emission derived from the light emitting material EM-A in light emission obtained from the film was 0.96. The chromaticity coordinate C.I.E.1931 judged from the light emission spectrum of the film was (x, y)=(0.27, 0.61), that is, the film showed excellent green emission. These results are shown in Table 4.

Example 16

A film of a composition was fabricated in the same manner as in Example 14 excepting that the polymer compound P1 was changed to the polymer compound P3 in Example 14, and PLQY of this film was measured. As a result, the film had a PLQY of 33% (condition A) and 31% (condition B), and the ratio as an index of the proportion of light emission derived from the light emitting material EM-A in light emission obtained from the film was 0.95. The chromaticity coordinate C.I.E.1931 judged from the light emission spectrum of the film was (x, y)=(0.26, 0.58), that is, the film showed excellent green emission. These results are shown in Table 4.

Example 17

A film of a composition was fabricated in the same manner as in Example 14 excepting that the polymer compound P1 was changed to the polymer compound P4 in Example 14, and PLQY of this film was measured. As a result, the film had a PLQY of 46% (condition A) and 39% (condition B), and the ratio as an index of the proportion of light emission derived from the light emitting material EM-A in light emission obtained from the film was 0.84. The chromaticity coordinate C.I.E.1931 judged from the light emission spectrum of the film was (x, y)=(0.25, 0.54), that is, the film showed excellent green emission. These results are shown in Table 4.

Example 18

A film of a composition was fabricated in the same manner as in Example 14 excepting that the polymer compound P1 was changed to the polymer compound P5 in Example 14, and PLQY of this film was measured. As a result, the film had a PLQY of 53% (condition A) and 46% (condition B), and the ratio as an index of the proportion of light emission derived from the light emitting material EM-A in light emission obtained from the film was 0.86. The chromaticity coordinate C.I.E.1931 judged from the light emission spectrum of the film was (x, y)=(0.25, 0.57), that is, the film showed excellent green emission. These results are shown in Table 4.

Example 19

A film of a composition was fabricated in the same manner as in Example 14 excepting that the polymer compound P1 was changed to the polymer compound P6 in Example 14, and PLQY of this film was measured. As a result, the film had a PLQY of 56% (condition A) and 52% (condition B), and the ratio as an index of the proportion of light emission derived from the light emitting material EM-A in light emission obtained from the film was 0.92. The chromaticity coordinate C.I.E.1931 judged from the light emission spectrum of the film was (x, y)=(0.29, 0.59), that is, the film showed excellent green emission. These results are shown in Table 4.

Example 20

A film of a composition was fabricated in the same manner as in Example 14 excepting that the polymer compound P1 was changed to the polymer compound P7 in Example 14, and PLQY of this film was measured. As a result, the film had a PLQY of 46% (condition A) and 43% (condition B), and the ratio as an index of the proportion of light emission derived from the light emitting material EM-A in light emission obtained from the film was 0.93. The chromaticity coordinate C.I.E.1931 judged from the light emission spectrum of the film was (x, y)=(0.26, 0.58), that is, the film showed excellent green emission. These results are shown in Table 4.

Comparative Example 1

A film of a composition was fabricated in the same manner as in Example 14 excepting that the polymer compound P1 was changed to the polymer compound CP1 in Example 14, and PLQY of this film was measured. As a result, the film had a PLQY of 2.9% (condition A) and 1.3% (condition B), and the ratio as an index of the proportion of light emission derived from the light emitting material EM-A in light emission obtained from the film was as low as 0.44. The chromaticity coordinate C.I.E.1931 judged from the light emission spectrum of the film was (x, y)=(0.24, 0.26), that is, the film showed blue green emission. As described above, the proportion of light emission derived from the light emitting material EM-A in light emission obtained from the film was confirmed to be low also from the chromaticity. These results are shown in Table 4.

Comparative Example 2

A film of a composition was fabricated in the same manner as in Example 14 excepting that the polymer compound P1 was changed to the polymer compound CP2 in Example 14, and PLQY of this film was measured. As a result, the film had a PLQY of 56% (condition A) and 22% (condition B), and the ratio as an index of the proportion of light emission derived from the light emitting material EM-A in light emission obtained from the film was as low as 0.40. The chromaticity coordinate C.I.E.1931 judged from the light emission spectrum of the film was (x, y)=(0.23, 0.42), that is, the film showed blue green emission. As described above, the proportion of light emission derived from the light emitting material EM-A in light emission obtained from the film was confirmed to be low also from the chromaticity. These results are shown in Table 4.

Comparative Example 3

A film of a composition was fabricated in the same manner as in Example 14 excepting that the polymer compound P1 was changed to PMMA (polymethyl methacrylate) in Example 14, and PLQY of this film was measured. As a result, the film had a PLQY of 15% (condition A) and 15% (condition B), and the ratio as an index of the proportion of light emission derived from the light emitting material EM-A was 1.00, that is, it was confirmed that light emission derived singly from the light emitting material EM-A was obtained as the light emission obtained from the film. The photoluminescence peak wavelength judged from the light emission spectrum of the film was 525 nm, and the chromaticity coordinate C.I.E.1931 was (x, y)=(0.35, 0.60), that is, the film showed green emission. These results are shown in Table 4.

Example 21

A 0.8 wt % xylene solution of a composition was prepared, the composition being obtained by adding the light emitting material EM-B in a proportion of 5 wt % to the polymer compound P1. This solution was applied on a quartz substrate by spin coat at a revolution of 1000 rpm to fabricate a film of the above-described composition, and PLQY of this film was measured. As a result, the film had a PLQY of 69% (condition A) and 65% (condition B), and the ratio as an index of the proportion of light emission derived from the light emitting material EM-B in light emission obtained from the film was 0.95. The chromaticity coordinate C.I.E.1931 judged from the light emission spectrum of the film was (x, y)=(0.29, 0.62), that is, the film showed excellent green emission. These results are shown in Table 5.

Example 22

A film of a composition was fabricated in the same manner as in Example 21 excepting that the polymer compound P1 was changed to the polymer compound P2 in Example 21, and PLQY of this film was measured. As a result, the film had a PLQY of 68% (condition A) and 66% (condition B), and the ratio as an index of the proportion of light emission derived from the light emitting material EM-B in light emission obtained from the film was 0.96. The chromaticity coordinate C.I.E.1931 judged from the light emission spectrum of the film was (x, y)=(0.29, 0.62), that is, the film showed excellent green emission. These results are shown in Table 5.

Example 23

A film of a composition was fabricated in the same manner as in Example 21 excepting that the polymer compound P1 was changed to the polymer compound P3 in Example 21, and PLQY of this film was measured. As a result, the film had a PLQY of 58% (condition A) and 56% (condition B), and the ratio as an index of the proportion of light emission derived from the light emitting material EM-B in light emission obtained from the film was 0.96. The chromaticity coordinate C.I.E.1931 judged from the light emission spectrum of the

TABLE 4

| | Polymer compound | Light emitting material | Composition ratio (ratio by weight) | PL quantum yield (PLQY) | | | Chromaticity (CIE) |
|---|---|---|---|---|---|---|---|
| | | | | Condition A | Condition B | ratio | (x, y) |
| Example 14 | P1 | EM-A | 95/5 | 66% | 55% | 0.83 | (0.25, 0.55) |
| Example 15 | P2 | EM-A | 95/5 | 58% | 56% | 0.96 | (0.27, 0.61) |
| Example 16 | P3 | EM-A | 95/5 | 33% | 31% | 0.95 | (0.26, 0.58) |
| Example 17 | P4 | EM-A | 95/5 | 46% | 39% | 0.84 | (0.25, 0.54) |
| Example 18 | P5 | EM-A | 95/5 | 53% | 46% | 0.86 | (0.25, 0.57) |
| Example 19 | P6 | EM-A | 95/5 | 56% | 52% | 0.92 | (0.29, 0.59) |
| Example 20 | P7 | EM-A | 95/5 | 46% | 43% | 0.93 | (0.26, 0.58) |
| Comparative Example 1 | CP1 | EM-A | 95/5 | 2.9% | 1.3% | 0.44 | (0.24, 0.26) |
| Comparative Example 2 | CP2 | EM-A | 95/5 | 56% | 22% | 0.40 | (0.23, 0.42) |
| Comparative Example 3 | PMMA | EM-A | 95/5 | 15% | 15% | 1.00 | (0.35, 0.60) | film was (x, y)=(0.28, 0.61), that is, the film showed excellent green emission. These results are shown in Table 5.

Example 24

A film of a composition was fabricated in the same manner as in Example 21 excepting that the polymer compound P1 was changed to the polymer compound P4 in Example 21, and PLQY of this film was measured. As a result, the film had a PLQY of 73% (condition A) and 70% (condition B), and the ratio as an index of the proportion of light emission derived from the light emitting material EM-B in light emission obtained from the film was 0.96. The chromaticity coordinate C.I.E.1931 judged from the light emission spectrum of the film was (x, y)=(0.28, 0.62), that is, the film showed excellent green emission. These results are shown in Table 5.

Example 25

A film of a composition was fabricated in the same manner as in Example 21 excepting that the polymer compound P1 was changed to the polymer compound P5 in Example 21, and PLQY of this film was measured. As a result, the film had a PLQY of 74% (condition A) and 71% (condition B), and the ratio as an index of the proportion of light emission derived from the light emitting material EM-B in light emission obtained from the film was 0.96. The chromaticity coordinate C.I.E.1931 judged from the light emission spectrum of the film was (x, y)=(0.28, 0.63), that is, the film showed excellent green emission. These results are shown in Table 5.

Example 26

A film of a composition was fabricated in the same manner as in Example 21 excepting that the polymer compound P1 was changed to the polymer compound P6 in Example 21, and PLQY of this film was measured. As a result, the film had a PLQY of 73% (condition A) and 70% (condition B), and the ratio as an index of the proportion of light emission derived from the light emitting material EM-B in light emission obtained from the film was 0.96. The chromaticity coordinate C.I.E.1931 judged from the light emission spectrum of the film was (x, y)=(0.28, 0.62), that is, the film showed excellent green emission. These results are shown in Table 5.

Example 27

A film of a composition was fabricated in the same manner as in Example 21 excepting that the polymer compound P1 was changed to the polymer compound P7 in Example 21, and PLQY of this film was measured. As a result, the film had a PLQY of 64% (condition A) and 62% (condition B), and the ratio as an index of the proportion of light emission derived from the light emitting material EM-B in light emission obtained from the film was 0.97. The chromaticity coordinate C.I.E.1931 judged from the light emission spectrum of the film was (x, y)=(0.28, 0.62), that is, the film showed excellent green emission. These results are shown in Table 5.

Example 28

A film of a composition was fabricated in the same manner as in Example 21 excepting that the polymer compound P1 was changed to the polymer compound P8 in Example 21, and PLQY of this film was measured. As a result, the film had a PLQY of 69% (condition A) and 66% (condition B), and the ratio as an index of the proportion of light emission derived from the light emitting material EM-B in light emission obtained from the film was 0.95. The chromaticity coordinate C.I.E.1931 judged from the light emission spectrum of the film was (x, y)=(0.28, 0.62), that is, the film showed excellent green emission. These results are shown in Table 5.

Comparative Example 4

A film of a composition was fabricated in the same manner as in Example 21 excepting that the polymer compound P1 was changed to the polymer compound CP1 in Example 21, and PLQY of this film was measured. As a result, the film had a PLQY of 5.4% (condition A) and 3.5% (condition B), and the ratio as an index of the proportion of light emission derived from the light emitting material EM-A in light emission obtained from the film was as low as 0.64. The chromaticity coordinate C.I.E.1931 judged from the light emission spectrum of the film was (x, y)=(0.26, 0.43), that is, the film showed blue green emission. As described above, the proportion of light emission derived from the light emitting material EM-B in light emission obtained from the film was confirmed to be low also from the chromaticity. These results are shown in Table 5.

Comparative Example 5

A film of a composition was fabricated in the same manner as in Example 21 excepting that the polymer compound P1 was changed to PMMA (polymethyl methacrylate) in Example 21, and PLQY of this film was measured. As a result, the film had a PLQY of 48% (condition A) and 48% (condition B), and the ratio as an index of the proportion of light emission derived from the light emitting material EM-B was 1.00, that is, it was confirmed that light emission derived singly from the light emitting material EM-B was obtained as the light emission obtained from the film. The photoluminescence peak wavelength judged from the light emission spectrum of the film was 525 nm, and the chromaticity coordinate C.I.E.1931 was (x, y)=(0.33, 0.62), that is, the film showed green emission. These results are shown in Table 5.

TABLE 5

|  | Polymer compound | Light emitting material | Composition ratio (ratio by weight) | PL quantum yield (PLQY) | | ratio | Chromaticity (CIE) (x, y) |
| --- | --- | --- | --- | --- | --- | --- | --- |
|  |  |  |  | Condition A | Condition B |  |  |
| Example 21 | P1 | EM-B | 95/5 | 69% | 65% | 0.95 | (0.29, 0.62) |
| Example 22 | P2 | EM-B | 95/5 | 68% | 66% | 0.96 | (0.29, 0.62) |

TABLE 5-continued

| | Polymer compound | Light emitting material | Composition ratio (ratio by weight) | PL quantum yield (PLQY) Condition A | PL quantum yield (PLQY) Condition B | ratio | Chromaticity (CIE) (x, y) |
|---|---|---|---|---|---|---|---|
| Example 23 | P3 | EM-B | 95/5 | 58% | 56% | 0.96 | (0.28, 0.61) |
| Example 24 | P4 | EM-B | 95/5 | 73% | 70% | 0.96 | (0.28, 0.62) |
| Example 25 | P5 | EM-B | 95/5 | 74% | 71% | 0.96 | (0.28, 0.63) |
| Example 26 | P6 | EM-B | 95/5 | 73% | 70% | 0.96 | (0.28, 0.62) |
| Example 27 | P7 | EM-B | 95/5 | 64% | 62% | 0.97 | (0.28, 0.62) |
| Example 28 | P8 | EM-B | 95/5 | 69% | 66% | 0.95 | (0.28, 0.62) |
| Comparative Example 4 | CP1 | EM-B | 95/5 | 5.4% | 3.5% | 0.64 | (0.26, 0.43) |
| Comparative Example 5 | PMMA | EM-B | 95/5 | 48% | 48% | 1.00 | (0.33, 0.62) |

Example 29

Preparation of Composition MP1 and Solution Thereof

A composition MP1 obtained by mixing the polymer compound P1 and the light emitting material EM-B at a weight ratio of 70:30 was dissolved in xylene (manufactured by Kanto Chemical Co., Inc., grade for electronic industry) so that the total solid component concentration was 2.6 wt %. The solution thus obtained is hereinafter referred to as "a 2.6 wt % xylene solution of the composition MP1".
(Fabrication of Light Emitting Device DP1)

A solution of poly(3,4-ethylenedioxythiophene)/polystyrenesulfonic acid (manufactured by Bayer, trade name: BaytronP AI4083) was spin-coated to form a film with a thickness of 65 nm on a glass substrate carrying an ITO film having a thickness of 150 nm formed thereon by a sputtering method, and the film was dried on a hot plate at 200° C. for 10 minutes. Next, a 0.7 wt % xylene solution of the polymer compound CP3 was spin-coated at a revolution of 3000 rpm to form a film, and the film was dried at 180° C. for 60 minutes on a hot plate under a nitrogen atmosphere. The film thickness was about 20 nm. Next, a 2.6 wt % xylene solution of the composition MP1 was spin-coated at a revolution of 1600 rpm to form a film. The film thickness was about 100 nm. This was dried at 130° C. for 10 minutes on a hot plate under a nitrogen gas atmosphere, then, as a cathode, barium was vapor-deposited with a thickness of about 4 nm, then, aluminum was vapor-deposited with a thickness of about 80 nm, fabricating a light emitting device DP1. The device constitution was ITO/BaytronP (65 nm)/composition MP1/Ba (4 nm)/Al (80 nm). After the degree of vacuum reached $1\times10^{-4}$ Pa or less, vapor-deposition of a metal was initiated.

When voltage was applied on the light emitting device DP1, green light emission with a peak wavelength (EL) of 520 nm was shown. The maximum light emission efficiency was 33.4 cd/A, and under this condition, the voltage was 10.0 V. At a luminance of 1000 cd/m², the driving voltage was 8.6 V, the chromaticity coordinate C.I.E.1931 was (x, y)=(0.32, 0.62), and the light emission efficiency was 29.5 cd/A. When the initial luminance was set to 4000 cd/m² and driving at constant current was performed, the luminance half life was 18 hours. These results are shown in Table 6.

Example 30

Preparation of Composition MP4 and Solution Thereof

A composition MP4 obtained by mixing the polymer compound P4 and the light emitting material EM-B at a weight ratio of 70:30 was dissolved in xylene (manufactured by Kanto Chemical Co., Inc., grade for electronic industry) so that the total solid component concentration was 2.3 wt %. The solution thus obtained is hereinafter referred to as "a 2.3 wt % xylene solution of the composition MP4".
(Fabrication of Light Emitting Device DP4)

A light emitting device DP4 was fabricated in the same manner as in Example 29 excepting that a 2.3 wt % xylene solution of the composition MP4 was used instead of the 2.6 wt % xylene solution of the composition MP1, and the revolution of spin coat was changed from 1600 rpm to 2000 rpm in Example 29. When voltage was applied on the light emitting device DP4, green light emission with a peak wavelength (EL) of 520 nm was shown. The maximum light emission efficiency was 27.1 cd/A, and under this condition, the voltage was 10.8 V. At a luminance of 1000 cd/m², the driving voltage was 9.4 V, the chromaticity coordinate C.I.E.1931 was (x, y)=(0.33, 0.62), and the light emission efficiency was 25.4 cd/A. When the initial luminance was set to 4000 cd/m² and driving at constant current was performed, the luminance half life was 8.4 hours. These results are shown in Table 6.

Example 31

Preparation of Composition MP5 and Solution Thereof

A composition MP4 obtained by mixing the polymer compound P5 and the light emitting material EM-B at a weight ratio of 70:30 was dissolved in xylene (manufactured by Kanto Chemical Co., Inc., grade for electronic industry) so that the total solid component concentration was 2.2 wt %. The solution thus obtained is hereinafter referred to as "a 2.2 wt % xylene solution of the composition MP5".
(Fabrication of Light Emitting Device DP5)

A light emitting device DP5 was fabricated in the same manner as in Example 29 excepting that a 2.2 wt % xylene solution of the composition MP5 was used instead of the 2.6 wt % xylene solution of the composition MP1, and the revolution of spin coat was changed from 1600 rpm to 1800 rpm in Example 29. When voltage was applied on the light emitting device DP5, green light emission with a peak wavelength (EL) of 520 nm was shown. The maximum light emission efficiency was 28.2 cd/A, and under this condition, the voltage was 5.4 V. At a luminance of 1000 cd/m², the driving voltage was 7.3 V, the chromaticity coordinate C.I.E.1931 was (x, y)=(0.32, 0.62), and the light emission efficiency was 27.2 cd/A. When the initial luminance was set to 4000 cd/m² and driving at constant current was performed, the luminance half life was 15 hours. These results are shown in Table 6.

Example 32

Preparation of Composition MP7 and Solution Thereof

A composition MP7 obtained by mixing the polymer compound P7 and the light emitting material EM-B at a weight ratio of 70:30 was dissolved in xylene (manufactured by Kanto Chemical Co., Inc., grade for electronic industry) so that the total solid component concentration was 2.6 wt %. The solution thus obtained is hereinafter referred to as "a 2.6 wt % xylene solution of the composition MP7".
(Fabrication of Light Emitting Device DP7)

A light emitting device DP7 was fabricated in the same manner as in Example 29 excepting that a 2.6 wt % xylene solution of the composition MP7 was used instead of the 2.6 wt % xylene solution of the composition MP1, and the revolution of spin coat was changed from 1600 rpm to 1800 rpm in Example 29. When voltage was applied on the light emitting device DP7, green light emission with a peak wavelength (EL) of 520 nm was shown. The maximum light emission efficiency was 37.1 cd/A, and under this condition, the voltage was 7.4 V. At a luminance of 1000 cd/m², the driving voltage was 7.1 V, the chromaticity coordinate C.I.E.1931 was (x, y)=(0.32, 0.63), and the light emission efficiency was 36.9 cd/A. When the initial luminance was set to 4000 cd/m² and driving at constant current was performed, the luminance half life was 13 hours. These results are shown in Table 6.

Example 33

Preparation of Composition MP8 and Solution Thereof

A composition MP8 obtained by mixing the polymer compound P8 and the light emitting material EM-B at a weight ratio of 70:30 was dissolved in xylene (manufactured by Kanto Chemical Co., Inc., grade for electronic industry) so that the total solid component concentration was 2.2 wt %. The solution thus obtained is hereinafter referred to as "a 2.2 wt % xylene solution of the composition MP8".
(Fabrication of Light Emitting Device DP8)

A light emitting device DP8 was fabricated in the same manner as in Example 29 excepting that a 2.2 wt % xylene solution of the composition MP8 was used instead of the 2.6 wt % xylene solution of the composition MP1, and the revolution of spin coat was changed from 1600 rpm to 2000 rpm in Example 29. When voltage was applied on the light emitting device DP8, green light emission with a peak wavelength (EL) of 520 nm was shown. The maximum light emission efficiency was 34.6 cd/A, and under this condition, the voltage was 11.6 V. At a luminance of 1000 cd/m², the driving voltage was 10.8 V, the chromaticity coordinate C.I.E.1931 was (x, y)=(0.32, 0.63), and the light emission efficiency was 34.5 cd/A. When the initial luminance was set to 4000 cd/m² and driving at constant current was performed, the luminance half life was 19 hours. These results are shown in Table 6.

Comparative Example 6

Preparation of Composition MCP1 and Solution Thereof

A composition MCP1 obtained by mixing the polymer compound CP1 and the light emitting material EM-B at a weight ratio of 70:30 was dissolved in xylene (manufactured by Kanto Chemical Co., Inc., grade for electronic industry) so that the total solid component concentration was 1.3 wt %. The solution thus obtained is hereinafter referred to as "a 1.3 wt % xylene solution of the composition MCP1".
(Fabrication of Light Emitting Device DCP1)

A light emitting device DCP1 was fabricated in the same manner as in Example 29 excepting that a 1.3 wt % xylene solution of the composition MCP1 was used instead of the 2.6 wt % xylene solution of the composition MP1, and the revolution of spin coat was changed from 1600 rpm to 800 rpm in Example 29.

When voltage was applied on the light emitting device DCP1, green light emission with a peak wavelength (EL) of 520 nm was shown. The maximum light emission efficiency was 10.2 cd/A, and under this condition, the voltage was 7.6 V. At a luminance of 1000 cd/m², the driving voltage was 8.4 V, the chromaticity coordinate C.I.E.1931 was (x, y)=(0.33, 0.62), and the light emission efficiency was 9.7 cd/A. When the initial luminance was set to 4000 cd/m² and driving at constant current was performed, the luminance half life was 4.7 hours. These results are shown in Table 6.

TABLE 6

| | Light emitting device | Polymer compound | Light emitting material | Composition ratio (ratio by weight) | Maximum light emission efficiency (cd/A) | Driving voltage at a luminance of 1000 cd/m² (V) | Luminance half life (hr) |
|---|---|---|---|---|---|---|---|
| Example 29 | DP1 | P1 | EM-B | 70/30 | 33.4 | 8.6 | 18 |
| Example 30 | DP4 | P4 | EM-B | 70/30 | 27.1 | 9.4 | 8.4 |
| Example 31 | DP5 | P5 | EM-B | 70/30 | 28.2 | 7.3 | 15 |

TABLE 6-continued

| Light emitting device | Polymer compound | Light emitting material | Composition ratio (ratio by weight) | Maximum light emission efficiency (cd/A) | Driving voltage at a luminance of 1000 cd/m² (V) | Luminance half life (hr) |
|---|---|---|---|---|---|---|
| Example 32 | DP7 | P7 | EM-B | 70/30 | 37.1 | 7.1 | 13 |
| Example 33 | DP8 | P8 | EM-B | 70/30 | 34.6 | 10.8 | 19 |
| Comparative Example 6 | DCP1 | CP1 | EM-B | 70/30 | 10.2 | 8.4 | 4.7 |

Example 34

Preparation of Composition MP1B and Solution Thereof

A composition MP1B obtained by mixing the polymer compound P1, the light emitting material EM-B and the electron transporting material ET-A at a weight ratio of 44:30:26 was dissolved in xylene (manufactured by Kanto Chemical Co., Inc., grade for electronic industry) so that the total solid component concentration was 2.6 wt %. The solution thus obtained is hereinafter referred to as "a 2.6 wt % xylene solution of the composition MP1B".
(Fabrication of Light Emitting Device DP1B)

A light emitting device DP1B was fabricated in the same manner as in Example 29 excepting that a 2.6 wt % xylene solution of the composition MP1B was used instead of the 2.6 wt % xylene solution of the composition MP1, and the revolution of spin coat was changed from 1600 rpm to 1200 rpm in Example 29. When voltage was applied on the light emitting device DP1B, green light emission with a peak wavelength (EL) of 520 nm was shown. The maximum light emission efficiency was 39.9 cd/A, and under this condition, the voltage was 6.6 V. At a luminance of 1000 cd/m², the driving voltage was 5.3 V, the chromaticity coordinate C.I.E.1931 was (x, y)=(0.33, 0.62), and the light emission efficiency was 39.3 cd/A. When the initial luminance was set to 4000 cd/m² and driving at constant current was performed, the luminance half life was 215 hours. These results are shown in Table 7.

Example 35

Preparation of Composition MP4B and Solution Thereof

A composition MP4B obtained by mixing the polymer compound P4, the light emitting material EM-B and the electron transporting material ET-A at a weight ratio of 44:30:26 was dissolved in xylene (manufactured by Kanto Chemical Co., Inc., grade for electronic industry) so that the total solid component concentration was 2.3 wt %. The solution thus obtained is hereinafter referred to as "a 2.3 wt % xylene solution of the composition MP4B".
(Fabrication of Light Emitting Device DP4B)

A light emitting device DP4B was fabricated in the same manner as in Example 29 excepting that a 2.3 wt % xylene solution of the composition MP4B was used instead of the 2.6 wt % xylene solution of the composition MP1, and the revolution of spin coat was changed from 1600 rpm to 1450 rpm in Example 29. When voltage was applied on the light emitting device DP4B, green light emission with a peak wavelength (EL) of 520 nm was shown. The maximum light emission efficiency was 35.6 cd/A, and under this condition, the voltage was 6.2 V. At a luminance of 1000 cd/m², the driving voltage was 5.6 V, the chromaticity coordinate C.I.E.1931 was (x, y)=(0.33, 0.62), and the light emission efficiency was 35.2 cd/A. When the initial luminance was set to 4000 cd/m² and driving at constant current was performed, the luminance half life was 61 hours. These results are shown in Table 7.

Example 36

Preparation of Composition MP6B and Solution Thereof

A composition MP6B obtained by mixing the polymer compound P6, the light emitting material EM-B and the electron transporting material ET-A at a weight ratio of 44:30:26 was dissolved in xylene (manufactured by Kanto Chemical Co., Inc., grade for electronic industry) so that the total solid component concentration was 2.4 wt %. The solution thus obtained is hereinafter referred to as "a 2.4 wt % xylene solution of the composition MP6B".
(Fabrication of Light Emitting Device DP6B)

A light emitting device DP6B was fabricated in the same manner as in Example 29 excepting that a 2.4 wt % xylene solution of the composition MP6B was used instead of the 2.6 wt % xylene solution of the composition MP1, and the revolution of spin coat was changed from 1600 rpm to 1400 rpm in Example 29. When voltage was applied on the light emitting device DP6B, green light emission with a peak wavelength (EL) of 520 nm was shown. The maximum light emission efficiency was 39.2 cd/A, and under this condition, the voltage was 6.0 V. At a luminance of 1000 cd/m², the driving voltage was 5.4 V, the chromaticity coordinate C.I.E.1931 was (x, y)=(0.32, 0.62), and the light emission efficiency was 37.7 cd/A. When the initial luminance was set to 4000 cd/m² and driving at constant current was performed, the luminance half life was 62 hours. These results are shown in Table 7.

Example 37

Preparation of Composition MP8B and Solution Thereof

A composition MP8B obtained by mixing the polymer compound P8, the light emitting material EM-B and the electron transporting material ET-A at a weight ratio of 44:30:26 was dissolved in xylene (manufactured by Kanto Chemical Co., Inc., grade for electronic industry) so that the total solid component concentration was 2.1 wt %. The solution thus obtained is hereinafter referred to as "a 2.1 wt % xylene solution of the composition MP8B".

(Fabrication of Light Emitting Device DP8B)

A light emitting device DP8B was fabricated in the same manner as in Example 29 excepting that a 2.1 wt % xylene solution of the composition MP8B was used instead of the 2.6 wt % xylene solution of the composition MP1, and the revolution of spin coat was changed from 1600 rpm to 1300 rpm in Example 29. When voltage was applied on the light emitting device DP8B, green light emission with a peak wavelength (EL) of 520 nm was shown. The maximum light emission efficiency was 34.7 cd/A, and under this condition, the voltage was 6.2 V. At a luminance of 1000 cd/m$^2$, the driving voltage was 5.9 V, the chromaticity coordinate C.I.E.1931 was (x, y)=(0.33, 0.62), and the light emission efficiency was 34.5 cd/A. When the initial luminance was set to 4000 cd/m$^2$ and driving at constant current was performed, the luminance half life was 91 hours. These results are shown in Table 7.

Comparative Example 7

Preparation of Composition MCP1B and Solution Thereof

A composition MCP1B obtained by mixing the polymer compound CP1, the light emitting material EM-B and the electron transporting material ET-A at a weight ratio of 40:30:30 was dissolved in xylene (manufactured by Kanto Chemical Co., Inc., grade for electronic industry) so that the total solid component concentration was 2.4 wt %. The solution thus obtained is hereinafter referred to as "a 2.4 wt % xylene solution of the composition MCP1B".

(Fabrication of Light Emitting Device DCP1B)

A light emitting device DCP1B was fabricated in the same manner as in Example 29 excepting that a 2.4 wt % xylene solution of the composition MCP1B was used instead of the 2.6 wt % xylene solution of the composition MP1, and the revolution of spin coat was changed from 1600 rpm to 1400 rpm in Example 29. When voltage was applied on the light emitting device DCP1B, green light emission with a peak wavelength (EL) of 520 nm was shown. The maximum light emission efficiency was 18.6 cd/A, and under this condition, the voltage was 5.0 V. At a luminance of 1000 cd/m$^2$, the driving voltage was 5.4 V, the chromaticity coordinate C.I.E.1931 was (x, y)=(0.33, 0.62), and the light emission efficiency was 17.9 cd/A. When the initial luminance was set to 4000 cd/m$^2$ and driving at constant current was performed, the luminance half life was 14 hours. These results are shown in Table 7.

Synthesis Example 11

Synthesis of Compound CM4

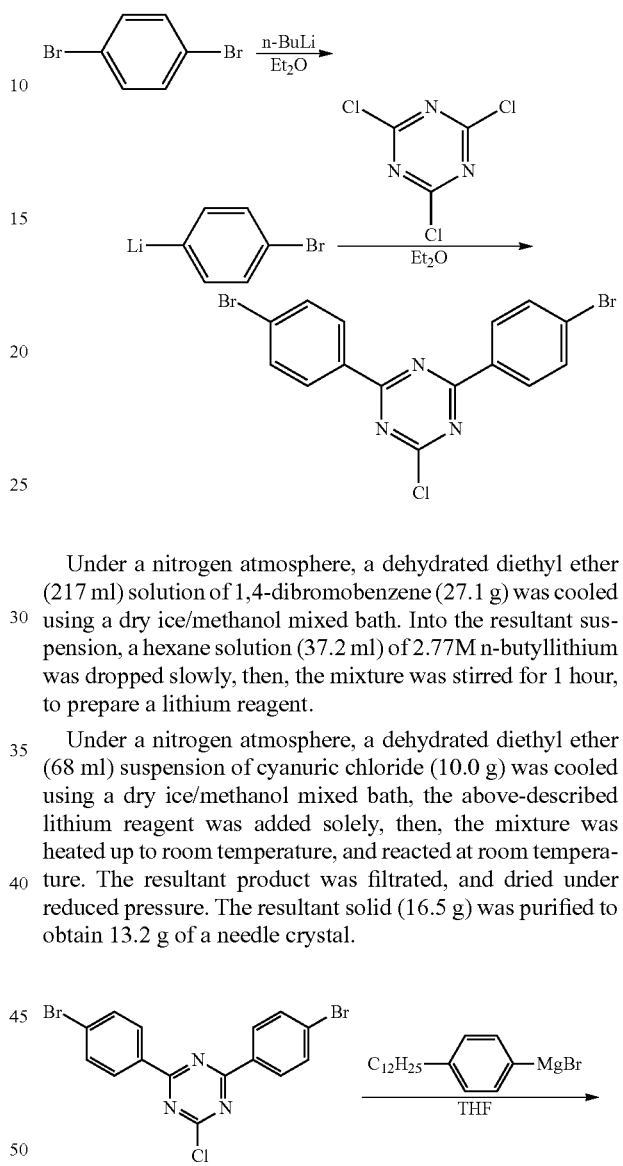

Under a nitrogen atmosphere, a dehydrated diethyl ether (217 ml) solution of 1,4-dibromobenzene (27.1 g) was cooled using a dry ice/methanol mixed bath. Into the resultant suspension, a hexane solution (37.2 ml) of 2.77M n-butyllithium was dropped slowly, then, the mixture was stirred for 1 hour, to prepare a lithium reagent.

Under a nitrogen atmosphere, a dehydrated diethyl ether (68 ml) suspension of cyanuric chloride (10.0 g) was cooled using a dry ice/methanol mixed bath, the above-described lithium reagent was added solely, then, the mixture was heated up to room temperature, and reacted at room temperature. The resultant product was filtrated, and dried under reduced pressure. The resultant solid (16.5 g) was purified to obtain 13.2 g of a needle crystal.

TABLE 7

| | Light emitting device | Polymer compound | Light emitting material | Electron transporting material | Composition ratio (ratio by weight) | Maximum light emission efficiency (cd/A) | Driving voltage at a luminance of 1000 cd/m$^2$ (V) | Luminance half life (hr) |
|---|---|---|---|---|---|---|---|---|
| Example 34 | DP1B | P1 | EM-B | ET-A | 44/30/26 | 39.9 | 5.3 | 215 |
| Example 35 | DP4B | P4 | EM-B | ET-A | 46/30/24 | 35.6 | 5.6 | 61 |
| Example 36 | DP6B | P6 | EM-B | ET-A | 44/30/26 | 39.2 | 5.4 | 62 |
| Example 37 | DP8B | P8 | EM-B | ET-A | 42/30/28 | 34.7 | 5.9 | 91 |
| Comparative Example 7 | DCP1B | CP1 | EM-B | ET-A | 40/30/30 | 18.6 | 5.4 | 14 |

-continued

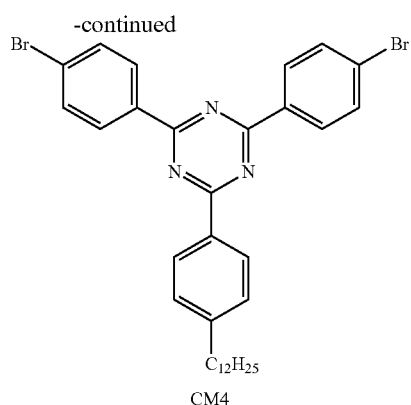
CM4

Under a nitrogen atmosphere, to a suspension prepared by adding dehydrated tetrahydrofuran (65 ml) to magnesium (1.37 g), a dehydrated tetrahydrofuran (15 ml) solution of 4-dodecylbromobenzene (14.2 g) was added portion-wise, and the mixture was heated and stirred under reflux. After allowing to cool, to the reaction liquid was additionally added magnesium (0.39 g), and the mixture was heated again, and reacted under reflux, to prepare a Grignard reagent.

Under a nitrogen atmosphere, to a dehydrated tetrahydrofuran (100 ml) suspension of the above-described needle crystal (12.0 g) was added the above-described Grignard reagent while stirring, and the mixture was heated under reflux. After allowing to cool, the reaction liquid was washed with a dilute hydrochloric acid aqueous solution. The mixture was separated into an organic layer and an aqueous layer, and the aqueous layer was extracted with diethyl ether. The resultant organic layers were combined, washed with water again, and the organic layer was dehydrated over anhydrous magnesium sulfate, then, filtrated and concentrated. The resultant white solid was purified by a silica gel column, and further recrystallized to obtain 6.5 g of a compound CM4 as white solid.

Example 38

Synthesis of Polymer Compound P9

Under a nitrogen atmosphere, a mixture of a compound CM3 (1.560 g), a compound M7 (0.324 g), 2,7-dibromo-9,9-dioctylfluorene (2.066 g), a compound CM4 (0.598 g) and toluene (50 ml) was charged at 90° C. in a 200 ml separable flask, then, heated, and palladium acetate (1.7 mg), tris(2-methoxyphenyl)phosphine (10.0 mg) and a 20 wt % tetraethylammonium hydroxide aqueous solution (16 ml) were added, and further, heated and stirred for about 21 hours under reflux.

Next, benzeneboronic acid (58 mg), palladium acetate (1.6 mg), tris(2-methoxyphenyl)phosphine (10.1 mg) and a 20 wt % tetraethylammonium hydroxide aqueous solution (16 ml) were added, and the mixture was stirred under reflux for about 20 hours while heating at 105° C.

The aqueous layer was removed by liquid-separation, then, a solution prepared by dissolving sodium N,N-diethyldithiocarbamate trihydrate (2.62 g) in ion exchanged water (52 ml) was added, and the mixture was stirred for 2 hours while heating at 85° C.

The organic layer was separated from the aqueous layer, then, the organic layer was washed with ion exchanged water (about 50 ml) twice, a 3 wt % acetic acid aqueous solution (about 50 ml) twice, and ion exchanged water (about 50 ml) twice, sequentially. The organic layer was dropped into methanol to cause precipitation of a polymer compound, which was then filtrated and dried to obtain solid. This solid was dissolved in toluene (about 100 ml), and the solution was passed through a silica gel column and an alumina column through which toluene had been passed previously, the resultant solution was dropped into methanol (about 300 ml) to cause precipitation of a polymer compound, which was then filtrated and dried to obtain a polymer compound (1.98 g, polymer compound P9). The polymer compound P9 had a polystyrene-equivalent number average molecular weight (Mn) and a weight average molecular weight (Mw) of $Mn=9.2\times10^4$ and $Mw=2.8\times10^5$, respectively, had a glass transition temperature of 123° C., and showed a film fluorescence peak wavelength of 396 nm. The polymer compound P9 is estimated to be a polymer having the following constitutional units and molar ratio in which the constitutional unit selected from (PA) and the constitutional unit selected from (PB) are polymerized alternately, based on the charging ratio of monomers.

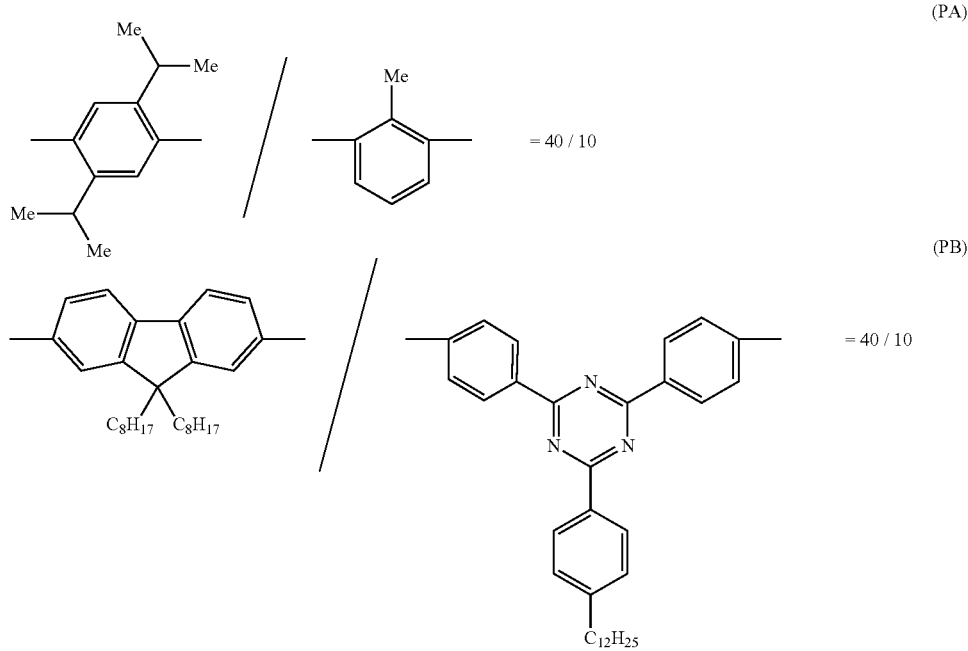

Example 39

A film of a composition was fabricated in the same manner as in Example 14 excepting that the polymer compound P1 was changed to the polymer compound P9 in Example 14, and PLQY of this film was measured. As a result, the film had a PLQY of 48% (condition A) and 46% (condition B), and the ratio as an index of the proportion of light emission derived from the light emitting material EM-A in light emission obtained from the film was 0.96. The chromaticity coordinate C.I.E.1931 judged from the light emission spectrum of the film was (x, y)=(0.29, 0.59), that is, the film showed excellent green emission.

Example 40

A film of a composition was fabricated in the same manner as in Example 21 excepting that the polymer compound P1 was changed to the polymer compound P9 in Example 21, and PLQY of this film was measured. As a result, the film had a PLQY of 61% (condition A) and 59% (condition B), and the ratio as an index of the proportion of light emission derived from the light emitting material EM-B in light emission obtained from the film was 0.97. The chromaticity coordinate C.I.E.1931 judged from the light emission spectrum of the film was (x, y)=(0.28, 0.62), that is, the film showed excellent green emission.

Example 41

Preparation of Composition MP9A and Solution Thereof

A composition MP9A obtained by mixing the polymer compound P8 and the light emitting material EM-B at a weight ratio of 70:30 was dissolved in xylene (manufactured by Kanto Chemical Co., Inc., grade for electronic industry) so that the total solid component concentration was 1.8 wt %. The solution thus obtained is hereinafter referred to as "a 1.8 wt % xylene solution of the composition MP9A".

(Fabrication of Light Emitting Device DP9A)

A light emitting device DP9A was fabricated in the same manner as in Example 29 excepting that a 1.8 wt % xylene solution of the composition MP9A was used instead of the 2.6 wt % xylene solution of the composition MP1, and the revolution of spin coat was changed from 1600 rpm to 2000 rpm in Example 29. When voltage was applied on the light emitting device DP9A, green light emission with a peak wavelength (EL) of 520 nm was shown. The maximum light emission efficiency was 34.0 cd/A, and under this condition, the voltage was 5.8 V. At a luminance of 1000 cd/m$^2$, the driving voltage was 6.2 V, the chromaticity coordinate C.I.E.1931 was (x, y)=(0.32, 0.62), and the light emission efficiency was 33.7 cd/A. When the initial luminance was set to 4000 cd/m$^2$ and driving at constant current was performed, the luminance half life was 64 hours. These results are shown in Table 8.

Example 42

Preparation of Composition MP9B and Solution Thereof

A composition MP9B obtained by mixing the polymer compound P8 and the light emitting material EM-B at a weight ratio of 60:40 was dissolved in xylene (manufactured by Kanto Chemical Co., Inc., grade for electronic industry) so that the total solid component concentration was 2.0 wt %. The solution thus obtained is hereinafter referred to as "a 2.0 wt % xylene solution of the composition MP9B".

(Fabrication of Light Emitting Device DP9B)

A light emitting device DP9B was fabricated in the same manner as in Example 29 excepting that a 2.0 wt % xylene solution of the composition MP9B was used instead of the 2.6 wt % xylene solution of the composition MP1, and the revolution of spin coat was changed from 1600 rpm to 2000 rpm in Example 29. When voltage was applied on the light emitting device DP9B, green light emission with a peak wavelength (EL) of 520 nm was shown. The maximum light emission efficiency was 38.2 cd/A, and under this condition, the voltage was 5.2 V. At a luminance of 1000 cd/m$^2$, the driving voltage was 5.9 V, the chromaticity coordinate C.I.E.1931 was (x, y)=(0.32, 0.62), and the light emission efficiency was 38.9 cd/A. When the initial luminance was set to 4000 cd/m$^2$ and driving at constant current was performed, the luminance half life was 168 hours. These results are shown in Table 8.

TABLE 8

| Light emitting device | Polymer compound | Light emitting material | Composition ratio (ratio by weight) | Maximum light emission efficiency (cd/A) | Driving voltage at a luminance of 1000 cd/m$^2$ (V) | Luminance half life (hr) |
|---|---|---|---|---|---|---|
| Example 41 | DP9A | P9 | EM-B | 70/30 | 34.0 | 6.2 | 64 |
| Example 42 | DP9B | P9 | EM-B | 60/40 | 38.2 | 5.9 | 168 |

<Evaluation>

According to Tables 4 and 5, the composition containing the polymer compound of the present invention is recognized to be excellent in PLQY, thus, it is believed that high maximum light emission efficiency is obtained also when it is used in a light emitting device. When the polymer compound of the present invention is used as a composition with a phosphorescence emitting compound, this is believed to be useful as a host material inducing the chromaticity property of the phosphorescence emitting compound.

According to Tables 6 to 8, the light emitting device using the composition containing the polymer compound of the present invention shows excellent maximum light emission efficiency, and further, an excellent luminance half life is recognized.

INDUSTRIAL APPLICABILITY

The polymer compound of the present invention is a polymer compound useful for fabrication of a light emitting device such as an organic EL device and the like excellent in maximum light emission efficiency (particularly, a polymer compound useful as a host material for a phosphorescence emitting compound showing an emission color of shorter wavelength than red). Therefore, also the composition of the present invention is useful for fabrication of a light emitting device excellent in maximum light emission efficiency. Further, the light emitting device using the composition of the present invention usually has an excellent luminance half life. The polymer compound of the present invention is usually excellent in heat resistance and shows excellent blue light emission.

The invention claimed is:

1. A polymer compound comprising a constitutional unit represented by the following formula (6) and a constitutional unit represented by the following formula (1):

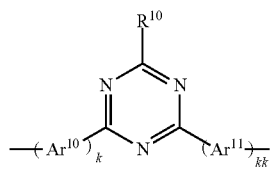

wherein $R^{10}$ represents a hydrogen atom, an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; $Ar^{10}$ and $Ar^{11}$ each independently represent an arylene group or an aromatic heterocyclic group; k and kk each independently represent an integer of 0 to 2, provided that $Ar^{10}$ and $Ar^{11}$ are not the group represented by the formula (1); a hydrogen atom in the group represented by each of $Ar^{10}$ and $Ar^{11}$ may be substituted by an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; when there are a plurality of $Ar^{10}$s and $Ar^{11}$s, these may be the same or different, respectively and

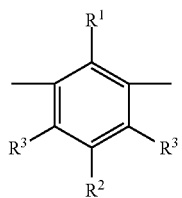

wherein $R^1$ represents an alkyl group, $R^2$ represents an aryl group, an aromatic heterocyclic group or a substituted amino group, $R^3$ represents a hydrogen atom, an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group, and two $R^3$s may be the same or different, wherein the polymer compound further contains a constitutional unit derived from a phosphorescence emitting compound having an optionally substituted aryl group or an optionally substituted heteroaryl group as a substituent of a ligand thereof in which the total number of atoms other than a hydrogen atom of the substituent is 10 or more, and wherein the proportion of the number of adjacent bonds between the constitutional units represented by the formula (1) is less than 0.05 relative to the number of bonds between all constitutional units.

2. A solution comprising the polymer compound according to claim 1, and a solvent.

3. A film comprising the polymer compound according to claim 1.

4. A light emitting device having electrodes consisting of an anode and a cathode, and an organic layer containing the polymer compound according to claim 1 disposed between the electrodes.

5. A planar light source comprising the light emitting device according to claim 4.

6. A display comprising the light emitting device according to claim 4.

7. A composition comprising:

a polymer compound comprising a constitutional unit represented by the following formula (6) and a constitutional unit represented by the following formula (1) in which the proportion of the number of adjacent bonds between the constitutional units represented by the formula (1) is less than 0.05 relative to the number of bonds between all constitutional units, and a phosphorescence emitting compound having optionally substituted aryl group or an optionally substituted heteroaryl group as a substituent of a ligand thereof in which the total number of atoms other than a hydrogen atom of the substituent is 10 or more:

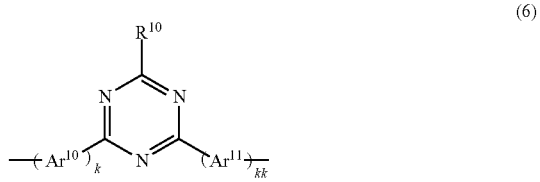

wherein $R^{10}$ represents a hydrogen atom, an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; $Ar^{10}$ and $Ar^{11}$ each independently represent an arylene group or an aromatic heterocyclic group; k and kk each independently represent an integer of 0 to 2, provided that $Ar^{10}$ and $Ar^{11}$ are not the group represented by the formula (1); a hydrogen atom in the group represented by each of $Ar^{10}$ and $Ar^{11}$ may be substituted by an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; when there are a plurality of $Ar^{10}$s and $Ar^{11}$s, these may be the same or different, respectively

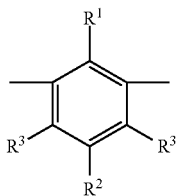
(1)

wherein $R^1$ represents an alkyl group $R^2$ represents an aryl group, an aromatic heterocyclic group or a substituted amino group, $R^3$ represents a hydrogen atom, an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group, and two $R^3$s may be the same or different.

8. The composition according to claim 7 further comprising at least one constitutional unit selected from the group consisting of a constitutional unit represented by the following formula (2) and a constitutional unit represented by the following formula (3):

(2)

wherein $Ar^1$ represents an arylene group, an aromatic heterocyclic group, or a divalent group formed by direct bonding of the same or different two or more groups selected from the group consisting of arylene groups and aromatic heterocyclic groups, provided that $Ar^1$ is not a group represented by the formula (1); any hydrogen atom in the group represented by $Ar^1$ may be substituted by an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group,

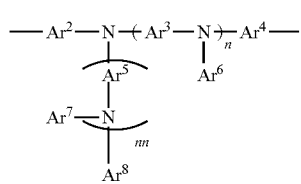
(3)

wherein $Ar^2$, $Ar^3$, $Ar^4$ and $Ar^5$ each independently represent an arylene group, an aromatic heterocyclic group, or a divalent group formed by direct bonding of the same or different two or more groups selected from the group consisting of arylene groups and divalent aromatic heterocyclic groups; $Ar^6$, $Ar^7$ and $Ar^8$ each independently represent an aryl group or an aromatic heterocyclic group; any hydrogen atom in each of the groups represented by $Ar^2$, $Ar^3$, $Ar^4$, $Ar^5$, $Ar^6$, $Ar^7$ and $Ar^8$ may be substituted by an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; the groups represented by $Ar^5$, $Ar^6$, $Ar^7$ and $Ar^8$ may be bonded directly or bonded via —O—, —S—, —C(=O)—, —C(=O)—O—, —N($R^4$)—, —C(=O)—N($R^4$)— or —C($R^4$)$_2$— to the groups represented by $Ar^2$, $Ar^3$, $Ar^4$, $Ar^5$, $Ar^7$ and $Ar^8$ linked to nitrogen atoms to which $Ar^5$, $Ar^6$, $Ar^7$ and $Ar^8$ are linked, respectively, to form 5- to 7-membered rings; n and nn are each independently 0 or 1; $R^4$ represents an alkyl group, an aryl group, an aromatic heterocyclic group or an aralkyl group.

9. The composition according to claim 8, wherein a constitutional unit represented by the following formula (4) is contained as the constitutional unit represented by the formula (2):

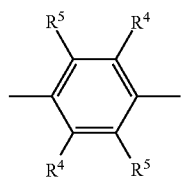
(4)

wherein $R^4$ represents an alkyl group, an aryl group, an aromatic heterocyclic group, an alkoxy group, an aryloxy group, an aralkyl group, an arylalkoxy group, a substituted amino group, a substituted carbonyl group, a substituted carboxyl group or a cyano group; $R^5$ represents a hydrogen atom, an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; two $R^4$s may be the same or different; two $R^5$s may be the same or different.

10. The composition according to claim 9, wherein a constitutional unit represented by the formula (4) and a constitutional unit other than the constitutional unit represented by the formula (4) are contained as the constitutional unit represented by the formula (2).

11. The composition according to claim 8, wherein a constitutional unit represented by the following formula (5) is contained as the constitutional unit represented by the formula (2):

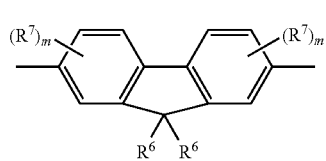
(5)

wherein $R^6$ represents an alkyl group, an aryl group, an aromatic heterocyclic group or an aralkyl group, and two $R^6$s may combine together; two $R^6$s may be the same or different; $R^7$ represents an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; m represents an integer of 0 to 3; two ms may be the same or different; when there are a plurality of $R^7$s, these may be the same or different.

12. The composition according to claim 7, wherein a constitutional unit represented by the following formula 2-104, 2-218 or 2-219 is contained as the constitutional unit represented by the formula (6):

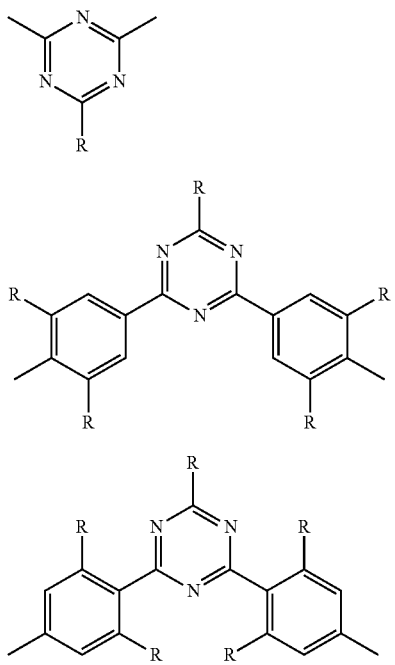

2-104

2-218

2-219 wherein R represents a hydrogen atom, an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; a plurality of Rs may be the same or different.

13. The composition according to claim 8, wherein the polymer compound contains a constitutional unit represented by the formula (3).

14. The composition according to claim 7, wherein the proportion of the total molar amount of other constitutional units relative to the total molar amount of constitutional units represented by formula (1) is 0.1 to 999.

15. The composition according to claim 9, wherein the proportion of the total molar amount of other constitutional units relative to the molar amount of constitutional units represented by formula (1) and constitutional units represented by formula (4) is 0.95 to 1.05.

16. The composition according to claim 9, wherein two or more constitutional units represented by the formula (1) and two or more constitutional units represented by the formula (4) are present in one molecule and the proportion of the sum of the number of adjacent bonds between the constitutional units represented by the formula (1), the number of adjacent bonds between the constitutional units represented by the formula (4) and the number of adjacent bonds between the constitutional unit represented by the formula (1) and the constitutional unit represented by the formula (4) is less than 0.05 relative to the number of bonds between all constitutional units.

17. The composition according to claim 7 further comprising at least one material selected from the group consisting of a hole transporting material and an electron transporting material.

18. A solution comprising the composition according to claim 7, and a solvent.

19. A film comprising the composition according to claim 7.

20. A light emitting device having electrodes consisting of an anode and a cathode, and an organic layer containing the composition according to claim 7 disposed between the electrodes.

21. A planar light source comprising the light emitting device according to claim 20.

22. A display comprising the light emitting device according to claim 20.

23. The composition according to claim 8, wherein a constitutional unit represented by the following formula (4):

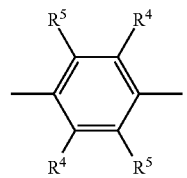

(4)

wherein $R^4$ represents an alkyl group, an aryl group, an aromatic heterocyclic group, an alkoxy group, an aryloxy group, an aralkyl group, an arylalkoxy group, a substituted amino group, a substituted carbonyl group, a substituted carboxyl group or a cyano group; $R^5$ represents a hydrogen atom, an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; two $R^4$s may be the same or different; two $R^5$s may be the same or different; and a constitutional unit represented by the following formula (5):

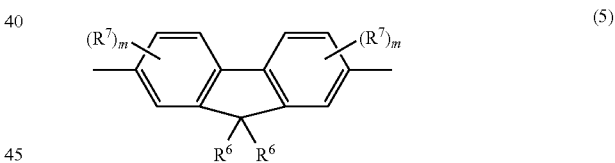

(5)

wherein $R^6$ represents an alkyl group, an aryl group, an aromatic heterocyclic group or an aralkyl group, and two $R^6$s may combine together; two $R^6$s may be the same or different; $R^7$ represents an alkyl group, an aryl group, an aromatic heterocyclic group, an alkoxy group, an aryloxy group, an aralkyl group, an arylalkoxy group, a substituted amino group, a substituted carbonyl group, a substituted carboxyl group, a fluorine atom or a cyano group; m represents an integer of 0 to 3; two ms may be the same or different; when there are a plurality of $R^7$s, these may be the same or different, are contained as the constitutional unit represented by the formula (2).

24. The composition according to claim 7, wherein the phosphorescent emitting compound is a triplet light emitting complex having an iridium atom as a center metal atom and a 2-phenyl pyridine or derivatives thereof as a ligand.

\* \* \* \* \*